(12) United States Patent
Karhade et al.

(10) Patent No.: US 12,119,326 B2
(45) Date of Patent: Oct. 15, 2024

(54) MICROELECTRONIC STRUCTURES INCLUDING BRIDGES

(71) Applicant: Intel Corporation, Santa Clara, CA (US)

(72) Inventors: Omkar G. Karhade, Chandler, AZ (US); Bohan Shan, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 774 days.

(21) Appl. No.: 17/126,505

(22) Filed: Dec. 18, 2020

(65) Prior Publication Data

US 2022/0199575 A1 Jun. 23, 2022

(51) Int. Cl.
*H01L 23/538* (2006.01)
*H01L 23/00* (2006.01)
*H01L 25/065* (2023.01)

(52) U.S. Cl.
CPC ...... *H01L 25/0655* (2013.01); *H01L 23/5381* (2013.01); *H01L 23/5383* (2013.01); *H01L 24/16* (2013.01); *H01L 2224/16227* (2013.01)

(58) Field of Classification Search
CPC ............. H01L 23/5383; H01L 25/0655; H01L 23/49822
See application file for complete search history.

(56) References Cited

U.S. PATENT DOCUMENTS

| | | | |
|---|---|---|---|
| 7,407,833 B2 | 8/2008 | Wu | |
| 2013/0334697 A1 | 12/2013 | Shin et al. | |
| 2014/0035131 A1 | 2/2014 | Noh et al. | |
| 2015/0364423 A1* | 12/2015 | Liu | H01L 23/5383 |
| | | | 257/751 |
| 2019/0035669 A1 | 1/2019 | Talledo | |
| 2020/0091128 A1 | 3/2020 | Elsherbini et al. | |
| 2020/0365489 A1 | 11/2020 | Su et al. | |
| 2020/0381361 A1 | 12/2020 | Zhao et al. | |

FOREIGN PATENT DOCUMENTS

JP 2013110264 A 6/2013

\* cited by examiner

*Primary Examiner* — Dale E Page
*Assistant Examiner* — Wilner Jean Baptiste
(74) *Attorney, Agent, or Firm* — Akona IP PC

(57) ABSTRACT

Disclosed herein are microelectronic structures including bridges, as well as related assemblies and methods. In some embodiments, a microelectronic structure may include a substrate and a bridge.

20 Claims, 25 Drawing Sheets

MICROELECTRONIC STRUCTURES INCLUDING BRIDGES

BACKGROUND

In conventional microelectronic packages, a die may be attached to an organic package substrate by solder. Such a package may be limited in the achievable interconnect density between the package substrate and the die, the achievable speed of signal transfer, and the achievable miniaturization, for example.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
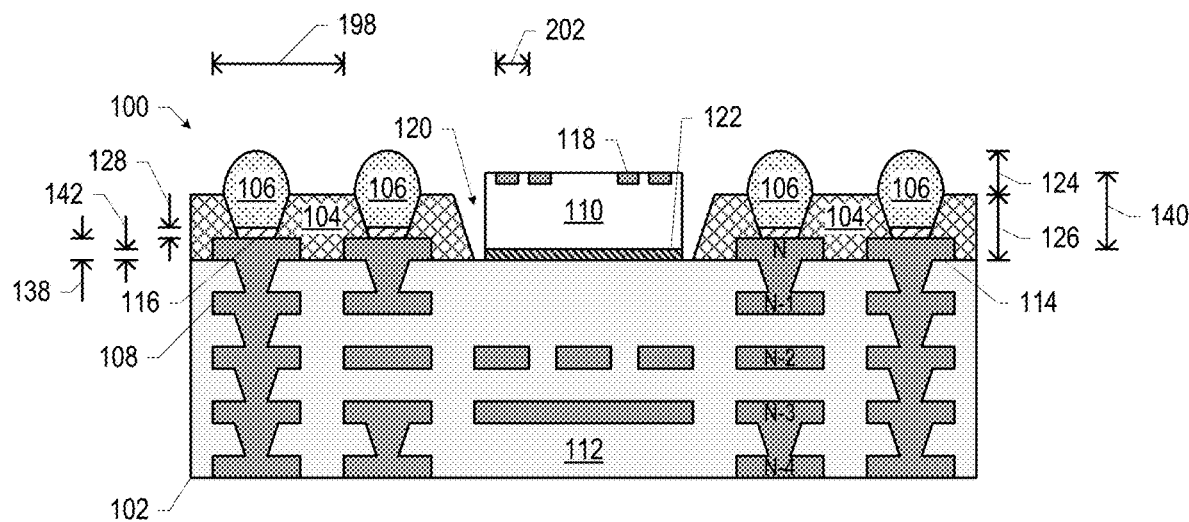
FIG. 1 is a side, cross-sectional view of an example microelectronic structure, in accordance with various embodiments.

Disclosed herein are microelectronic structures including bridges, as well as related assemblies and methods. In some embodiments, a microelectronic structure may include a substrate and a bridge in a cavity of the substrate. Microelectronic components may be coupled to both the substrate and the bridge.

To achieve high interconnect density in a microelectronics package, some conventional approaches require costly manufacturing operations, such as fine-pitch via formation and first-level interconnect plating in substrate layers over an embedded bridge, done at panel scale. The microelectronic structures and assemblies disclosed herein may achieve interconnect densities as high or higher than conventional approaches without the expense of conventional costly manufacturing operations. Further, the microelectronic structures and assemblies disclosed herein offer new flexibility to electronics designers and manufacturers, allowing them to select an architecture that achieves their device goals without excess cost or manufacturing complexity.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

FIG. 1 is a side, cross-sectional view of an example microelectronic structure 100. The microelectronic structure 100 may include a substrate 102 and a bridge component 110 in a cavity 120 at a "top" face of the substrate 102. The substrate 102 may include a dielectric material 112 and conductive material 108, with the conductive material 108 arranged in the dielectric material 112 (e.g., in lines and vias, as shown) to provide conductive pathways through the substrate 102. In some embodiments, the dielectric material 112 may include an organic material, such as an organic buildup film. In some embodiments, the dielectric material 112 may include a ceramic, an epoxy film having filler particles therein, glass, an inorganic material, or combinations of organic and inorganic materials, for example. In some embodiments, the conductive material 108 may include a metal (e.g., copper). In some embodiments, the substrate 102 may include layers of dielectric material 112/conductive material 108, with lines of conductive material 108 in one layer electrically coupled to lines of conductive material 108 in an adjacent layer by vias of the conductive material 108. A substrate 102 including such layers may be formed using a printed circuit board (PCB) fabrication technique, for example. A substrate 102 may include N such layers, where N is an integer greater than or equal to one; in the accompanying drawings, the layers are labeled in descending order from the face of the substrate 102 closest to the cavity 120 (e.g., layer N, layer N−1, layer N−2, etc.). Although a particular number and arrangement of layers of dielectric material 112/conductive material 108 are shown in various ones of the accompanying figures, these particular numbers and arrangements are simply illustrative, and any desired number and arrangement of dielectric material 112/conductive material 108 may be used. For example, although FIG. 1 and others of the accompanying drawings do not illustrate conductive material 108 in layer N−1 under the bridge component 110, conductive material 108 may be present in layer N−1 under the bridge component 110. Further, although a particular number of layers are shown in the substrate 102 (e.g., five layers), these layers may represent only a portion of the substrate 102, and further layers may be present (e.g., layers N−5, N−6, etc.).

As noted above, a microelectronic structure 100 may include a cavity 120 at the "top" face of the substrate 102. In the embodiment of FIG. 1, the cavity 120 extends through a surface insulation material 104 at the "top" face, and the bottom of the cavity is provided by the "topmost" dielectric material 112. The surface insulation material 104 may include a solder resist and/or other dielectric materials that may provide surface electrical insulation and may be compatible with solder-based or non-solder-based interconnects, as appropriate. In other embodiments, a cavity 120 in a substrate 102 may extend into the dielectric material 112, as discussed further below. The cavity 120 may have a tapered shape, as shown in FIG. 1, narrowing toward the bottom of the cavity 120. The substrate 102 may include conductive contacts 114 at the "top" face that are coupled to conductive pathways formed by the conductive material 108 through the dielectric material 112, allowing components electrically coupled to the conductive contacts 114 (not shown in FIG. 1, but discussed below with reference to FIG. 2) to circuitry within the substrate 102 and/or to other components electrically coupled to the substrate 102. The conductive contacts 114 may include a surface finish 116, which may protect the underlying material of the conductive contact from corrosion. In some embodiments, the surface finish 116 may include nickel, palladium, gold, or a combination thereof. The conductive contacts 114 may be located at the "top" face and outside the cavity 120; as shown, the surface insulation material 104 may include openings at the bottom of which the surface finishes 116 of the conductive contacts 114 are exposed. Any of the conductive contacts disclosed herein may include a surface finish 116, whether or not such a surface finish 116 is expressly illustrated. In FIG. 1, solder 106 (e.g., a solder ball) may be disposed in the openings, and in conductive contact with the conductive contacts 114. As shown in FIG. 1 and others of the accompanying drawings, these openings in the surface insulation material 104 may be tapered, narrowing toward the conductive contacts 114. In some embodiments, the solder 106 on the conductive contacts 114 may be first-level interconnects, while in other embodiments, non-solder first-level interconnects may be used to electrically couple the conductive contacts 114 to another component. As used herein, a "conductive contact" may refer to a portion of conductive material (e.g., one or more metals) serving as part of an interface between different components; although some of the conductive contacts discussed herein are illustrated in a particular manner in various ones of the accompanying drawings, any conductive contacts may be recessed in, flush with, or extending away from a surface of a component, and may take any suitable form (e.g., a conductive pad or socket).

A bridge component 110 may be disposed in the cavity 120, and may be coupled to the substrate 102. This coupling may include electrical interconnects or may not include electrical interconnects; in the embodiment of FIG. 1, the bridge component 110 is mechanically coupled to the dielectric material 112 of the substrate 102 by an adhesive 122 (e.g., a die-attach film (DAF)) between the "bottom" face of the bridge component 110 and the substrate 102, while other types of couplings are described elsewhere herein. The bridge component 110 may include conductive contacts 118 at its "top" face; as discussed below with reference to FIG. 2, these conductive contacts 118 may be used to electrically couple the bridge component 110 to one or more other microelectronic components. The bridge component 110 may include conductive pathways (e.g., including lines and vias, as discussed below with reference to FIG. 55) to the conductive contacts 118 (and/or to other circuitry included in the bridge component 110 and/or to other conductive contacts of the bridge component 110, as discussed below). In some embodiments, the bridge component 110 may include a semiconductor material (e.g., silicon); for example, the bridge component 110 may be a die 1502, as discussed below with reference to FIG. 54, and may include an integrated circuit (IC) device 1600, as discussed below with reference to FIG. 55. In some embodiments, the bridge component 110 may be an "active" component in that it may contain one or more active devices (e.g., transistors), while in other embodiments, the bridge component 110 may be a "passive" component in that it does not contain one or more active devices. The bridge component 110 may be manufactured so as to permit a greater density of interconnects than the substrate 102. Consequently, the pitch 202 of the conductive contacts 118 of the bridge component 110 may be less than the pitch 198 of the conductive contacts 114 of the substrate 102. When multiple microelectronic components are coupled to the bridge component 110 (e.g., as discussed below with reference to FIG. 2), these microelectronic components may use the electrical pathways through the bridge component 110 (and may use other circuitry within the bridge component 110, when present) to achieve a higher density interconnection between them, relative to interconnections made via the conductive contacts 114 of the substrate 102.

The dimensions of the elements of a microelectronic structure 100 may take any suitable values. For example, in some embodiments, the thickness 138 of the metal lines of the conductive contacts 114 may be between 5 microns and 25 microns. In some embodiments, the thickness 128 of the surface finish 116 may be between 5 microns and 10 microns (e.g., 7 microns of nickel and less than 100 nanometers of each of palladium and gold). In some embodiments, the thickness 142 of the adhesive 122 may be between 2 microns and 10 microns. In some embodiments, the pitch 202 of the conductive contacts 118 of the bridge component 110 may be less than 70 microns (e.g., between 25 microns and 70 microns, between 25 microns and 65 microns, between 40 microns and 70 microns, or less than 65 microns). In some embodiments, the pitch 198 of the conductive contacts 114 may be greater than 70 microns (e.g., between 90 microns and 150 microns). In some embodiments, the thickness 126 of the surface insulation material 104 may be between 25 microns and 50 microns. In some embodiments, the height 124 of the solder 106 above the surface insulation material 104 may be between 25 microns and 50 microns. In some embodiments, the thickness 140 of the bridge component 110 may be between 30 microns and 200 microns. In some embodiments, a microelectronic structure 100 may have a footprint that is less than 100 square millimeters (e.g., between 4 square millimeters and 80 square millimeters).

Figure 2:
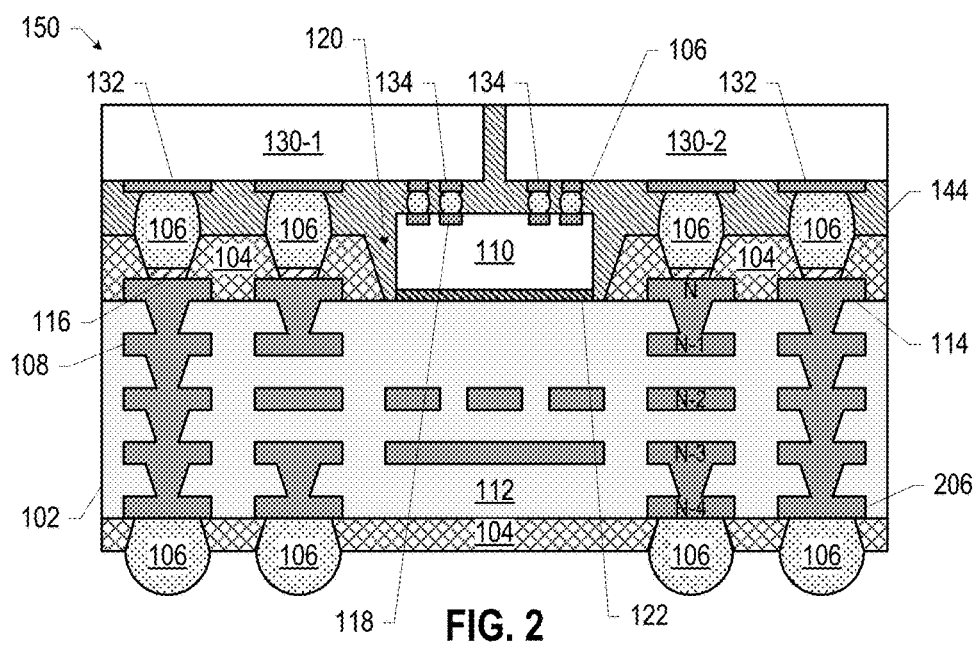
FIG. 2 is a side, cross-sectional view of an example microelectronic assembly including the microelectronic structure of FIG. 1, in accordance with various embodiments.

A microelectronic structure 100, like that of FIG. 1 and others of the accompanying drawings, may be included in a larger microelectronic assembly. FIG. 2 illustrates an example of such a microelectronic assembly 150, which may include one or more microelectronic components 130 having conductive contacts 134 coupled to the conductive contacts 118 of the bridge component 110 (e.g., by solder 106 or another interconnect structure) and conductive contacts 132 coupled to the conductive contacts 114 of the substrate 102 (e.g., by solder 106 or another interconnect structure, as discussed above). FIG. 2 illustrates two microelectronic components 130 (the microelectronic components 130-1 and 130-2), but a microelectronic assembly 150 may include more or fewer microelectronic components 130. Although FIG. 2 depicts the microelectronic components 130-1/130-2 as substantially "covering" the proximate surface of the microelectronic structure 100, this is simply an illustration, and need not be the case. Further, although FIGS. 1 and 2 (and others of the accompanying drawings) depict microelectronic structures 100/microelectronic assemblies 150 that include a single bridge component 110 in a substrate 102, this is simply for ease of illustration, and a microelectronic structure 100/microelectronic assembly 150 may include multiple bridge components 110 in a substrate 102.

The microelectronic components 130 may include conductive pathways (e.g., including lines and vias, as discussed below with reference to FIG. 55) to the conductive contacts 132/134 (and/or to other circuitry included in the microelectronic component 130 and/or to other conductive contacts of the microelectronic component 130, not shown). In some embodiments, a microelectronic component 130 may include a semiconductor material (e.g., silicon); for example, a microelectronic component 130 may be a die 1502, as discussed below with reference to FIG. 54, and may include an IC device 1600, as discussed below with reference to FIG. 55. In some embodiments, the microelectronic component 130 may be an "active" component in that it may contain one or more active devices (e.g., transistors), while in other embodiments, the microelectronic component 130 may be a "passive" component in that it does not contain one or more active devices. In some embodiments, for example, a microelectronic component 130 may be a logic die. More generally, the microelectronic components 130 may include circuitry to perform any desired functionality. For example, one or more of the microelectronic components 130 may be logic dies (e.g., silicon-based dies), and one or more of the microelectronic components 130 may be memory dies (e.g., high bandwidth memory). As discussed above with reference to FIG. 1, when multiple microelectronic components 130 are coupled to the bridge component 110 (e.g., as shown in FIG. 2), these microelectronic components 130 may use the electrical pathways through the bridge component 110 (and may use other circuitry within the bridge component 110, when present) to achieve a higher density interconnection between them, relative to interconnections made via the conductive contacts 114 of the substrate 102.

As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, a mold material 144 may be disposed between the microelectronic structure 100 and the microelectronic components 130, and may also be between the microelectronic components 130 and above the microelectronic components 130 (not shown). In some embodiments, the mold material 144 may include multiple different types of mold materials, including an underfill material between the microelectronic components 130 and the microelectronic structure 100 and a different material disposed above and at side faces of the microelectronic components 130. Example materials that may be used for the mold material 144 include epoxy materials, as suitable.

The microelectronic assembly 150 also illustrates a surface insulation material 104 at the "bottom" face of the substrate 102 (opposite to the "top" face), with tapered openings in the surface insulation material 104 at the bottoms of which conductive contacts 206 are disposed. Solder 106 may be disposed in these openings, in conductive contact with the conductive contacts 206. The conductive contacts 206 may also include a surface finish (not shown). In some embodiments, the solder 106 on the conductive contacts 206 may be second-level interconnects (e.g., solder balls for a ball grid array arrangement), while in other embodiments, non-solder second-level interconnects (e.g., a pin grid array arrangement or a land grid array arrangement) may be used to electrically couple the conductive contacts 206 to another component. The conductive contacts 206/solder 106 (or other second-level interconnects) may be used to couple the substrate 102 to another component, such as a circuit board (e.g., a motherboard), an interposer, or another IC package, as known in the art and as discussed below with reference to FIG. 56. In embodiments in which the microelectronic assembly 150 includes multiple microelectronic components 130, the microelectronic assembly 150 may be referred to as a multi-chip package (MCP). A microelectronic assembly 150 may include additional components, such as passive components (e.g., surface-mount resistors, capacitors, and inductors disposed at the "top" face or the "bottom" face of the substrate 102), active components, or other components.

FIGS. 3-10 are side, cross-sectional views of various stages in an example process for the manufacture of the microelectronic assembly 150 of FIG. 2, in accordance with various embodiments. Although the operations of the process of FIGS. 3-10 (and the processes of others of the accompanying drawings, discussed below) may be illustrated with reference to particular embodiments of the microelectronic structures 100/microelectronic assemblies 150 disclosed herein, the method may be used to form any suitable microelectronic structures 100/microelectronic assemblies 150. Operations are illustrated once each and in a particular order in FIGS. 3-10 (and in the figures representing others of the manufacturing processes disclosed herein), but the operations may be reordered and/or repeated as desired (e.g., with different operations performed in parallel when manufacturing multiple microelectronic structures 100/microelectronic assemblies 150).

Figure 3:
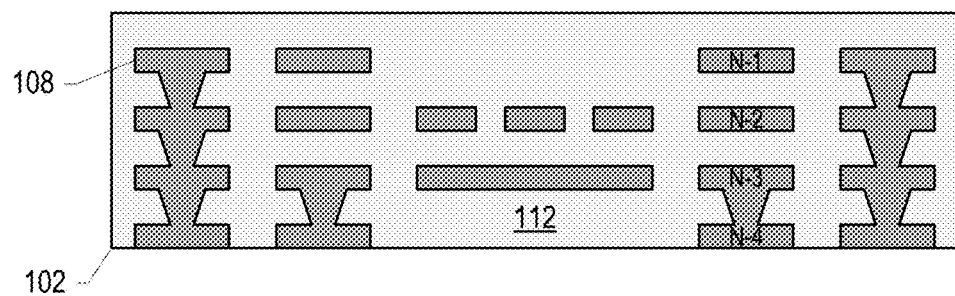
FIGS. 3-10 are side, cross-sectional views of various stages in an example process for the manufacture of the microelectronic assembly of FIG. 2, in accordance with various embodiments.

FIG. 3 illustrates an assembly that includes a preliminary substrate 102 including dielectric material 112 and patterned conductive material 108. The assembly of FIG. 3 may be manufactured using conventional package substrate manufacturing techniques (e.g., lamination of layers of the dielectric material 112, etc.), and may include layers up to N−1.

Figure 4:
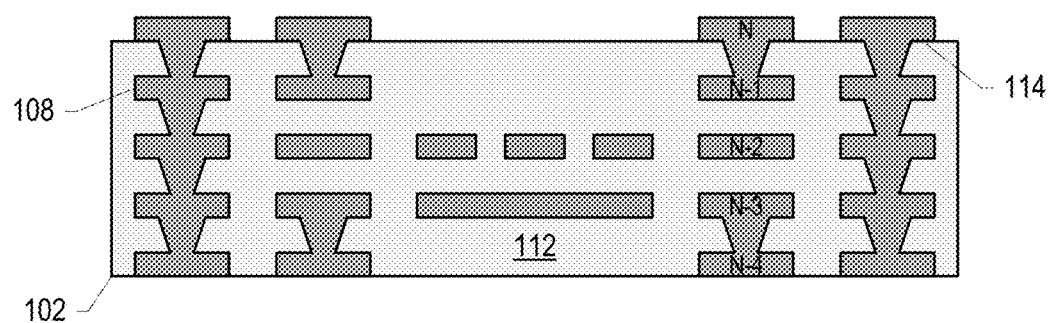

FIG. 4 illustrates an assembly subsequent to fabricating an additional Nth layer for the preliminary substrate 102 of FIG. 4. The assembly of FIG. 4 includes the underlying metal of the conductive contacts 114. The assembly of FIG. 4 may be manufactured using conventional package substrate manufacturing techniques.

Figure 5:
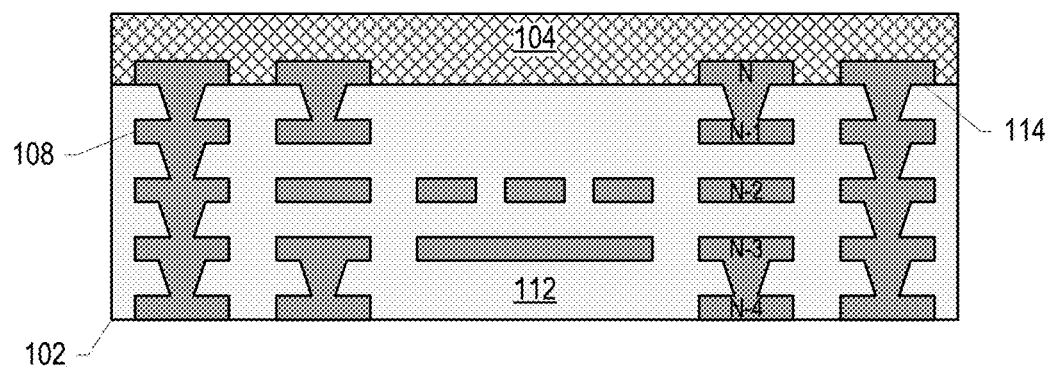

FIG. 5 illustrates an assembly subsequent to former a layer of surface insulation material 104 on the assembly of FIG. 4.

Figure 6:
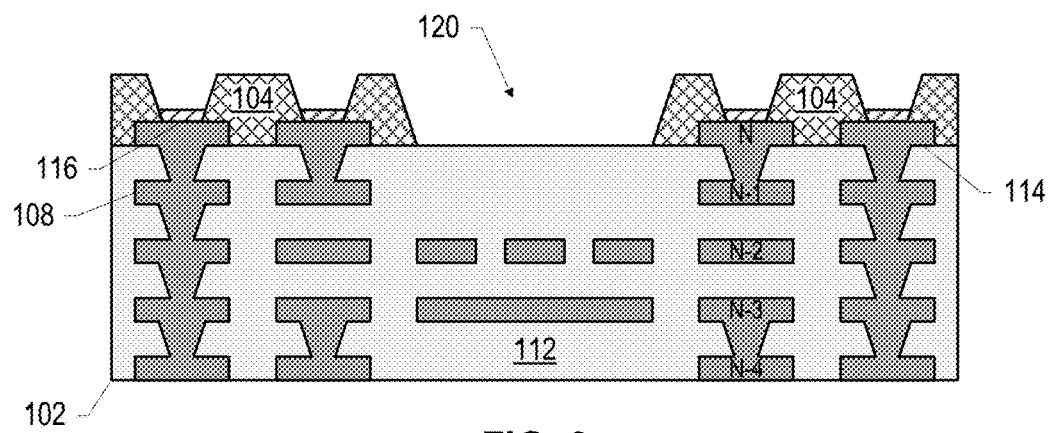

FIG. 6 illustrates an assembly subsequent to patterning openings in the surface insulation material 104 of the assembly of FIG. 5 to expose the underlying metal of the conductive contacts 114, forming the surface finish 116 of the conductive contacts 114, and forming the cavity 120. In some embodiments, the openings in the surface insulation material 104 (including the cavity 120) may be formed by mechanical patterning, laser patterning, dry etch patterning, or lithographic patterning techniques.

Figure 7:
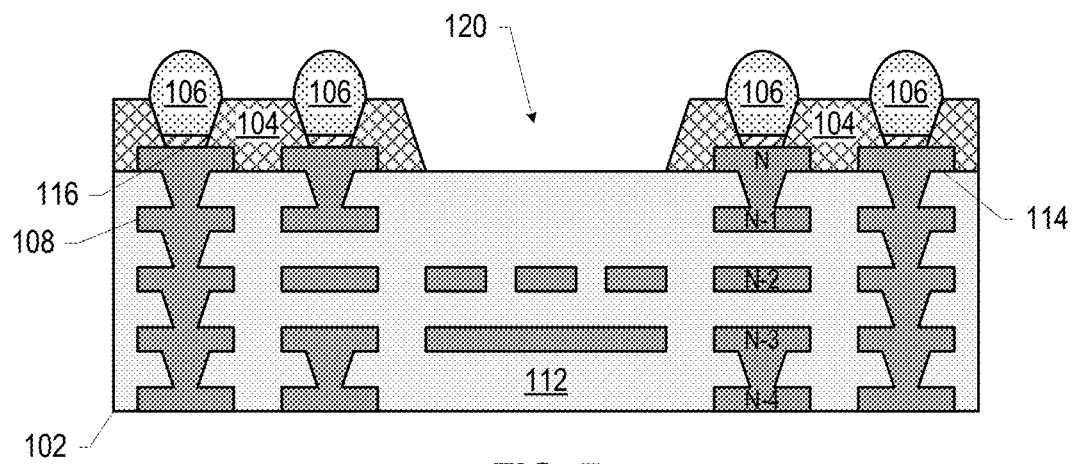

FIG. 7 illustrates an assembly subsequent to performing a clean operation on the assembly of FIG. 6, and forming the solder 106 (e.g., microballs) on the conductive contacts 114.

Figure 8:
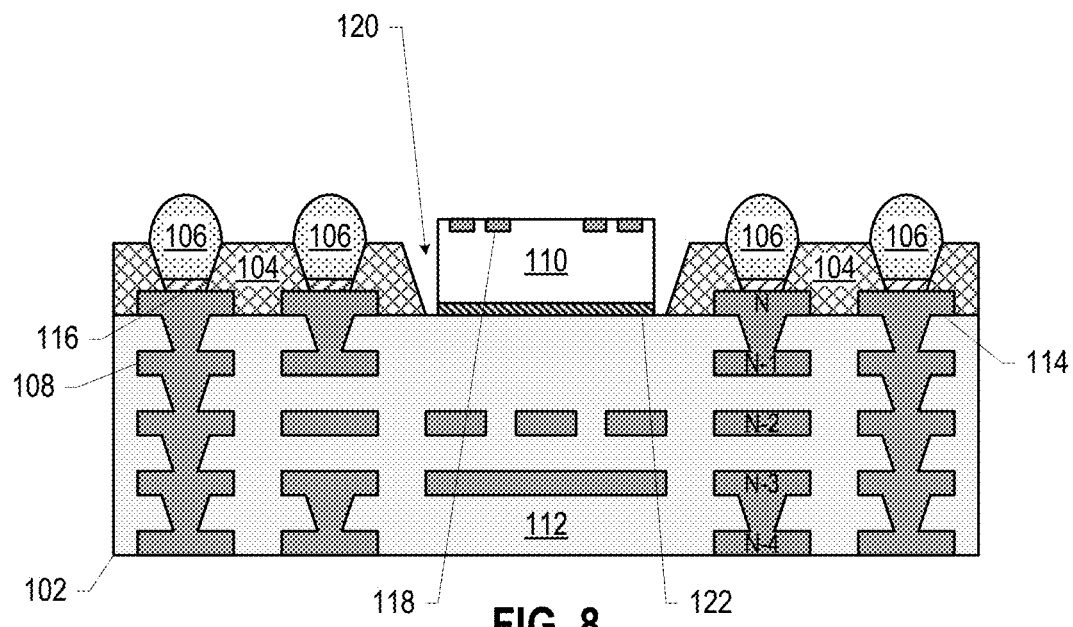

FIG. 8 illustrates an assembly subsequent to attaching the bridge component 110 to the exposed dielectric material 112 of the cavity 120 of the assembly of FIG. 7, using the adhesive 122. In some embodiments, the adhesive 122 may be a DAF, and attaching the bridge component 110 may include performing a film cure operation. The assembly of FIG. 8 may take the form of the microelectronic structure 100 of FIG. 1.

Figure 9:
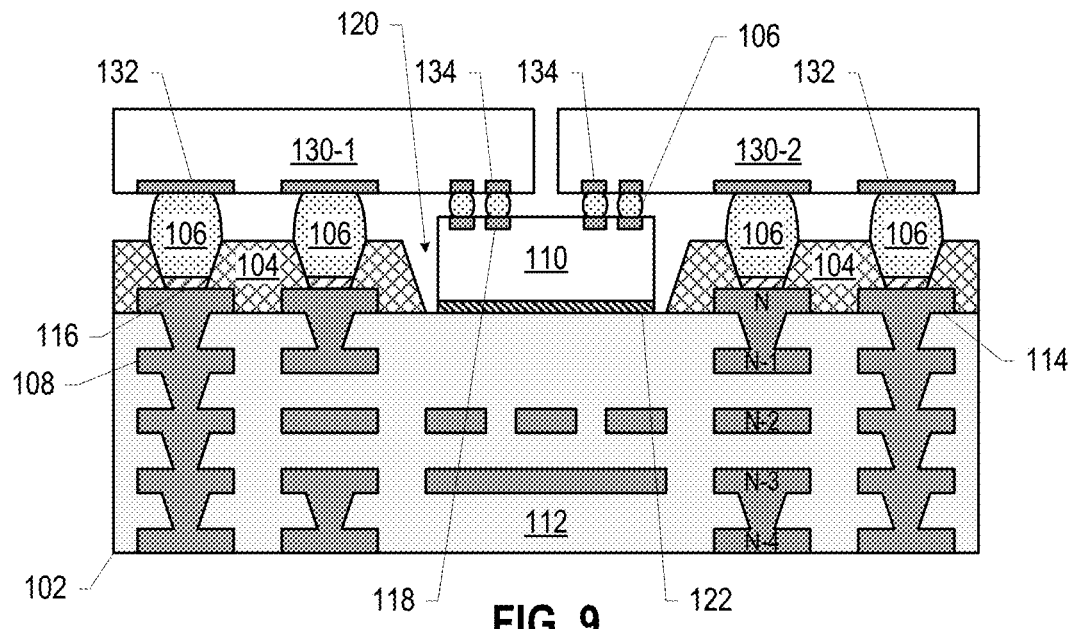

FIG. 9 illustrates an assembly subsequent to attaching the microelectronic components 130 to the assembly of FIG. 8. In some embodiments, this attachment may include a thermocompression bonding (TCB) operation. In some embodiments, additional solder may be provided on the conductive contacts 118, the conductive contacts 132, and/or the conductive contacts 134 before the TCB operation.

Figure 10:
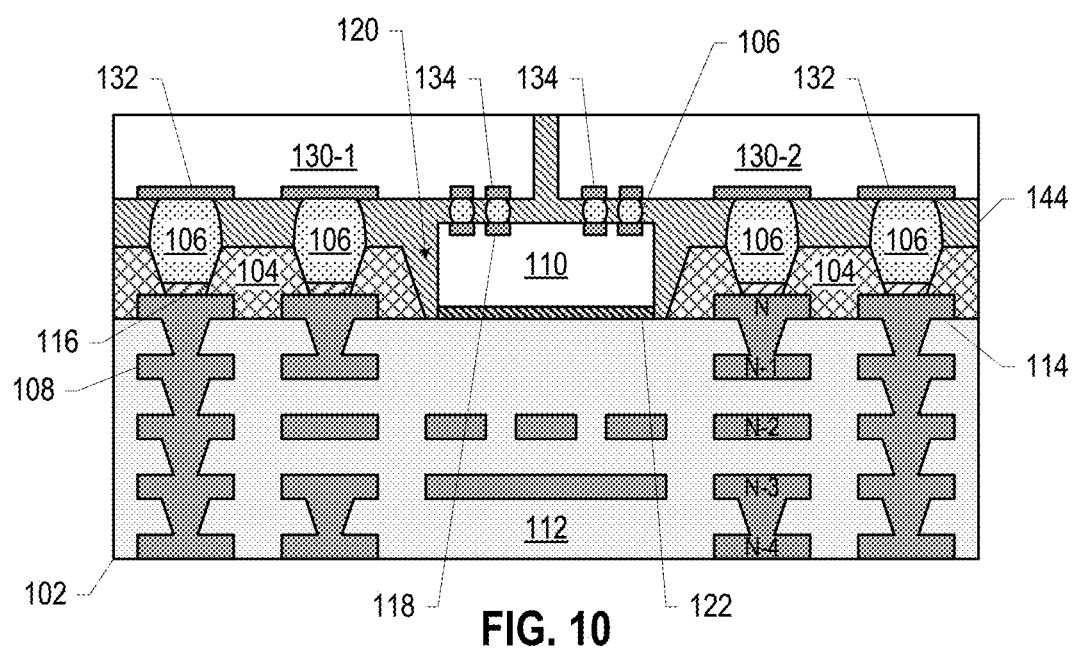

FIG. 10 illustrates an assembly subsequent to providing the mold material 144 to the assembly of FIG. 9. As noted above, in some embodiments, the mold material 144 of FIG. 10 may include multiple different materials (e.g., a capillary underfill material between the microelectronic components 130 and the microelectronic structure 100, and a different material over the microelectronic components 130). The assembly of FIG. 10 may take the form of the microelectronic assembly 150 of FIG. 2. As discussed above, the mold material 144 may include an underfill material (e.g., a capillary underfill material).

Various ones of FIGS. 3-53 illustrate example microelectronic structures 100/microelectronic assemblies 150 having various features. The features of these microelectronic structures 100/microelectronic assemblies 150 may be combined with any other features disclosed herein, as suitable, to form a microelectronic structure 100/microelectronic assembly 150. For example, any of the microelectronic structures 100 disclosed herein may be coupled to one or more microelectronic components 130 (e.g., as discussed above with reference to FIGS. 2-10) to form a microelectronic assembly 150, and any of the microelectronic assemblies 150 disclosed herein may be manufactured separately from their constituent microelectronic structures 100. A number of elements of FIGS. 1 and 2 are shared with FIGS. 3-53; for ease of discussion, a description of these elements is not repeated, and these elements may take the form of any of the embodiments disclosed herein.

A microelectronic structure 100 may include a cavity 120 that extends through a surface insulation material 104 at a "top" face of the substrate 102 (e.g., as discussed above with reference to FIG. 1). In some embodiments, the dielectric material 112 of the substrate 102 may provide the bottom of the cavity 120 (e.g., as discussed above with reference to FIG. 1), while in other embodiments, another material may provide a bottom of the cavity 120.

Figure 11:
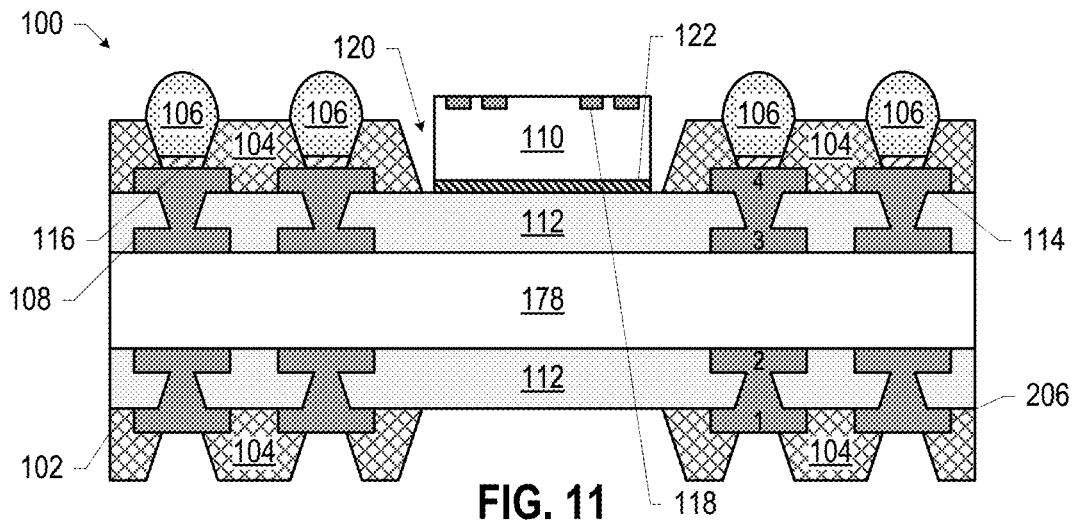
FIG. 11 is a side, cross-sectional view of an example microelectronic structure, in accordance with various embodiments.

Although various ones of the drawings herein illustrate the substrate 102 as a coreless substrate (e.g., having vias that all taper in the same direction), any of the substrates 102 disclosed herein may be cored substrates 102. For example, FIG. 11 illustrates a microelectronic structure 100 having similar features to the microelectronic structure of FIG. 1, but having a substrate 102 having a core 178 (through which conductive pathways, not shown, may extend). As shown in FIG. 11, a cored substrate 102 may include vias that taper toward the core 178 (and thus taper in opposite directions at opposite sides of the core 178).

Figure 12:
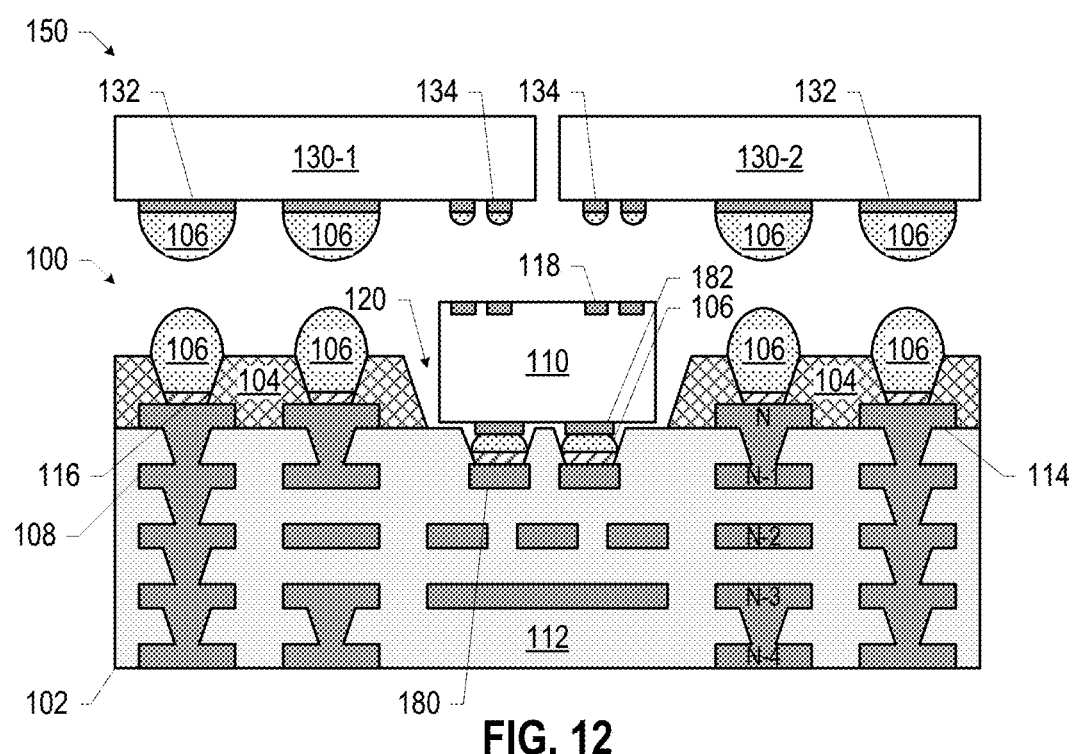
FIG. 12 is a side, cross-sectional, exploded view of an example microelectronic assembly, in accordance with various embodiments.

As noted above, in some embodiments, the bridge component 110 may include conductive contacts other than the conductive contacts 118 at its "top" face; for example, the bridge component 110 may include conductive contacts 182 at its "bottom" face, as shown in a number of the accompanying drawings. For example, FIG. 12 illustrates an embodiment of a microelectronic structure 100 similar to that of FIG. 1, but in which conductive contacts 182 of the bridge component 110 are coupled to conductive contacts 180 of the substrate 102 by solder 106. In a microelectronic structure 11, the conductive contacts 182 of the bridge component 110 may be conductively coupled to conductive contacts 180 at the bottom of the cavity 120 of the substrate 102 (e.g., by solder 106 or another type of interconnect). In some embodiments, the conductive contacts 180 may be at the bottom of corresponding cavities in the dielectric material 112, as shown. The conductive contacts 180 may include a surface finish 116 at their exposed surfaces, as shown. Direct electrical connections between the substrate 102 and the bridge component 110 (i.e., electrical connections that do not go through a microelectronic component 130) may enable direct power and/or input/output (I/O) pathways between the substrate 102 and the bridge component 110, which may result in power delivery benefits and/or signal latency benefits. In some embodiments, the pitch of the conductive contacts 182 may be between 40 microns and 1 millimeter (e.g., between 40 microns and 50 microns, or between 100 microns and 1 millimeter). In embodiments in which the bridge component 110 includes conductive contacts 182 at its "bottom" face to couple to conductive contacts 180 at the bottom of the cavity 120 of the substrate 102, a dielectric material (e.g., a capillary underfill material) may support these connections; such a material is not shown in various ones of the accompanying drawings for clarity of illustration.

Figure 13:
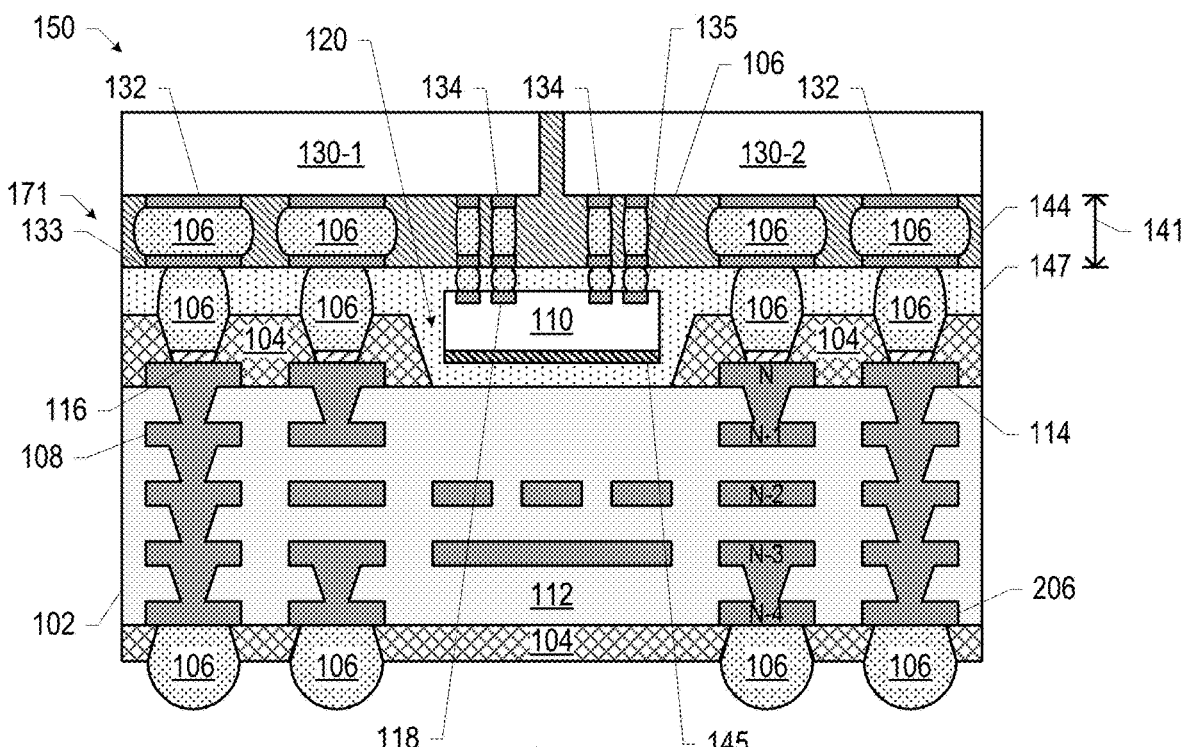
FIGS. 13-14 are side, cross-sectional views of example microelectronic assemblies, in accordance with various embodiments.
Figure 14:
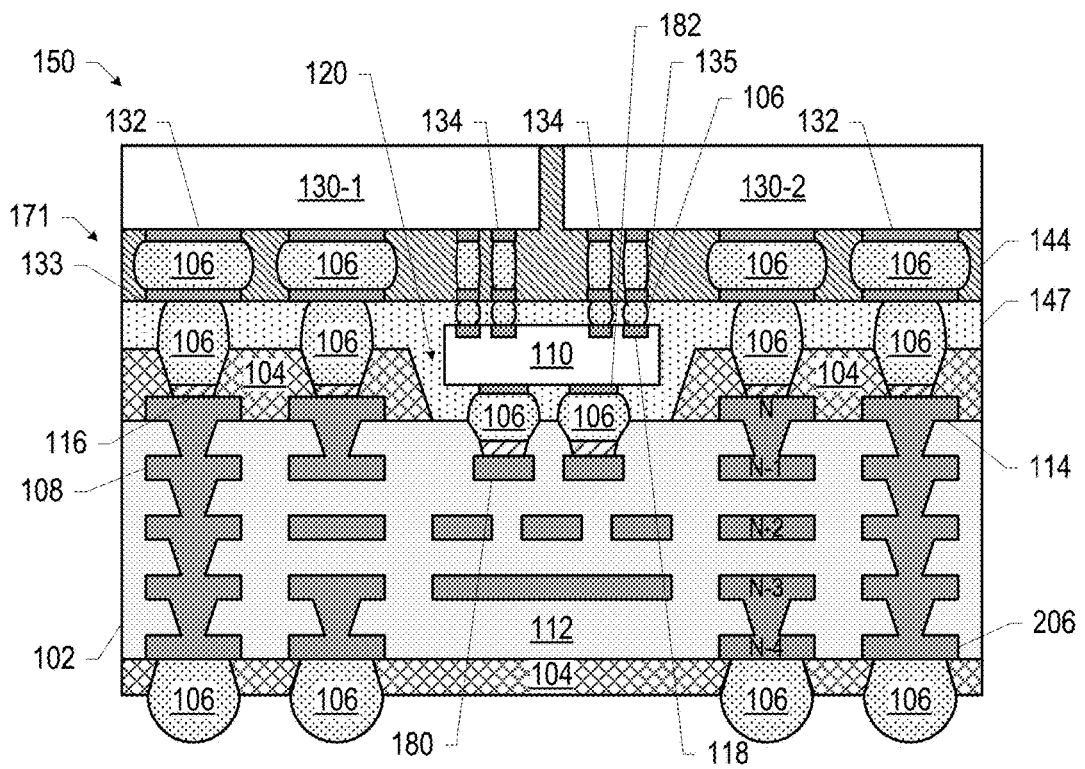

In some embodiments, multiple microelectronic components 130 may be assembled together into a complex that is then coupled to a bridge component 110 and to a substrate 102 through a routing region 171. For example, FIGS. 13-14 are side, cross-sectional views of example microelectronic assemblies 150 including a routing region 171, in accordance with various embodiments. In the embodiment of FIG. 13, the bridge component 110 may be disposed in the cavity 120 of the substrate 102, but may not include conductive contacts 182 at its "bottom" face, and may or may not be in contact with the dielectric material 112 of the substrate 102; instead, as shown, an underfill material 147 may mechanically secure the bridge component 110 to the substrate 102. In some embodiments, the underfill material 147 may extend between the bridge component 110 and the dielectric material 112 of the substrate 102, may extend around the side faces of the bridge component 110, may extend between the bridge component 110 and the routing region 171, and/or may extend between the substrate 102 and the routing region 171. In the embodiment of FIG. 13, a mold material 145 may be present at the "bottom" face of the bridge component 110; the mold material 145 may have a same material composition or a different material composition than the underfill material 147. The mold material 145 may serve to provide mechanical support to the bridge component 110 during assembly operations, and any suitable ones of the bridge components 110 disclosed herein may include such mold material. In some embodiments, the mold material 145 may have a thickness between 15 microns and 50 microns.

The routing region 171 of FIG. 13 may include a mold material 144 in contact with side faces and "bottom" faces of the microelectronic components 130, and conductive contacts 133 and 135 coupled to the conductive contacts 132 and 134, respectively, by solder 106. The conductive contacts 133 and 135, as well as the solder 106 coupling the conductive contacts 133 and 135 to the conductive contacts 132 and 134, respectively, may be embedded in the mold material 144, as shown. Outside the routing region 171, the conductive contacts 133 may be coupled to the conductive contacts 114 of the substrate 102 by intervening solder 106, and the conductive contacts 135 may be coupled to the conductive contacts 118 of the bridge component 110 by intervening solder 106. As shown, the solder 106 between the conductive contacts 114 and the conductive contacts 133, and the solder 106 between the conductive contacts 118 and the conductive contacts 135, may be outside the mold material 144, and may be at least partially surrounded by the underfill material 147, as shown. In some embodiments, a thickness 141 of the mold material 144 of the routing region 171 may be between 5 microns and 20 microns (e.g., between 8 microns and 15 microns).

The embodiment of FIG. 14 has many features in common with the embodiment of FIG. 13, but the bridge component 110 of FIG. 14 may include conductive contacts 182 at its "bottom" face, and these conductive contacts 182 may be coupled to conductive contacts 180 of the substrate 102 by intervening solder 106. One or more of the conductive contacts 182 of a bridge component 110 may be coupled to one or more conductive contacts 118 of the bridge component 110 by conductive pathways through the bridge component 110 (including, e.g., one or more through-silicon vias (TSVs)), and/or the conductive contacts 182 of a bridge component 110 may be coupled to electrical elements (e.g., transistors, diodes, resistors, capacitors, inductors, etc.) within the bridge component 110, when present. As shown in FIG. 14, the underfill material 147 may at least partially surround the solder 106 between the conductive contacts 180 and the conductive contacts 182. The microelectronic assemblies 150 of FIGS. 13 and 14 may achieve good coplanarity of relevant features without expensive planarization operations (e.g., without chemical mechanical planarization (CMP)), and may also avoid the plating of tall pillars, which can be difficult to do accurately and inexpensively.

Microelectronic assemblies 150 like those illustrated in FIGS. 13 and 14 may be manufactured using any suitable techniques. For example, FIGS. 15-23 are side, cross-sectional views of various stages in an example process for the manufacture of the microelectronic assembly 150 of FIG. 13, in accordance with various embodiments.

Figure 15:
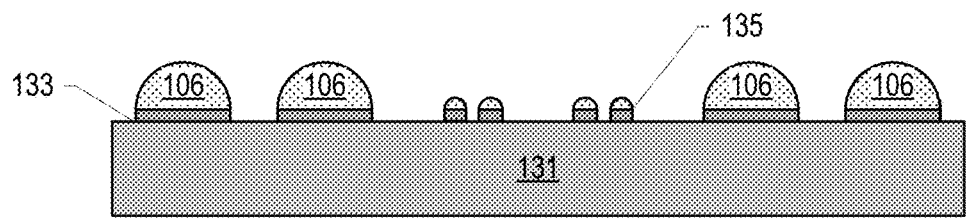
FIGS. 15-23 are side, cross-sectional views of various stages in an example process for the manufacture of the microelectronic assembly of FIG. 13, in accordance with various embodiments.

FIG. 15 illustrates an assembly including a carrier 131 having the conductive contacts 133 and 135 printed thereon, and having solder 106 on the conductive contacts 133/135. In some embodiments, the carrier 131 may be a wafer, and may have one or more release layers (not shown) at the interface between the carrier 131 and the material on the carrier 131. In some embodiments, the conductive contacts 133/135 may be formed on the carrier 131 by an electroplating operation, and the conductive contacts 133/135 may be located so as to position the microelectronic components 130 and the bridge component 110 in their desired locations.

Figure 16:
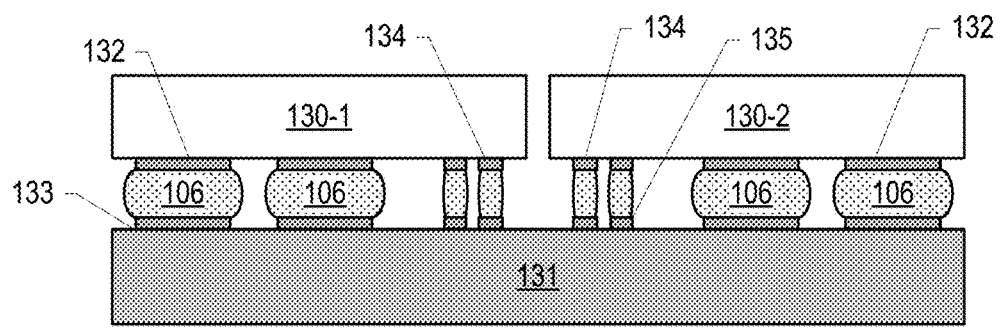

FIG. 16 illustrates an assembly subsequent to coupling microelectronic components 130 to the conductive contacts 133/135 of the assembly of FIG. 15 via the solder 106. In particular, the conductive contacts 132 of the microelectronic components 130 may be coupled to the conductive contacts 133, and the conductive contacts 134 of the microelectronic components 130 may be coupled to the conductive contacts 135. In some embodiments, the microelectronic components 130 may themselves include solder 106 on the conductive contacts 132 and 134, which may join with the solder 106 present on the conductive contacts 133/135 of the assembly of FIG. 15. Any suitable solder bonding technique may be used to form the assembly of FIG. 16. As the conductive contacts 133/135 were deposited to achieve a desired alignment of the microelectronic components 130, the conductive contacts 132/134 of the microelectronic components 130 may self-align to the conductive contacts 133/135. Further, in embodiments in which the carrier 131 has a similar coefficient of thermal expansion (CTE) as the microelectronic components 130 (e.g., the carrier 131 and the microelectronic components 130 are both silicon-based), there may be little to no CTE mismatch between the microelectronic components 130 and the carrier 131 during bonding, further contributing to good alignment between the conductive contacts 132/134 and the conductive contacts 133/135, respectively. Note that the microelectronic component 130-1 need not have a same thickness as the microelectronic component 130-2.

Figure 17:
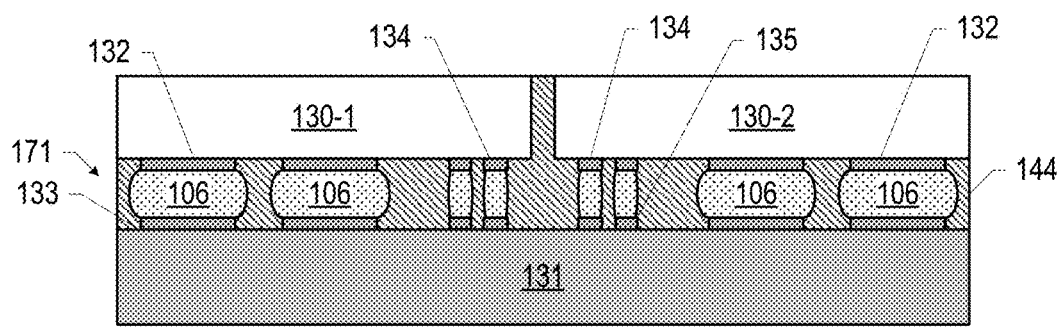

FIG. 17 illustrates an assembly subsequent to providing a mold material 144 between the microelectronic components 130 and the carrier 131 (to form the routing region 171) as well as around side faces of the microelectronic components 130 and likely over the "top" of the microelectronic components 130, and then planarizing this mold material 144 to remove excess mold material 144 achieve a flat "top" surface.

Figure 18:
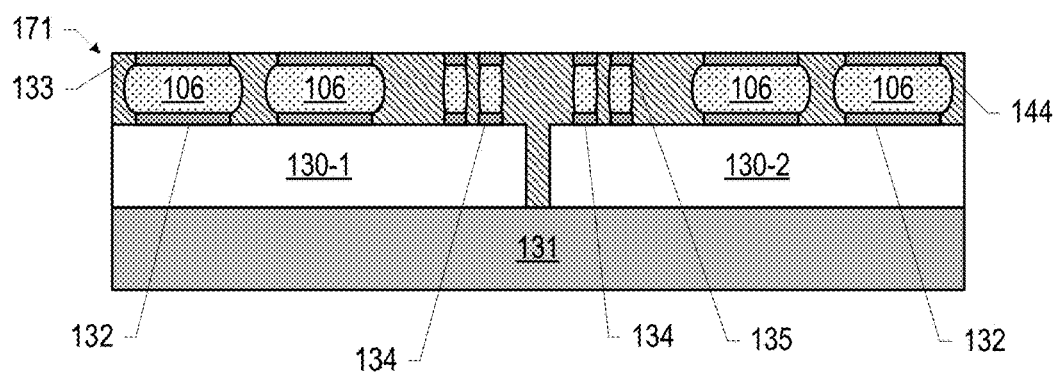

FIG. 18 illustrates an assembly subsequent to removing the carrier 131 from the assembly of FIG. 17, "flipping" the result, and then attaching another carrier 131 to the planarized surface proximate to the "back" faces of the microelectronic components 130 to expose the routing region 171. Although a single reference numeral "131" is used to refer to multiple ones of the carriers discussed herein, simply for ease of discussion, and different ones of the carriers 131 may have different compositions and structures, as desired. In some embodiments, another carrier 131 need not be coupled to the planarized surface prior to subsequent operations (e.g., when the assembly of FIG. 17 has adequate mechanical stability without the carrier 131 to withstand further processing).

Figure 19:
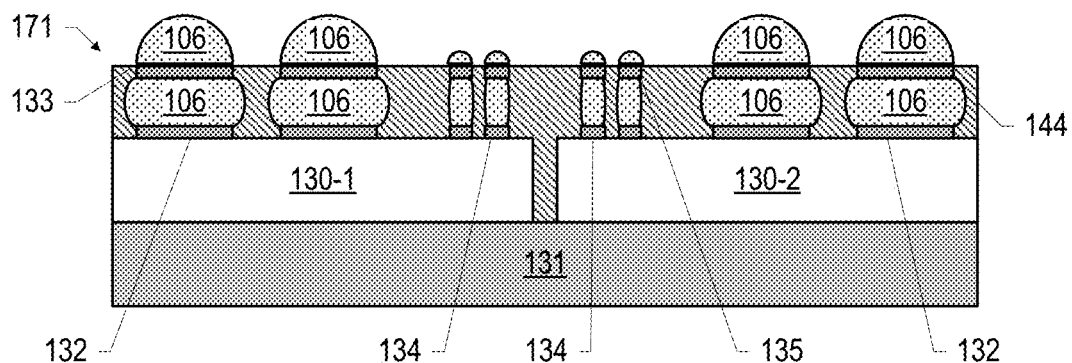

FIG. 19 illustrates an assembly subsequent to providing solder 106 on the exposed conductive contacts 133/135 of the assembly of FIG. 18. In some embodiments, the solder 106 may be provided as a solder bumps.

Figure 20:
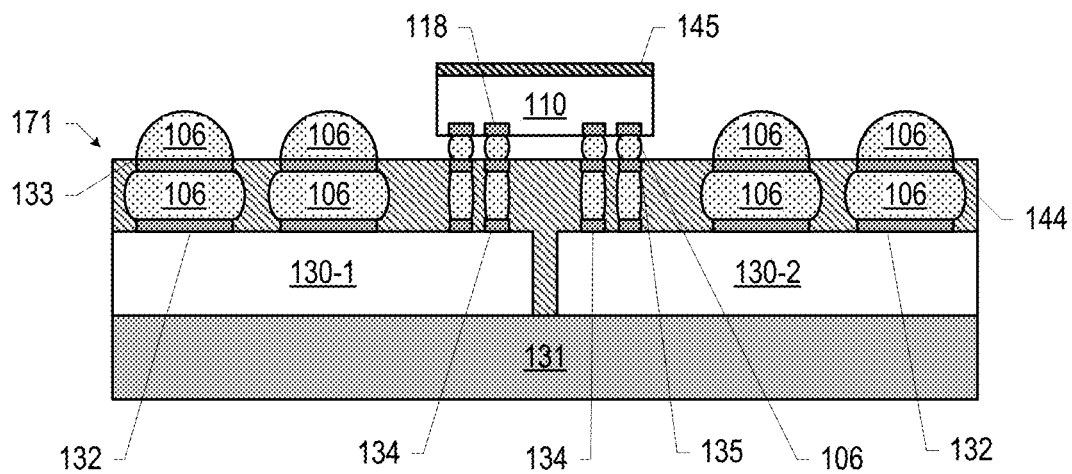

FIG. 20 illustrates an assembly subsequent to bonding a bridge component 110 (with mold material 145 thereon) to the assembly of FIG. 19 by bonding conductive contacts 118 of the bridge component 110 to the conductive contacts 135 via the intervening solder 106. As the conductive contacts 135 were deposited to achieve a desired alignment of the bridge component 110, the conductive contacts 118 of the bridge component 110 may self-align to the conductive contacts 135.

Figure 21:
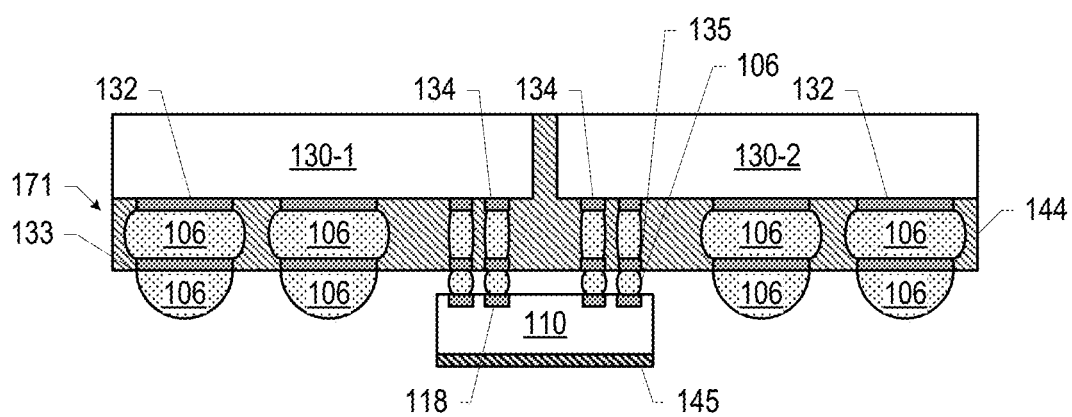

FIG. 21 illustrates an assembly subsequent to removing the carrier 131 of FIG. 20 and "flipping" the result. In embodiments in which multiple ones of the microelectronic assemblies 150 of FIG. 13 are being manufactured simultaneously, the different microelectronic assemblies 150 may be singulated as part of the operations of FIG. 21.

Figure 22:
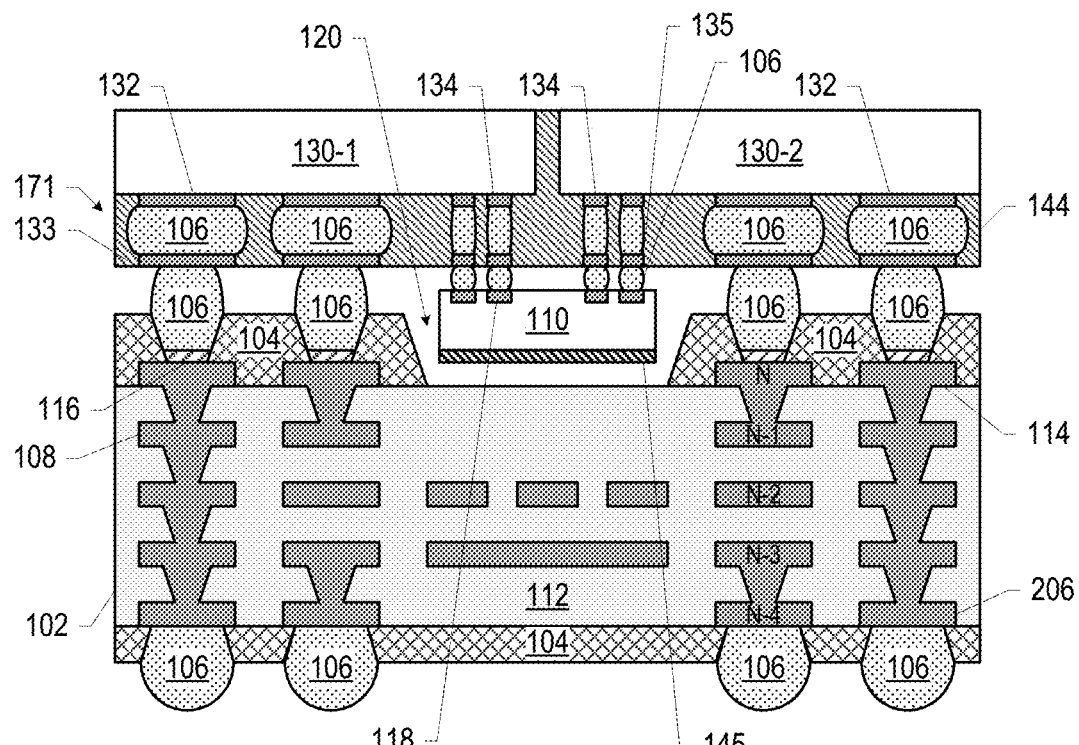

FIG. 22 illustrates an assembly subsequent to coupling the assembly of FIG. 21 to the substrate 102. In particular, the conductive contacts 133 may be bonded to the conductive contacts 114 by intervening solder 106. In some embodiments, this bonding may include a mass reflow operation, and the forces between the solder 106 and the conductive contacts 118 and 135 may be adequate to hold the bridge component 110 in place during the mass reflow.

Figure 23:
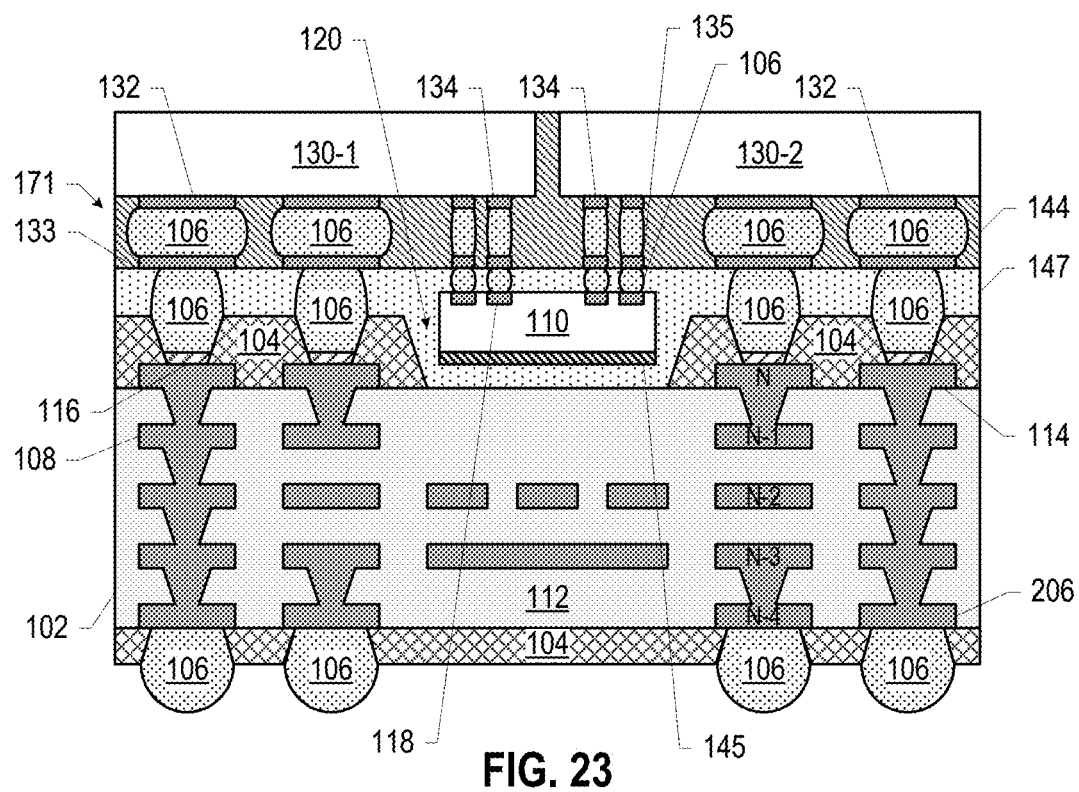

FIG. 23 illustrates an assembly subsequent to providing the underfill material 147 between the substrate 102, the bridge component 110, and the routing region 171. In some embodiments, the spacing between the bridge component 110 and the proximate materials of the substrate 102 may be at least 10 microns to permit the underfill material 147 to reach these spaces. Similarly, in some embodiments, the spacing between the bridge component 110 and the routing region 171 may be at least 10 microns to permit the underfill material 147 to reach these spaces. The assembly of FIG. 23 may take the form of the microelectronic assembly 150 of FIG. 13. The microelectronic assembly 150 of FIG. 14 may be manufactured using a process similar to that illustrated in FIGS. 15-23, but in which the bonding operations discussed above with reference to FIG. 22 (e.g., the mass reflow) may also include bonding the conductive contacts 182 of the bridge component 110 2 the conductive contacts 180 of the substrate 102 by intervening solder 106. Further, in some embodiments, the analogous assembly of FIG. 20 may be baked to cause solder 106 on the conductive contacts 182 to form an intermetallic compound (IMC) before subsequent operations.

Figure 24:
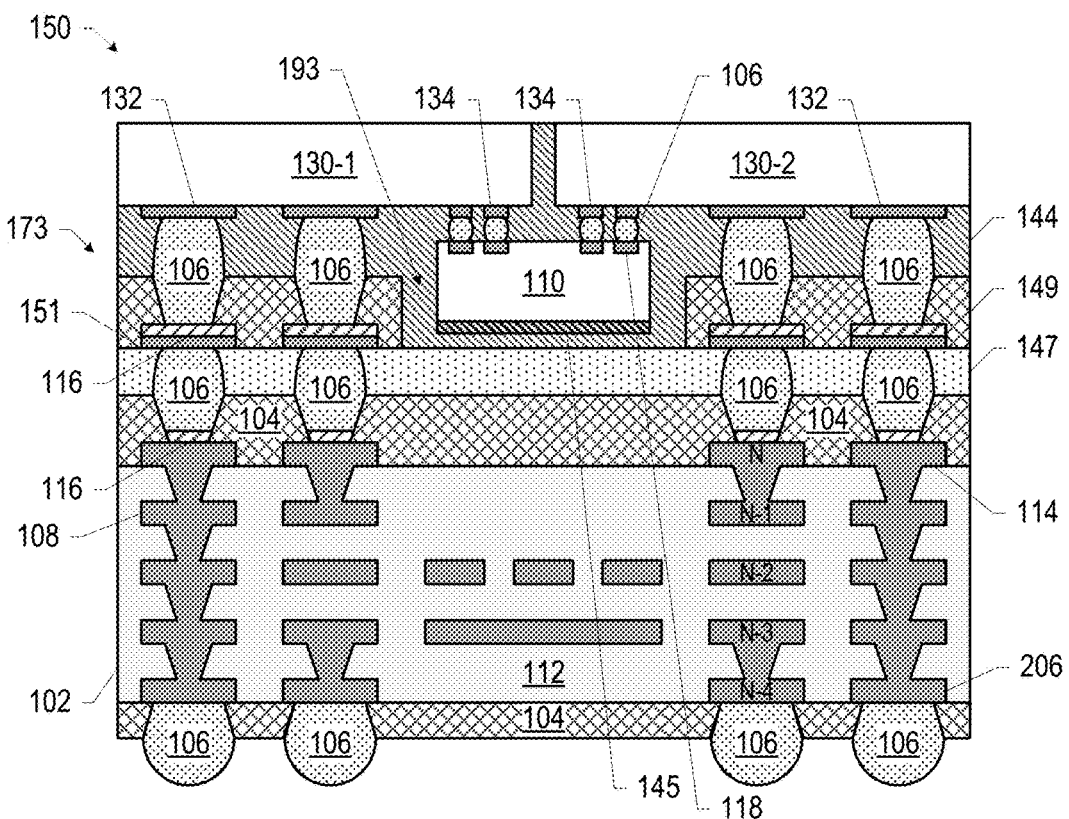
FIGS. 24-25 are side, cross-sectional views of example microelectronic assemblies, in accordance with various embodiments.
Figure 25:
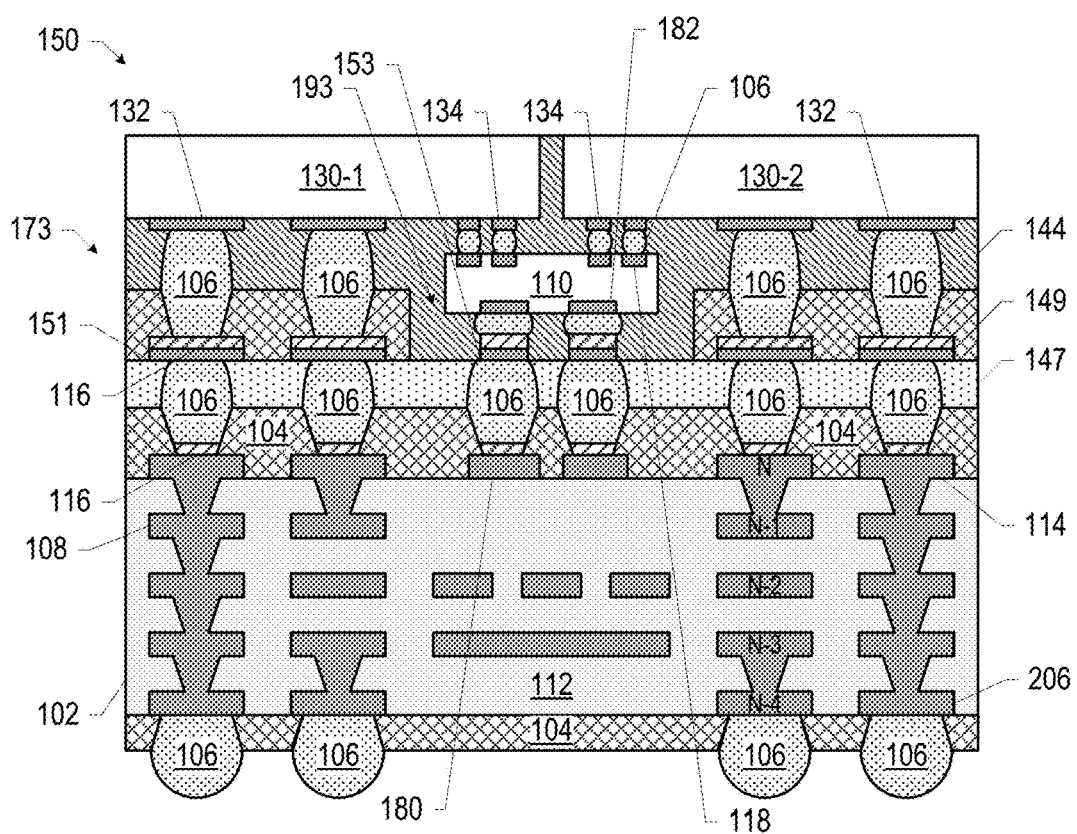

As discussed above with reference to FIGS. 13-14, in some embodiments, multiple microelectronic components 130 may be assembled together into a complex that is then coupled to a bridge component 110 and to a substrate 102 through a routing region 171. In other embodiments, multiple microelectronic components and a bridge component 110 may be assembled together into a complex that is then coupled to a substrate 102 through a routing region 173. FIGS. 24-25 are side, cross-sectional views of example microelectronic assemblies 150 including a routing region 173, in accordance with various embodiments.

The routing regions 173 of FIGS. 24 and 25 may include a mold material 144 in contact with side faces and "bottom" faces of the microelectronic components 130, as well as a dielectric material 149. The dielectric material 149 may include any suitable material, such as a solder resist or a photoresist. The bridge component 110 may not be disposed in a cavity 120 of the substrate 102 (as discussed above with reference to FIGS. 13 and 14), but may instead be partially disposed in an opening 193 in the dielectric material 149 of the routing region 173, and the conductive contacts 118 of the bridge component 110 may be coupled to the conductive contacts 134 of the microelectronic components 130 by solder 106 that is embedded in the mold material 144. A routing region 173 may include conductive contacts 151 embedded in the dielectric material 149 and conductively coupled to the conductive contacts 132 of the microelectronic components 130 by solder 106, and this solder 106 may be partially surrounded by the dielectric material 149 and may be partially surrounded by the mold material 144. As shown in FIGS. 24 and 25, the "bottom" surfaces of the conductive contacts 151 may be coplanar with the "bottom" surface of the dielectric material 149 and the "bottom" surface of the mold material 144 under the bridge component 110. Outside the routing region 173, the conductive contacts 151 may be coupled to the conductive contacts 114 of the substrate 102 by intervening solder 106, and this solder may be partially surrounded by the surface insulation material 104 and partially surrounded by an underfill material 147. As shown, the solder 106 between the conductive contacts 114 and the conductive contacts 151 may be outside the mold material 144 and outside the dielectric material 149.

In the embodiment of FIG. 24, the bridge component 110 may not include conductive contacts 182 at its "bottom" face, and a mold material 145 may be present at the "bottom" face of the bridge component 110 (e.g., as discussed above with reference to FIG. 13). The embodiment of FIG. 25 has many features in common with the embodiment of FIG. 24, but the bridge component 110 of FIG. 25 may include conductive contacts 182 at its "bottom" face, and these conductive contacts 182 may be coupled to conductive contacts 153 of the routing region 170 by intervening solder 106 embedded in the mold material 144 and located in the opening 193 in the dielectric material 149. The "bottom" surfaces of the conductive contacts 153 may be coplanar with the "bottom" surfaces of the conductive contacts 151, and the conductive contacts 153 may be coupled to the conductive contacts 180 of the substrate 102 by intervening solder 106. Outside the routing region 173, the solder 106 coupling the conductive contacts 153 to the conductive contacts 180 may be partially surrounded by the surface insulation material 104 and partially surrounded by the underfill material 147; as shown, the solder 106 between the conductive contacts 153 and the conductive contacts 180 may be outside the mold material 144 an outside the dielectric material 149. Like the microelectronic assemblies 150 of FIGS. 13 and 14, the microelectronic assemblies 150 of FIGS. 24 and 25 may achieve good coplanarity of relevant features without expensive planarization operations, and may also avoid the plating of tall pillars.

Microelectronic assemblies 150 like those illustrated in FIGS. 24 and 25 may be manufactured using any suitable techniques. For example, FIGS. 26-33 are side, cross-sectional views of various stages in an example process for the manufacture of the microelectronic assembly 150 of FIG. 25, in accordance with various embodiments.

Figure 26:
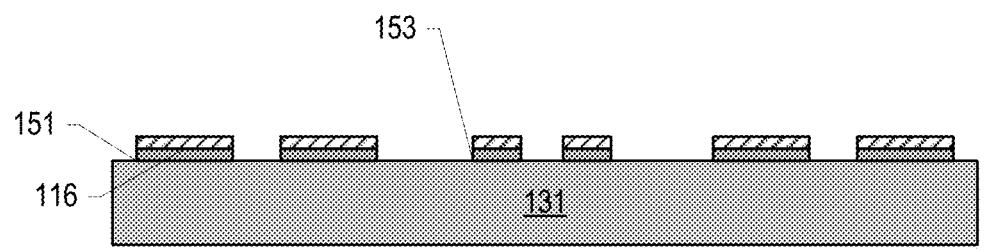
FIGS. 26-33 are side, cross-sectional views of various stages in an example process for the manufacture of the microelectronic assembly of FIG. 25, in accordance with various embodiments.

FIG. 26 illustrates an assembly including a carrier 131 having the conductive contacts 151 and 153 printed thereon. In some embodiments, the carrier 131 may be a wafer, and may have one or more release layers (not shown) at the interface between the carrier 131 and the material on the carrier 131. In some embodiments, the carrier 131 of the assembly of FIG. 26 may include glass. In some embodiments, the conductive contacts 151/153 may be formed on the carrier 131 by an electroplating operation, and the conductive contacts 151/153 may be located so as to position the microelectronic components 130 and the bridge component 110 in their desired locations.

Figure 27:
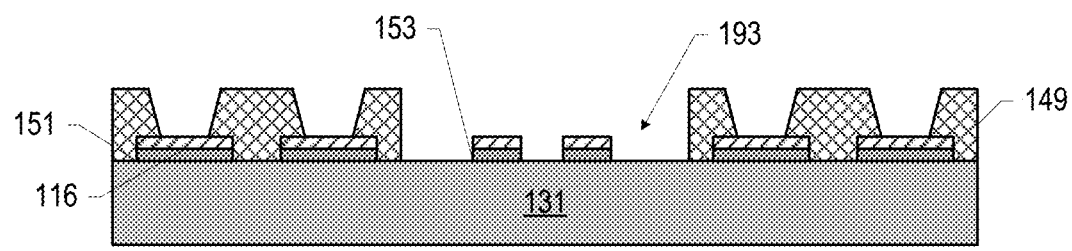

FIG. 27 illustrates an assembly subsequent to depositing and patterning the dielectric material 149 on the assembly of FIG. 26 to form an opening 193 around the conductive contacts 153 and tapered openings to expose surfaces of the conductive contacts 151. In some embodiments, the opening 193 may have a taper that is opposite to a taper of the openings exposing the conductive contacts 151 (i.e., the taper of the opening 193 may widen toward the carrier 131). As noted above, in some embodiments, the dielectric material 149 may be a solder resist material or a photoresist material, and may be deposited and patterned using any suitable known techniques (e.g., deposited by lamination).

Figure 28:
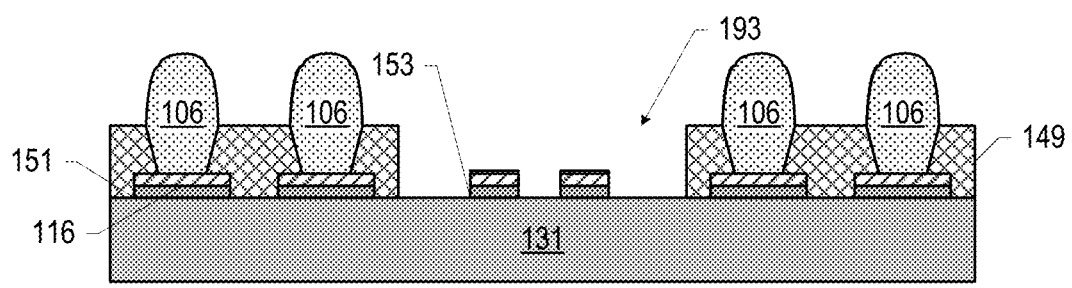

FIG. 28 illustrates an assembly subsequent to providing solder 106 on the exposed surfaces of the conductive contacts 151 of the assembly of FIG. 27. In some embodiments, the solder 106 may be provided by depositing solder balls on the exposed surfaces of the conductive contacts 151 and then performing a reflow operation.

Figure 29:
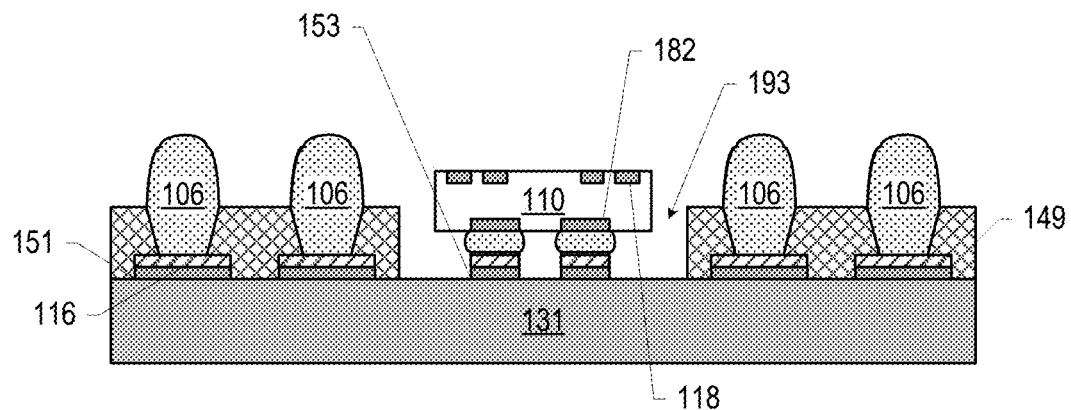

FIG. 29 illustrates an assembly subsequent to bonding a bridge component 110 to the assembly of FIG. 28 by bonding conductive contacts 182 of the bridge component 110 to the conductive contacts 153 via intervening solder 106. As the conductive contacts 153 were deposited to achieve a desired alignment of the bridge component 110, the conductive contacts 182 of the bridge component 110 may self-align to the conductive contacts 153. In some embodiments, the height of the bridge component 110 relative to the surface of the carrier 131 may be controlled by referencing the top surface of the dielectric material 149 and/or the top surface of the solder 106 on the conductive contacts 151.

Figure 30:
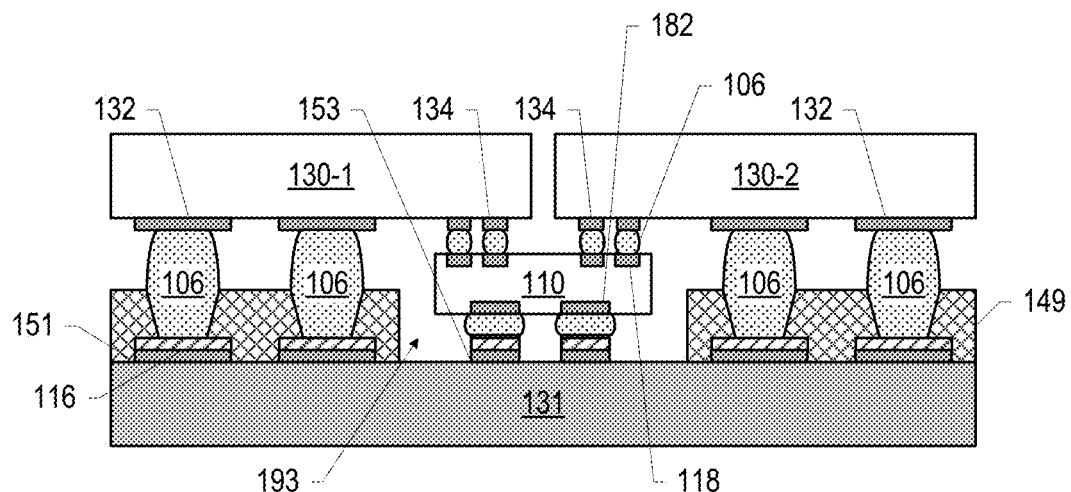

FIG. 30 illustrates an assembly subsequent to coupling microelectronic components 130 to the conductive contacts 153 and 118 of the assembly of FIG. 29 via the solder 106. In particular, the conductive contacts 132 of the microelectronic components 130 may be coupled to the conductive contacts 153, and the conductive contacts 134 of the microelectronic components 130 may be coupled to the conductive contacts 118. In some embodiments, the microelectronic components 130 may themselves include solder 106 on the conductive contacts 132, which may join with the solder 106 present on the conductive contacts 153 of the assembly of FIG. 29. Any suitable solder bonding technique may be used to form the assembly of FIG. 30. As the conductive contacts 151/153 were deposited to achieve a desired alignment of the microelectronic components 130 and the bridge component 110, the conductive contacts 132/134 of the microelectronic components 130 may self-align to the conductive contacts 151/118, respectively. Further, in embodiments in which the carrier 131 has a similar CTE as the microelectronic components 130, there may be little to no CTE mismatch between the microelectronic components 130 and the carrier 131 during bonding, further contributing to good alignment between the conductive contacts 132/134 and the conductive contacts 151/118, respectively. Although various ones of the accompanying drawings depict solder 106 in contact with only a portion of the exposed surface of a conductive contact (e.g., only a portion of the exposed surface of the conductive contacts 132 of FIG. 30), this is simply for ease of illustration, and solder 106 in contact with a conductive contact may wet the entire exposed surface of the conductive contact.

Figure 31:
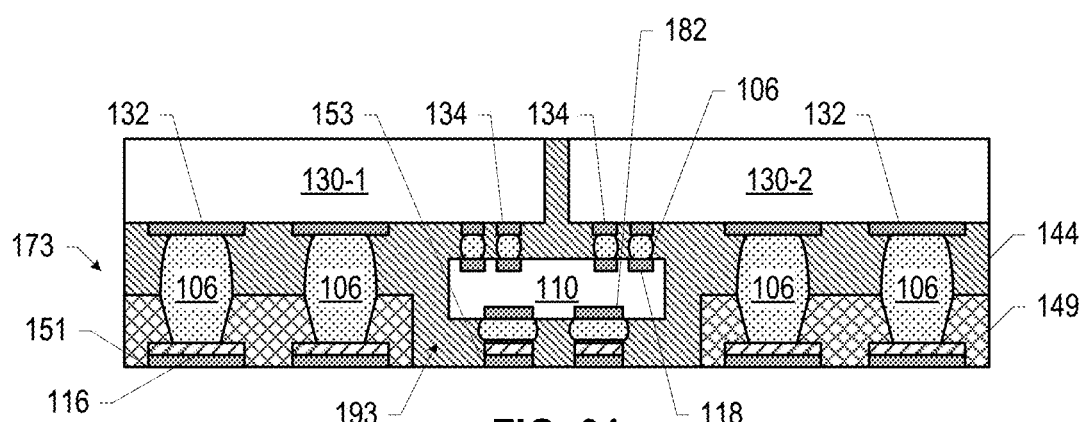

FIG. 31 illustrates an assembly subsequent to providing a mold material 144 between the microelectronic components 130 and the carrier 131 (to form the routing region 173) as well as around side faces of the microelectronic components 130 and likely over the "top" of the microelectronic components 130, and then planarizing this mold material 144 to remove excess mold material 144 and achieve a flat "top" surface, and removing the carrier 131.

Figure 32:
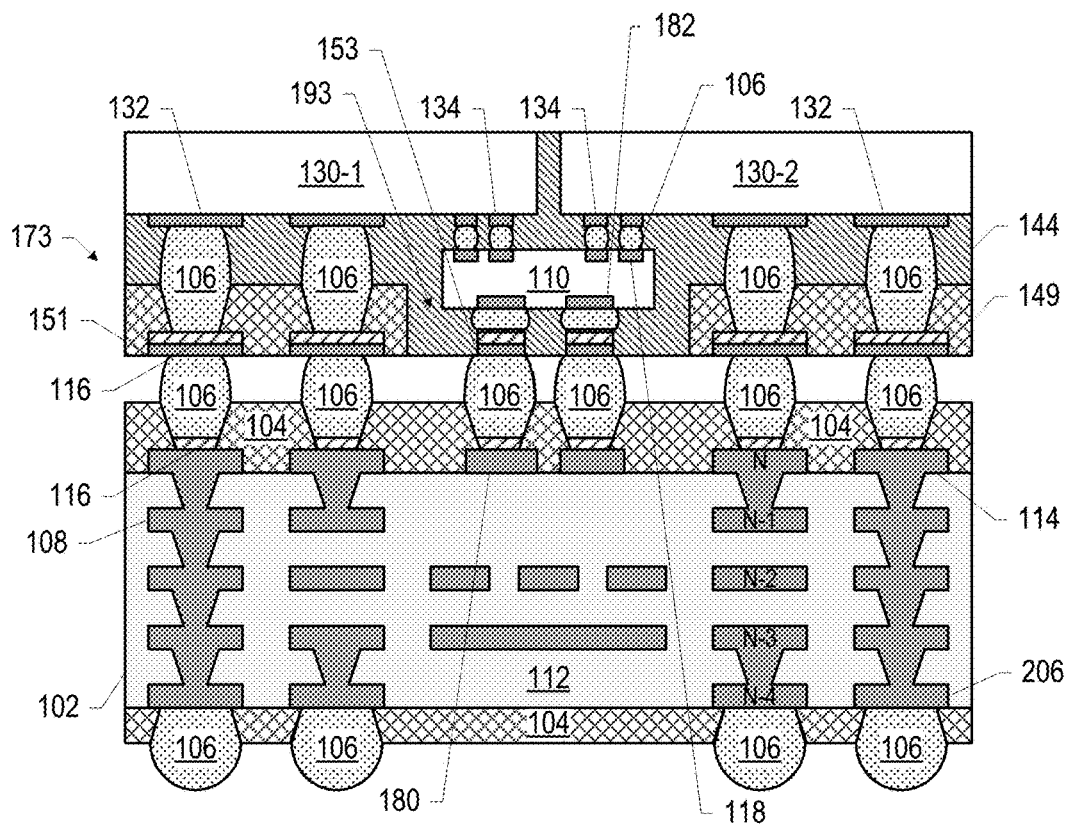

FIG. 32 illustrates an assembly subsequent to coupling the assembly of FIG. 31 to the substrate 102. In particular, the conductive contacts 151 may be bonded to the conductive contacts 114 by intervening solder 106, and the conductive contacts 153 may be bonded to the conductive contacts 180 by intervening solder 106. In some embodiments, this bonding may include a mass reflow operation.

Figure 33:
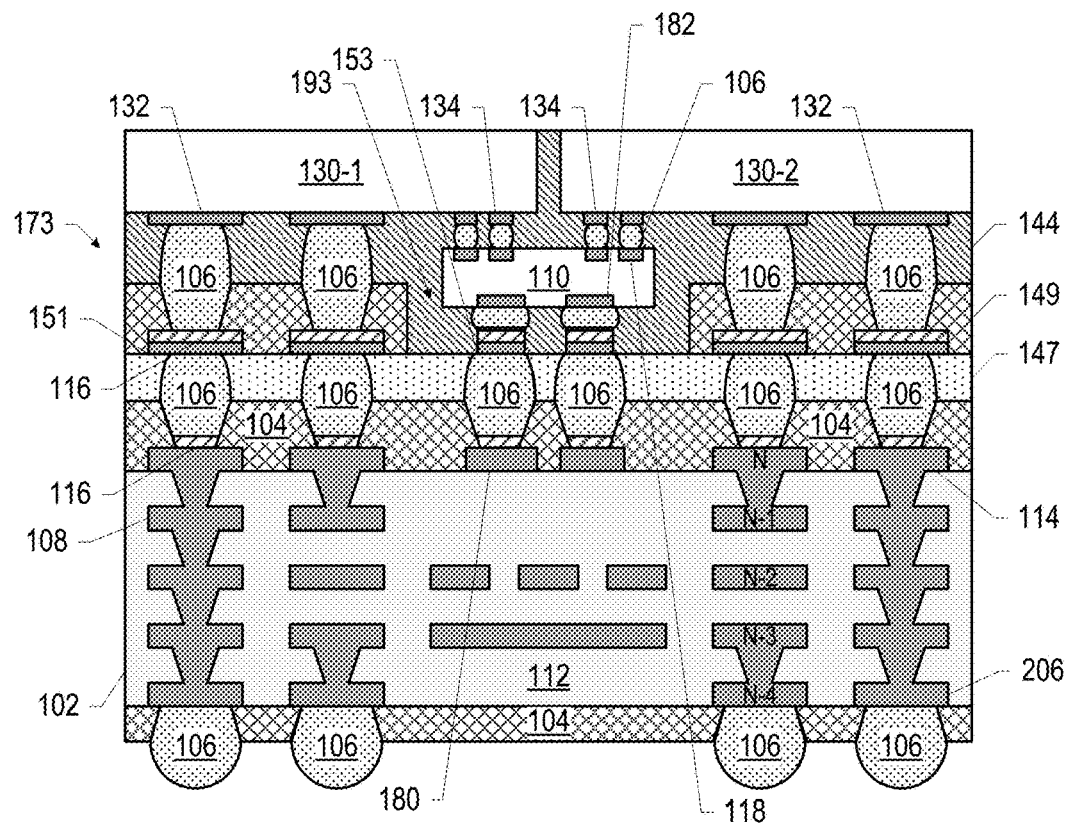

FIG. 33 illustrates an assembly subsequent to providing the underfill material 147 between the substrate 102 and the routing region 173. In some embodiments, the spacing between the substrate 102 and the routing region 173 may be at least 10 microns to permit the underfill material 147 to reach this space. The assembly of FIG. 33 may take the form of the microelectronic assembly 150 of FIG. 25. The microelectronic assembly 150 of FIG. 24 may be manufactured using a process similar to that illustrated in FIGS. 15-23, but in which the operations relating to the conductive contacts 182/153/180 may be omitted.

Figure 34:
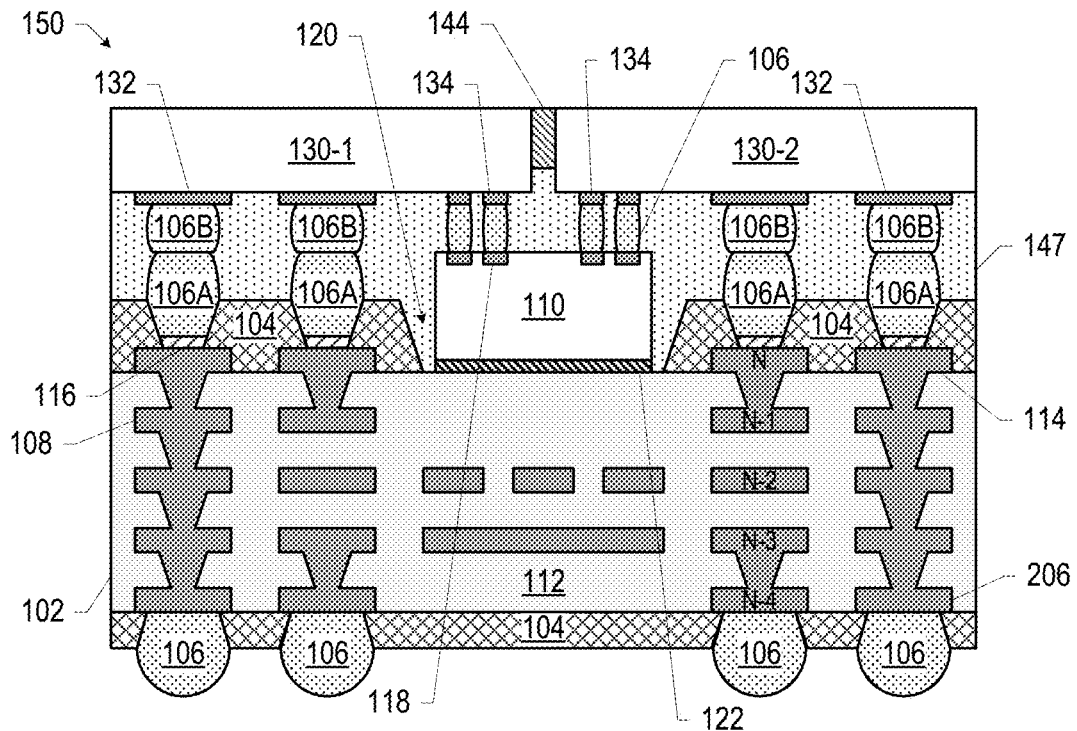
FIGS. 34-35 are side, cross-sectional views of example microelectronic assemblies, in accordance with various embodiments.
Figure 35:
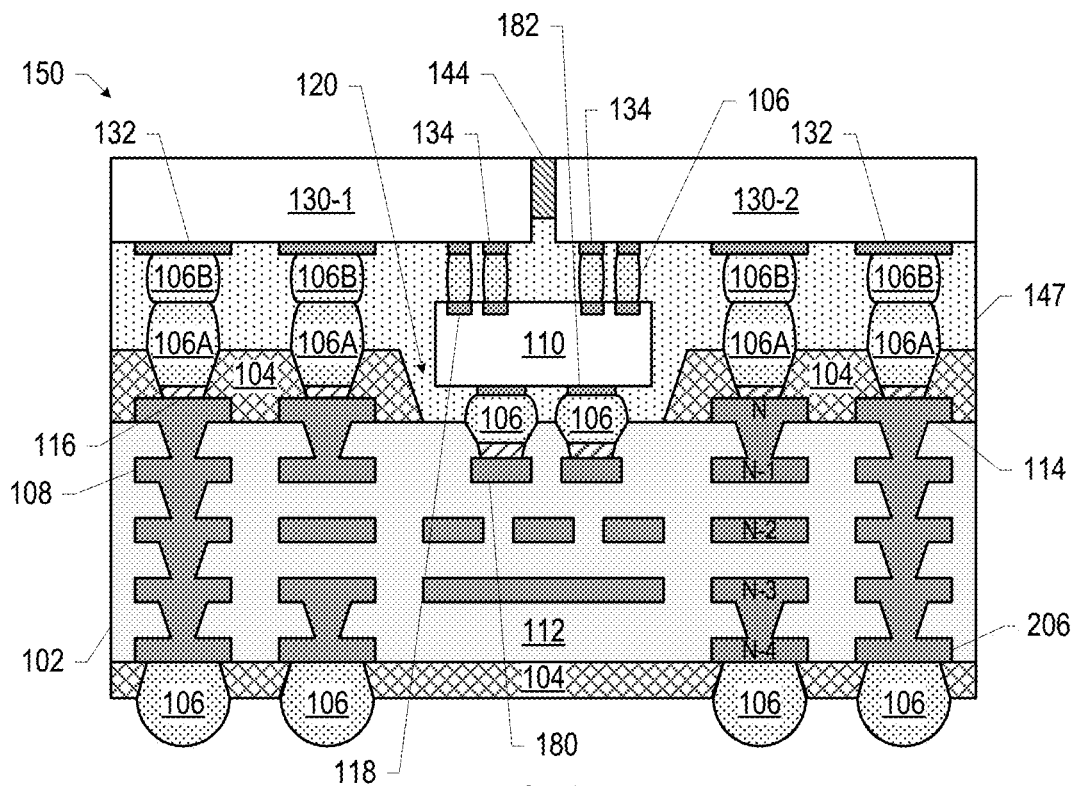
Figure 36:
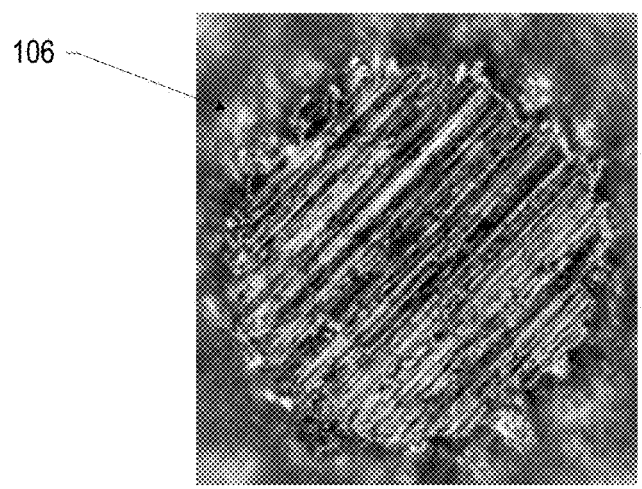
FIG. 36 is a top view of grinder marks in solder having a ground surface, in accordance with various embodiments.

In some embodiments, the distances between the substrate 102, the bridge component 110, and the microelectronic components 130 may be controlled by engineering of the solder 106 that couples the conductive contacts 132 to the conductive contacts 114. For example, in some embodiments, the solder 106 coupling a conductive contact 114 to a conductive contact 132 may include at least one portion that was processed to form an IMC and planarized before subsequent solder bonding operations, with the planarized IMC forming a reference surface for attaching the bridge component 110 and the microelectronic components 130. For example, FIGS. 34-35 are side, cross-sectional views of example microelectronic assemblies 150 including such solder portions, in accordance with various embodiments. In particular, in FIGS. 34 and 35, the solder 106 coupling the conductive contacts 114 to the conductive contacts 132 may include a first portion of solder 106A and a second portion of solder 106A, with the first portion of solder 106A between the second portion of solder 106B and the conductive contact 114. The first portion of solder 106A may have a top surface, at the interface between the first portion of solder 106A and the second portion of solder 106B, that has grinder marks resulting from a grinding or polishing operation after the first portion of solder 106A was allowed to form an IMC during manufacturing FIG. 36 is a top view of an example grinder marks at a mechanically ground surface of solder 106, in accordance with various embodiments. Even after a mechanically ground first portion of solder 106A is bonded to the second portion of solder 106B (e.g., during a reflow operation), the mechanically ground surface of the first portion of solder 106A may remain distinct. The particular embodiment illustrated in FIG. 34 includes a bridge component 110 having no "bottom" conductive contacts 182; the "bottom" face of the bridge component 110 may be coupled to the substrate 102 by an adhesive 122. The particular embodiment illustrated in FIG. 34 includes a bridge component 110 having "bottom" conductive contacts 182 coupled to conductive contacts 180 of the substrate 102, as discussed with reference to previous embodiments.

Microelectronic assemblies 150 like those illustrated in FIGS. 34 and 35 may be manufactured using any suitable techniques. For example, FIGS. 37-41 are side, cross-sectional views of various stages in an example process for the manufacture of the microelectronic assembly 150 of FIG. 35, in accordance with various embodiments.

Figure 37:
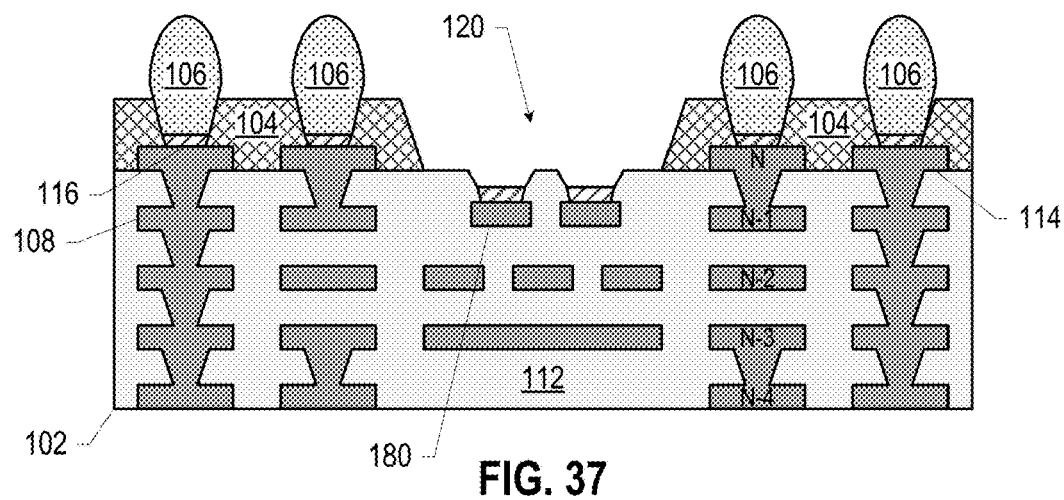
FIGS. 37-41 are side, cross-sectional views of various stages in an example process for the manufacture of the microelectronic assembly of FIG. 35, in accordance with various embodiments.

FIG. 37 illustrates an assembly including a substrate 102 on which solder 106 has been dispensed. The solder 106 may be in electrical contact with the conductive contacts 114, and may be processed to allow the solder 106 to form an IMC. In some embodiments, the solder 106 of FIG. 37 may include a sinterable paste. A sinterable paste solder 106 may have a liquid phase that include solder particles, and may be dispensed by pin dipping or stencil printing, for example. After dispense, the sinterable paste solder 106 may be subject to a reflow operation, which may transform the sinterable paste into an IMC. The IMC may be significantly mechanically harder than the initial sinterable paste, and thus may be mechanically ground with coarse, low-cost grinding technology without smearing (as would occur if the solder 106 were replaced with softer materials, such as plated solder or copper). In some embodiments, the solder 106 of the assembly of FIG. 7 may be dispensed to a height that is greater than a desired height of the first portion of solder 106A; for example, in some embodiments, the solder 106 of the assembly of FIG. 7 may be dispensed to a height between 30 microns and 40 microns.

Figure 38:
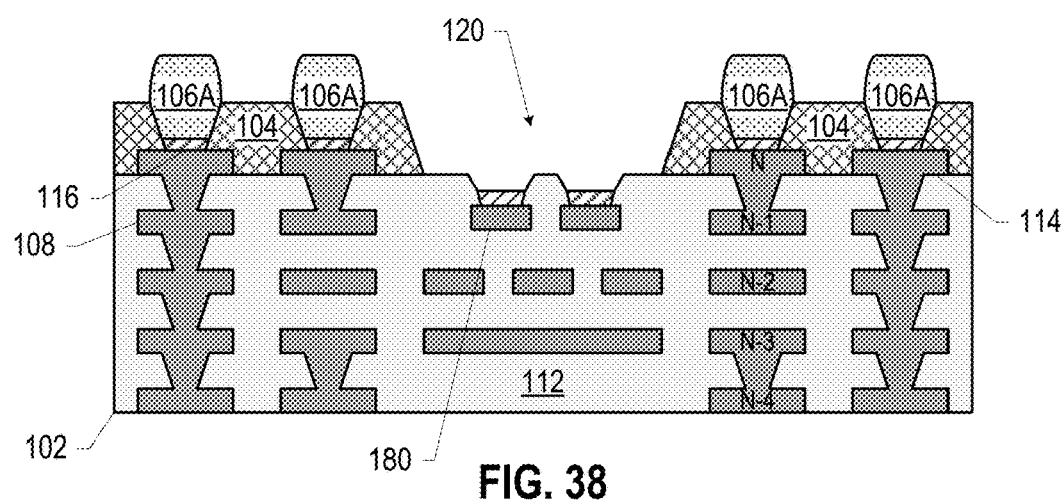

FIG. 38 illustrates an assembly subsequent to mechanically grinding the solder 106 of the assembly of FIG. 37 to form the first portions of solder 106A having coplanar top surfaces. The top surfaces of the first portions of solder 106A may include grinding marks, like those illustrated in FIG. 36. The hard IMC of the solder 106 may facilitate this grinding without smearing, and may enable the use of the top surfaces of the solder 106 as a reference plane when attaching the bridge component 110. In some embodiments, the grinding operation may remove between 10 microns and 20 microns of the solder 106, leaving a first portion of solder 106A having a height between 20 microns and 50 microns (e.g., between 20 microns and 40 microns, or between 30 microns and 40 microns).

Figure 39:
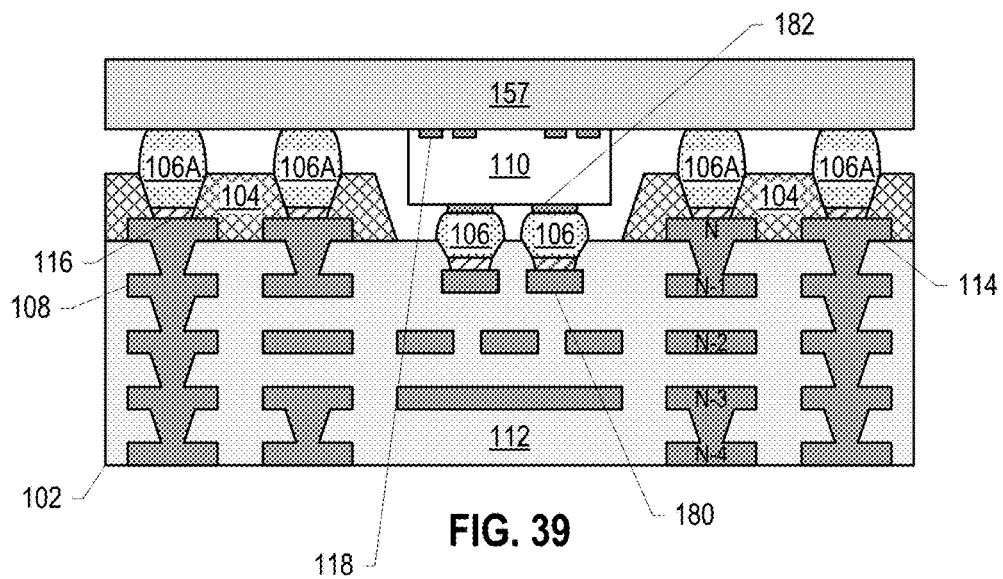
Figure 40:
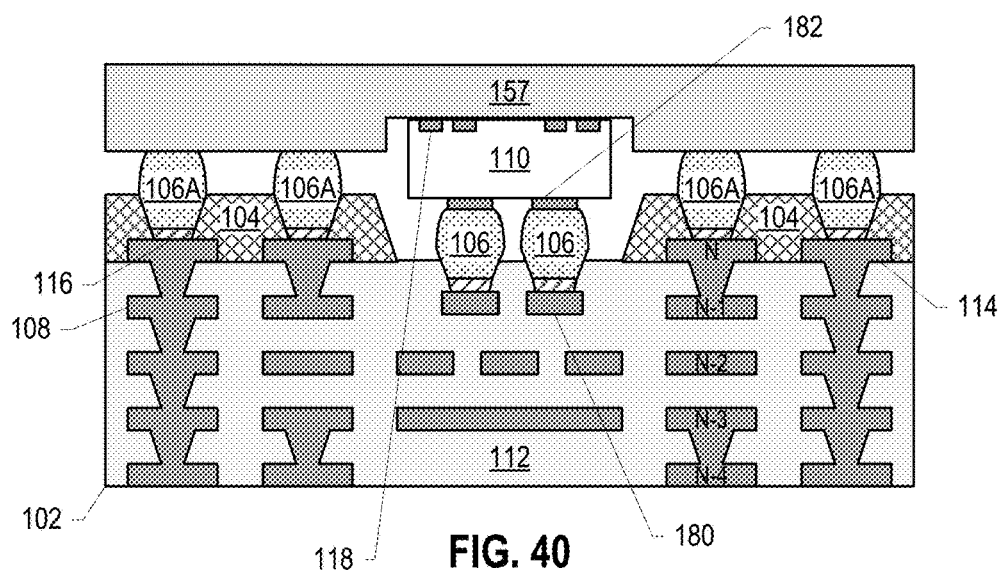
Figure 41:
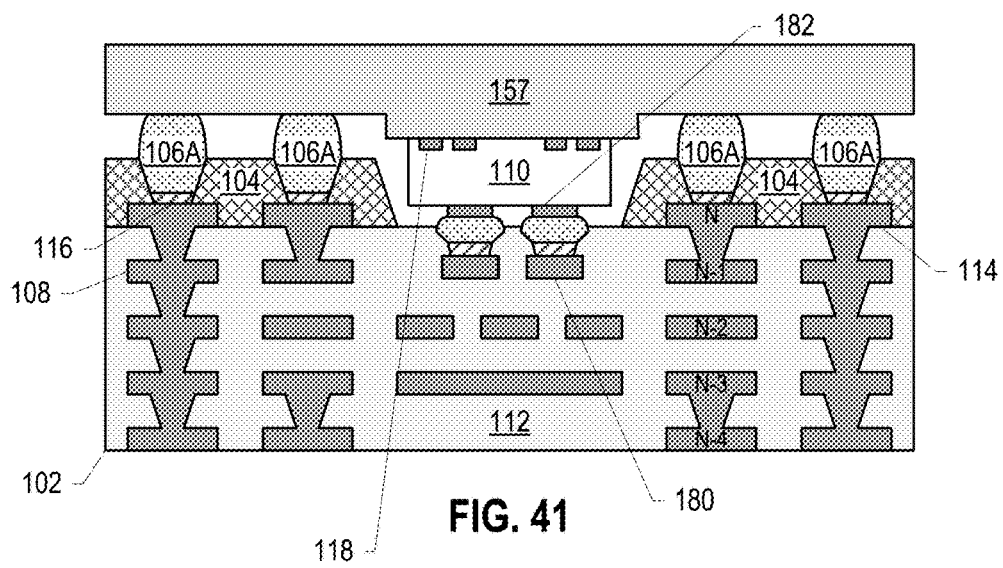

FIG. 39 illustrates an assembly subsequent to coupling the bridge component 110 to the assembly of FIG. 38 by using a bonding nozzle 157 to bring the bridge component 110 into place before reflowing solder between the conductive contacts 182 and the conductive contacts 180. As shown, the bonding nozzle 157 may rest on the mechanically ground top surfaces of the first portions of solder 106A, providing a reference plane for the alignment of the bridge component 110 relative to the substrate 102. As shown in FIG. 39, in some embodiments, the top surface of the bridge component 110 may be coplanar with the mechanically ground top surfaces of the first portions of solder 106A, but this need not be the case, and a bonding nozzle 157 may use the mechanically ground top surfaces of the first portions of solder 106A as a reference when it is desired for the top surface of the bridge component 110 to be above the plane of the mechanically ground top surfaces of the first portions of solder 106A (e.g., as illustrated in FIG. 40) or when it is desired for the top surface of the bridge component 110 to be below the plane of the mechanically ground top surfaces of the first portions of solder 106A (e.g., as illustrated in FIG. 41). After attaching the bridge component 110 to the substrate 102 to form the assembly of any of FIGS. 39-41, the microelectronic components 130 may be bonded to the assembly using second portions of solder 106 B, resulting in the microelectronic assembly 150 of FIG. 35. The microelectronic assembly 150 of FIG. 34 may be manufactured using a process similar to that illustrated in FIGS. 36-41, but in which the height of adhesive 122 between the bridge component 110 and the substrate 102 is controlled using the mechanically ground top surfaces of the first portions of solder 106A as a reference plane.

In some embodiments, the second portions of solder 106 B may be low-temperature solders including tin and silver and copper, pure tin, tin and copper, or other suitable mixtures. Because the first portions of solder 106A have formed an IMC before the reflow of the second portions of solder 106B, the first portions of solder 106A may retain their form during the reflow of the second portions of solder 106B. In some alternate embodiments, the bridge component 110 may be placed in the cavity 120 before the solder 106 is initially deposited on the conductive contacts 114, and the solder 106 may be initially deposited on the conductive contacts 114 and on the conductive contacts 118 of the bridge component 110; this solder 106 may be allowed to form an IMC, and then may be mechanically ground to planarize the solder 106 before attaching the microelectronic components 130. In such embodiments, the solder 106 between the conductive contacts 118 of the bridge component 110 and the conductive contacts 134 of the microelectronic components 130 may also include a first portion of solder 106A having a mechanically ground top surface, and a second portion of solder 106 B.

In some embodiments, the geometry of the conductive contacts 180 and 182, and/or the geometry of the conductive contacts 118 and 134, may be selected to improve alignment between the substrate 102, the bridge component 110, and the microelectronic components 130 in a microelectronic assembly 150. For example, the "under bridge" conductive contacts 180 and 182, and the solder 106 that couples them, may be constructed with higher solder volume and smaller conductive contact diameters so that forces from the solder 106 push the bridge component 110 "up," but do not exert significant lateral force on the bridge component 110 (e.g., the bridge component 110 is able to "slide" laterally); such an arrangement may help counter the "downward" force on the bridge component 110 exerted by the microelectronic components 130. The "above bridge" conductive contacts 118 and 134 may be configured so that the conductive contacts 134 have smaller diameters on the conductive contacts 118, and the solder 106 joining the conductive contacts 118 and the conductive contacts 134 may have adequate volume so as to extend onto side faces of the conductive contacts 134; such an arrangement may allow the bridge component 110 to "float" in the lateral direction to achieve self-alignment between the conductive contacts 134 and the conductive contacts 118, without exerting significant downward force on the bridge component 110. Such arrangements may help overcome the misalignment that commonly occurs during fabrication due to manufacturing tolerances and different patterning operations forming different elements of a microelectronic assembly 150.

Figure 42:
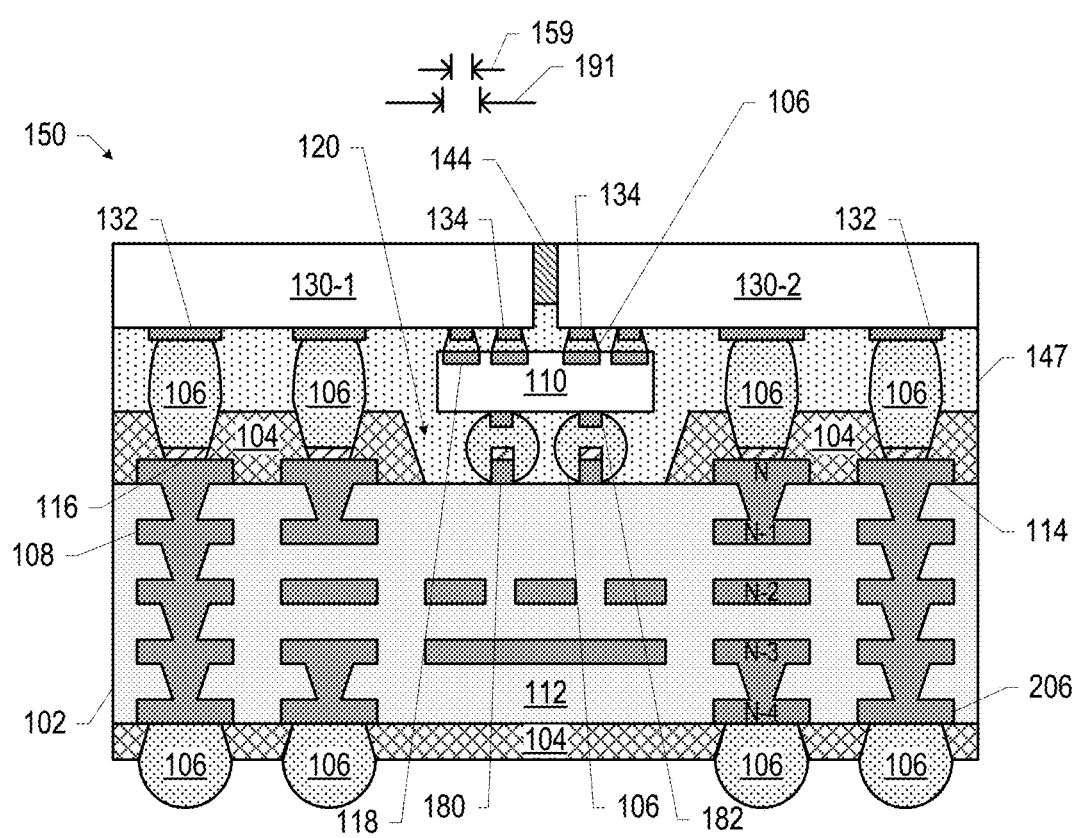
FIGS. 42-44 are side, cross-sectional views of example microelectronic assemblies, in accordance with various embodiments.

FIG. 42 illustrates a microelectronic assembly 150 including such arrangements of the conductive contacts 180/182 and the conductive contacts 118/134. As illustrated in FIG. 42, the diameter 159 of the conductive contacts 134 may be less than the diameter 191 of the conductive contacts 118. In some embodiments, the diameter 159 may be less than 60% of the diameter 191 (e.g., less than 50% of the diameter 191). In some embodiments, the diameter 159 of the conductive contacts 134 may be between 20 microns and 35 microns, and the diameter 191 of the conductive contacts 118 may be between 40 microns and 75 microns. The volume of the solder 106 between the conductive contacts 134 and the conductive contacts 118 may be selected to be large enough to allow the solder 106 to extend up onto side faces of the conductive contacts 134, as shown. In some embodiments, the relative diameters of the conductive contacts 134 and the conductive contacts 118 may be reversed; in particular, the diameter 159 of the conductive contacts 134 may be greater than the diameter 191 of the conductive contacts 118. In some embodiments, the diameter 191 may be less than 60% of the diameter 159 (e.g., less than 50% of the diameter 159). In some embodiments, the diameter 191 of the conductive contacts 118 may be between 20 microns and 35 microns, and the diameter 159 of the conductive contacts 134 may be between 40 microns and 75 microns. In some embodiments, the diameter 159 may be approximately equal to the diameter 191. In some embodiments, regardless of the relative diameters of the conductive contacts 118 and the conductive contacts 134, one or more of the conductive contacts 134 may contact the associated conductive contacts 118 directly; when this occurs, the solder 106 associated with a contacting pair of conductive contacts 118/134 may not contact the solder 106 associated with any adjacent pairs of conductive contacts 118/134.

As also illustrated in FIG. 42, the volume of solder 106 coupling the conductive contacts 182 to the conductive contacts 180 may be such that the diameter of the solder 106 is greater than a diameters of the conductive contacts 182/180. In particular, the solder 106 may extend onto side faces of the conductive contacts 182/180. To accommodate such large volumes of solder, the pitch of the conductive contacts 182/180 may be greater than the pitch of the conductive contacts 134/118, in some embodiments. In some particular embodiments, the diameters of the conductive contacts 182/180 may be between 10 microns and 40 microns (e.g., between 15 microns and 25 microns). In some embodiments, the surface finish 116 may extend onto side faces of the conductive contacts 180 (not shown). Any of the arrangements of the conductive contacts 182/180 (and the solder 106 between them) and/or the conductive contacts 134/118 (and the solder 106 between them) discussed herein with reference to FIG. 42 may be utilized in any appropriate ones of the microelectronic assemblies 150 disclosed herein.

Figure 43:
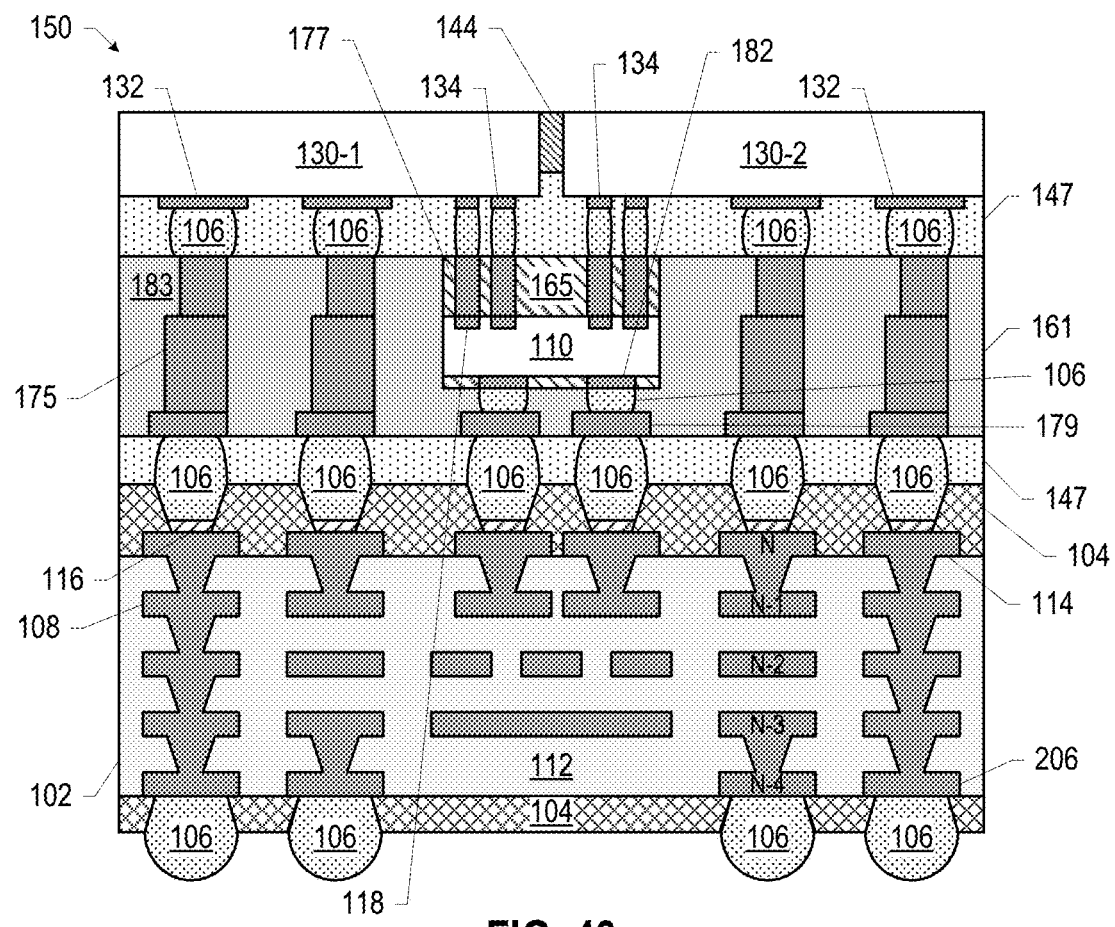
Figure 44:
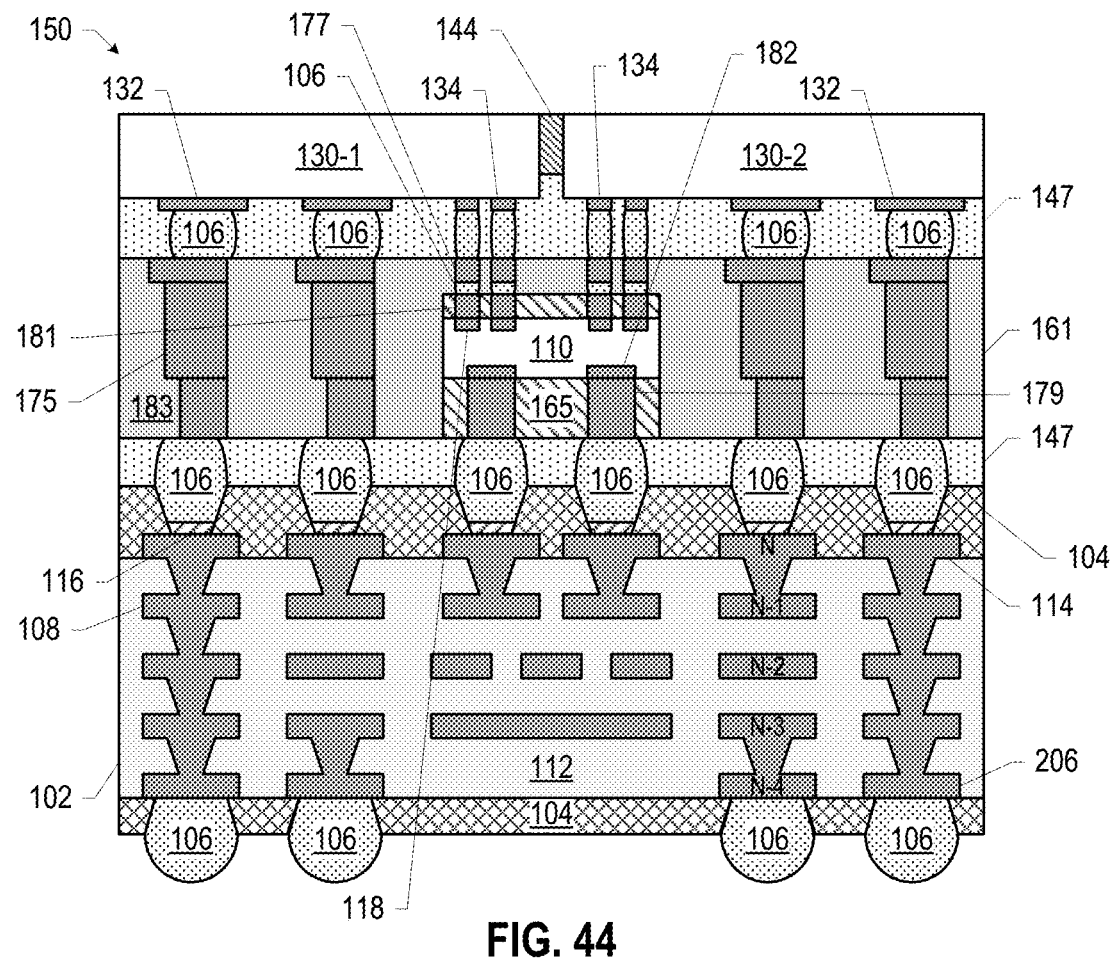

In some embodiments, a bridge component 110 may not be part of a substrate 102, but may instead be included in a patch structure between the substrate 102 and the microelectronic components 130. For example, FIGS. 43-44 are side, cross-sectional views of example microelectronic assemblies 150 including patch structures 161, in accordance with various embodiments. The patch structure 161 may include the bridge component 110, which may have mold material 165 at its "top" face and/or its "bottom" face, and may be conductively coupled to the "top" face and the "bottom" face of the patch structure 161, as discussed further below. The patch structure 161 may also include stacks of conductive pillars 175, which may provide conductive pathways between the "top" face and the "bottom" face of the patch structure 161 such that the conductive contacts 118 of the bridge component 110 may be conductively coupled to the conductive contacts 134 of the microelectronic components 130 (via intervening solder 106 and other structures, discussed below) and the conductive contacts 182 of the bridge component 110 may be conductively coupled to the conductive contacts 180 of the substrate 102 (via intervening solder 106 and other structures, discussed below). In particular, a stack of conductive pillars 175 may be coupled at the "top" face of the patch structure 161 to the conductive contacts 132 of the microelectronic components 130 via intervening solder 106, and at the "bottom" face of the patch structure 161 to the conductive contacts 114 of the substrate 102 via intervening solder 106. Underfill material 147 may be disposed between the substrate 102 and the patch structure 161, as well as between the patch structure 161 and the microelectronic components 130. Various ones of the conductive pillars of the patch structure 161 may extend through a mold material 183, and the conductive pillars may include any suitable materials (e.g., copper).

In the embodiment of FIG. 43, the conductive pillars 175 may be arranged in decreasing diameter in the direction from the substrate 102 to the microelectronic components 130. The conductive contacts 182 of the bridge component 110 may be coupled to conductive pillars 179 at the "bottom" face of the patch component 161 by solder 106, and the conductive contacts 118 of the bridge component 110 may be in contact with conductive pillars 177 at the "top" face of the patch component 161. In the embodiment of FIG. 44, the conductive pillars 175 may be arranged in increasing diameter in the direction from the substrate 102 to the microelectronic components 130; a stack of conductive pillars 175 may include one conductive pillar 175, or more than two conductive pillars 175, in various embodiments. The conductive contacts 182 of the bridge component 110 may be in contact with conductive pillars 179 at the "bottom" face of the patch component 161, the conductive contacts 118 of the bridge component 110 may be in contact with conductive pillars 181, and the conductive pillars 181 may be coupled to conductive pillars 177 at the "top" face of the patch component 161 by intervening solder 106. As shown in FIGS. 43 and 44, the conductive pillars 179 of the patch structure 161 may be coupled to the conductive contacts 114 of the substrate 102 by intervening solder 106, and the conductive pillars 177 of the patch structure 161 may be coupled to the conductive contacts 134 of the microelectronic components 130 by intervening solder 106.

The microelectronic assemblies 150 of FIGS. 43 and 44 may represent a decoupling between the substrate 102 and the bridge component 110. The microelectronic assembly 150 of FIG. 44 may further enable self-alignment of the bridge component 110 to the tighter pitch conductive pillars 177 (relative to the looser pitch conductive pillars 179) during manufacturing, potentially improving yield.

FIGS. 45-52 are side, cross-sectional views of various stages in an example process for the manufacture of the microelectronic assembly 150 of FIG. 44, in accordance with various embodiments.

Figure 45:
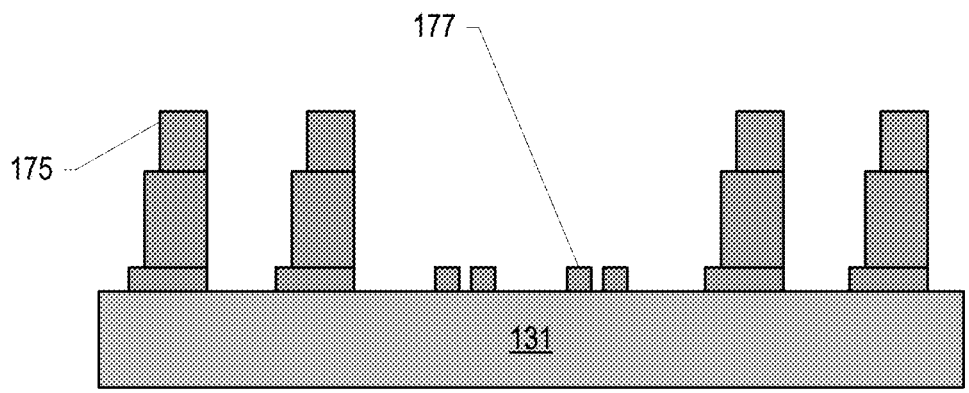
FIGS. 45-52 are side, cross-sectional views of various stages in an example process for the manufacture of the microelectronic assembly of FIG. 44, in accordance with various embodiments.

FIG. 45 illustrates an assembly including conductive pillars 175 and 177 on a carrier 131. In some embodiments, the carrier 131 may include glass. In some embodiments, the conductive pillars 175 and 177 may be plated on to the carrier 131, with the number of plating operations depending upon the number of pillars in a stack (e.g., three operations to form the conductive pillars 175 of the assembly of FIG. 45). As shown in FIG. 45, the diameter of the conductive pillars 175 formed in subsequent plating operations may decrease relative to previous plating operations.

Figure 46:
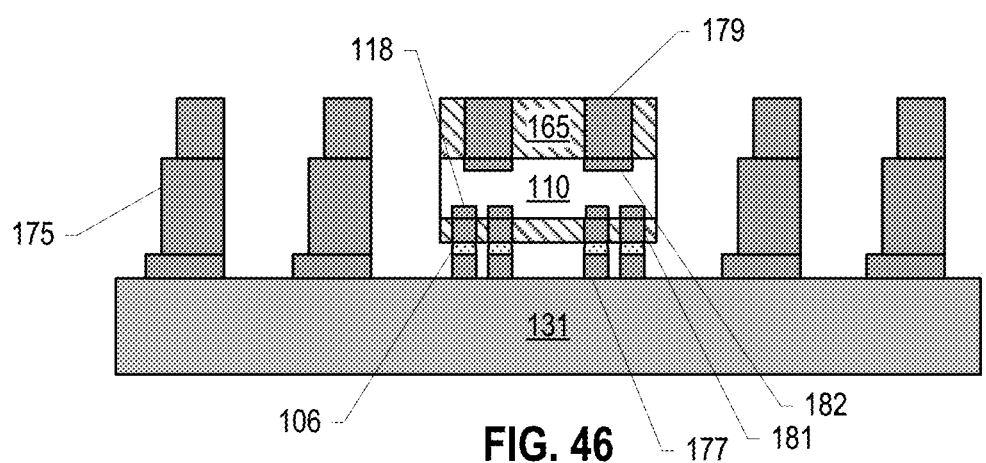

FIG. 46 illustrates an assembly subsequent to coupling the bridge component 110 to the assembly of FIG. 45. The bridge component 110 may have previously been augmented with conductive pillars 179 in contact with the conductive contacts 182 and extending through a mold material 165, as well as with conductive pillars 181 in contact with the conductive contacts 118 and extending through the mold material 165; as shown in FIG. 46, the conductive pillars 181 may be coupled to the conductive pillars 177 by intervening solder 106. The coupling between the conductive pillars 181 and the conductive pillars 177 may be the tightest pitch interconnects that will be made to the patch structure 161, and forming them at this stage in manufacturing allows the conductive pillars 181 and the conductive pillars 177 to self-align or to otherwise achieve minimal misalignment.

Figure 47:
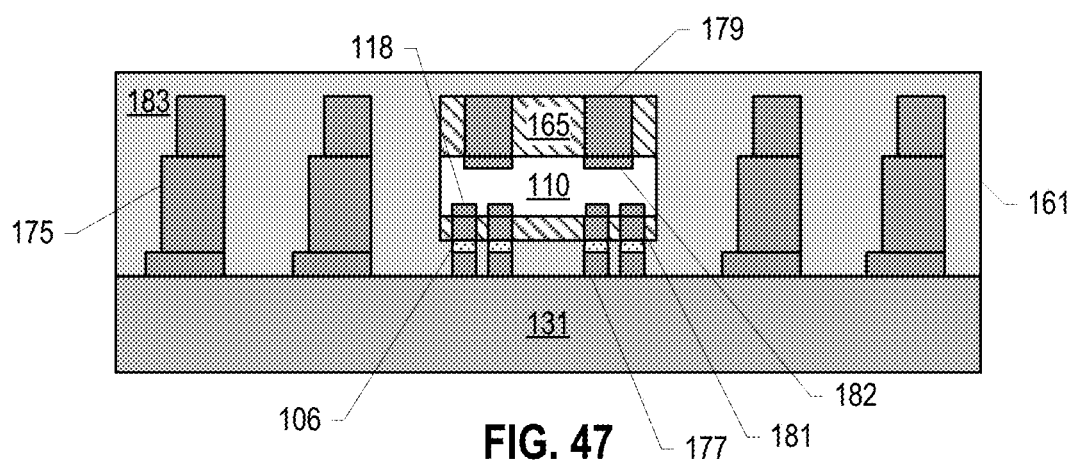

FIG. 47 illustrates an assembly subsequent to providing a mold material 183 on the carrier 131 and around the structures of the assembly of FIG. 46.

Figure 48:
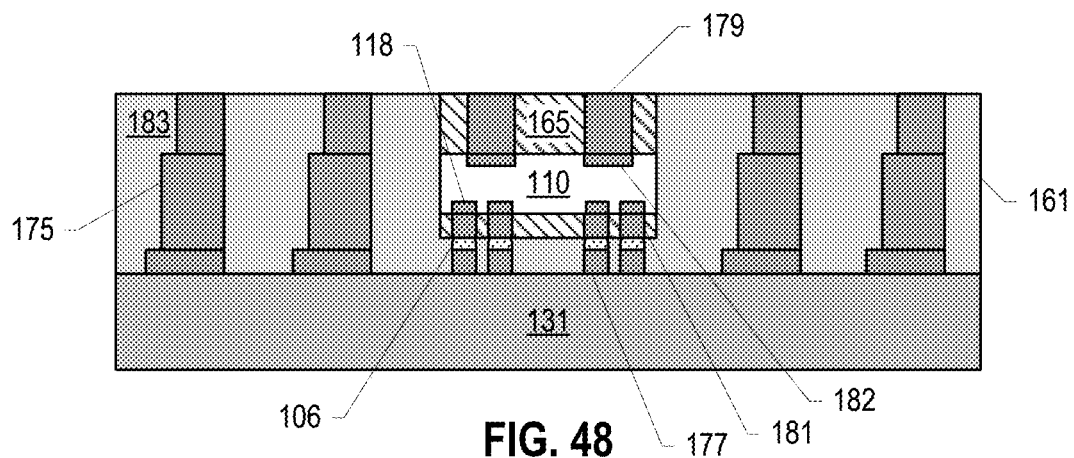

FIG. 48 illustrates an assembly subsequent to grinding back the overburden of the mold material 183 of the assembly of FIG. 47 to expose the conductive pillars 175 and the conductive pillars 179.

Figure 49:
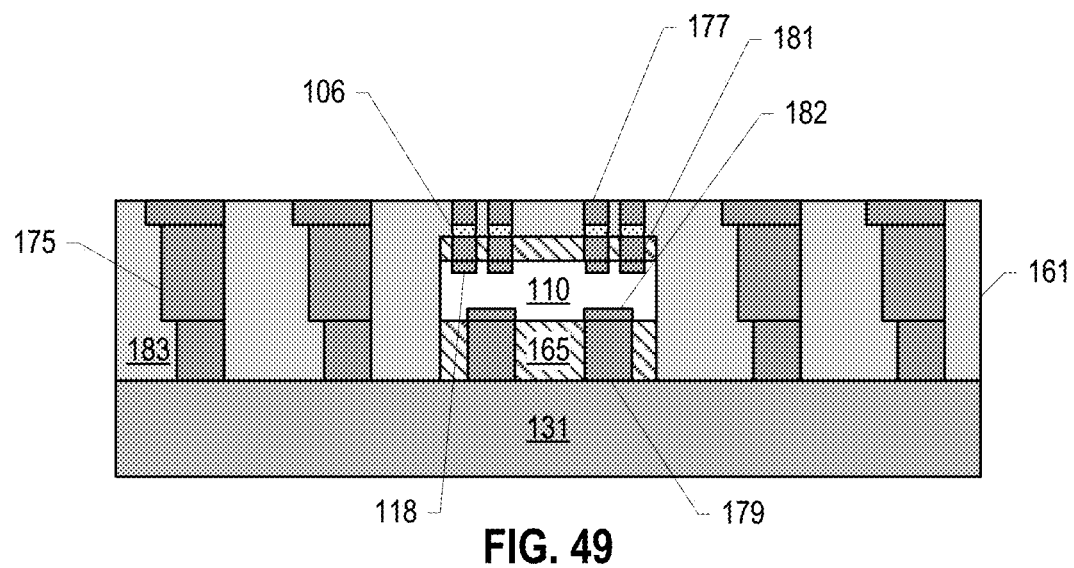

FIG. 49 illustrates an assembly subsequent to removing the carrier 131 from the assembly of FIG. 48, "flipping" the result, and attaching it to another carrier 131 to expose the conductive pillars 177. In some embodiments, the carrier 131 of the assembly of FIG. 49 may include glass.

Figure 50:
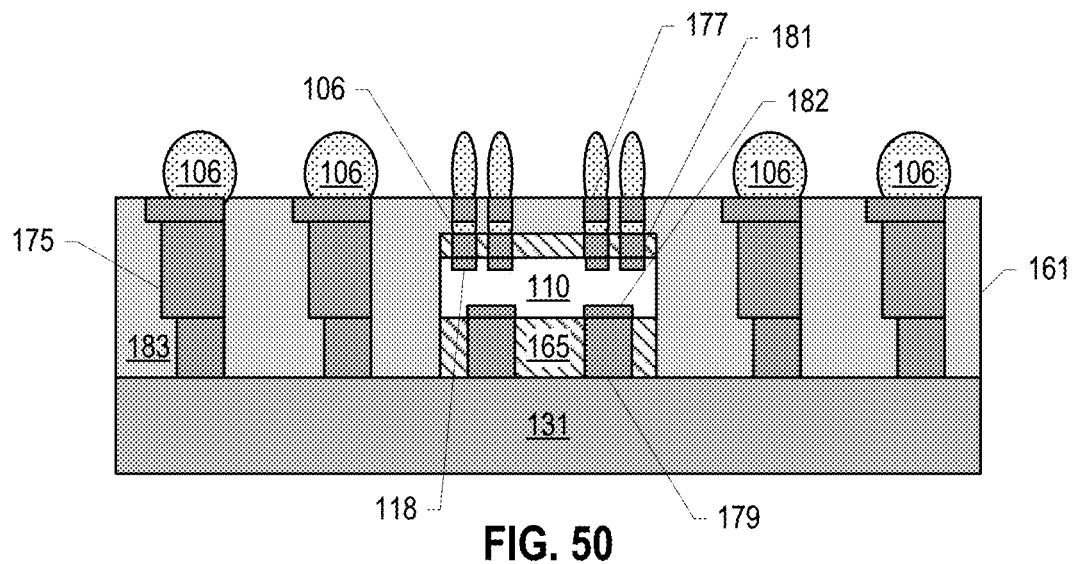

FIG. 50 illustrates an assembly subsequent to providing solder 106 on the exposed conductive pillars 175 and 177 of the assembly of FIG. 49. In some embodiments, the solder 106 may be plated on to the assembly of FIG. 49.

Figure 51:
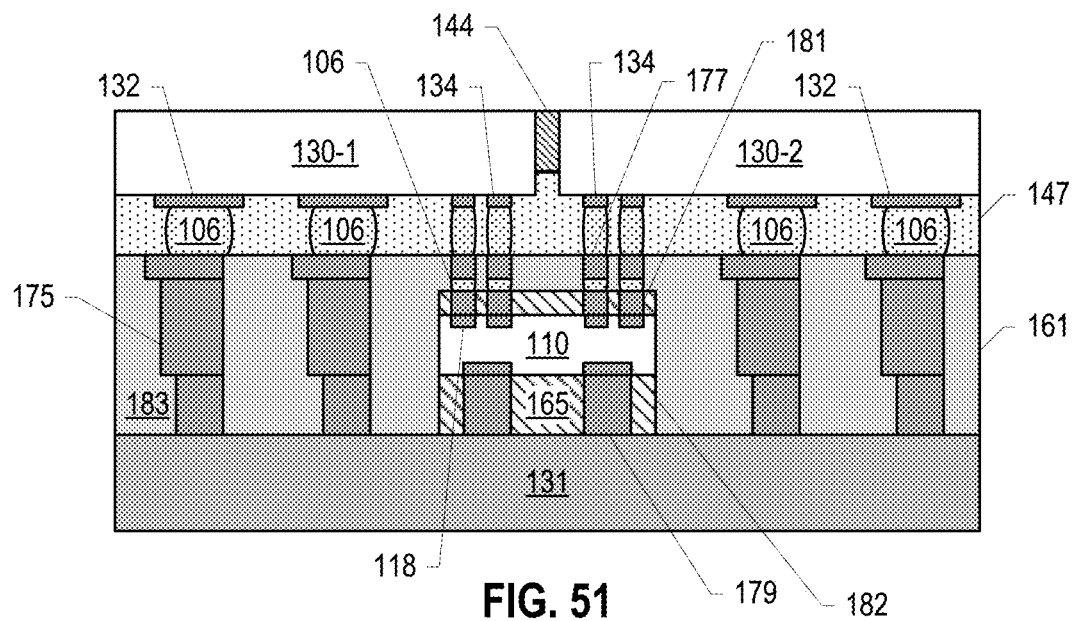

FIG. 51 illustrates an assembly subsequent to bonding the microelectronic components 130 to the conductive pillars 175 and 177 of the assembly of FIG. 49 via the intervening solder 106, and providing a mold material 144 (e.g., an over mold material) and an underfill material 147, as shown.

Figure 52:
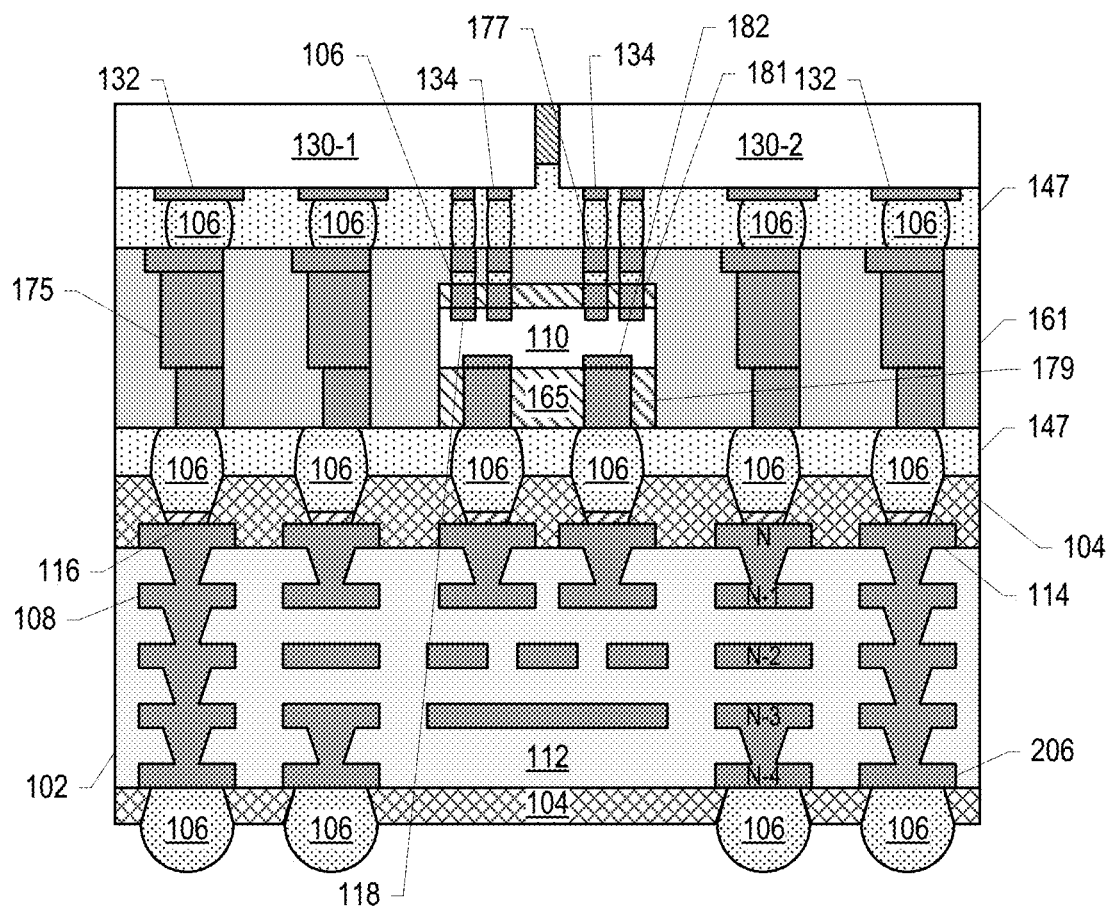

FIG. 52 illustrates an assembly subsequent to removing the carrier 131 from the assembly of FIG. 51, bonding the result to a substrate 102 via solder 106, and providing an underfill material 147 between the patch structure 161 and the substrate 102. The assembly of FIG. 52 may take the form of the microelectronic assembly 150 of FIG. 44.

Figure 53:
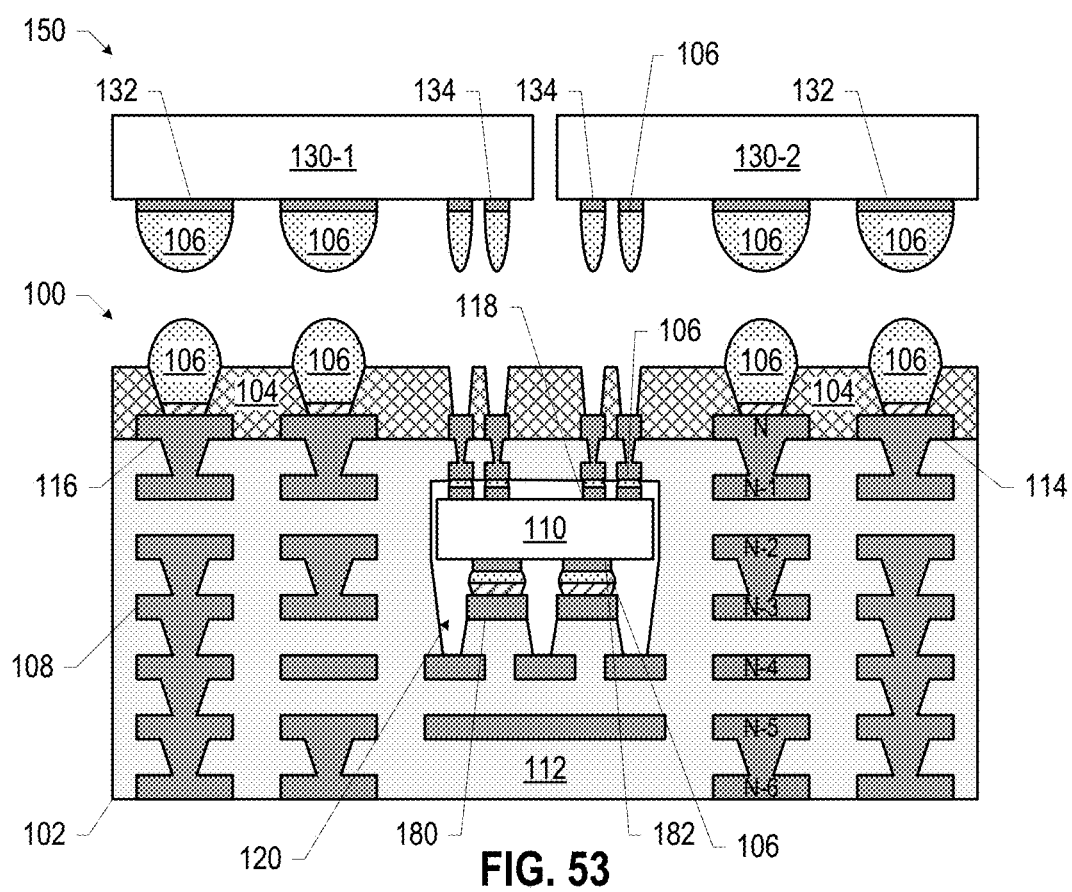
FIG. 53 is a side, cross-sectional, exploded view of an example microelectronic assembly, in accordance with various embodiments.

Although various ones of the embodiments disclosed herein have been illustrated for embodiments in which the conductive contacts 118 at the "top" face of the bridge component 110 are exposed in the microelectronic structure 100 (i.e., an "open cavity" arrangement), any suitable ones of the embodiments disclosed herein may be utilized in embodiments in which additional layers of the substrate 102 are built up over the bridge component 110, enclosing the bridge component 110 (i.e., an "embedded" arrangement). For example, FIG. 53 illustrates a microelectronic assembly 150 having a number of features in common with various ones of the embodiments disclosed herein, but in which additional dielectric material 112 and metal layers are disposed "above" the bridge component 110. As shown in FIG. 53, conductive pads and vias through this "additional" material may be used to allow microelectronic components 130 to conductively couple to the conductive contacts 118 via the intervening material of the substrate 102. Similarly, any suitable ones of the embodiments disclosed herein may be utilized in such an embedded arrangement.

The microelectronic structures 100 and microelectronic assemblies 150 disclosed herein may be included in any suitable electronic component. FIGS. 54-57 illustrate various examples of apparatuses that may include any of the microelectronic structures 100 and microelectronic assemblies 150 disclosed herein, or may be included in microelectronic structures 100 and microelectronic assemblies 150 disclosed herein, as appropriate.

Figure 54:
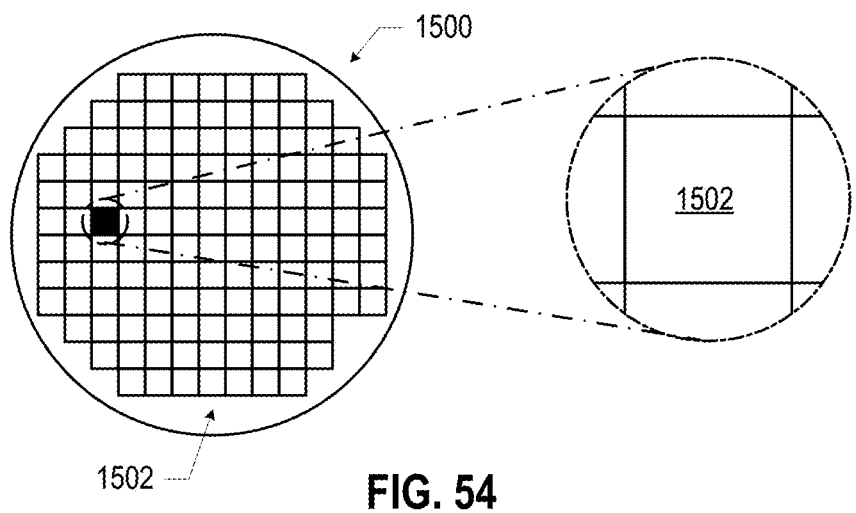
FIG. 54 is a top view of a wafer and dies that may be included in a microelectronic structure or microelectronic assembly in accordance with any of the embodiments disclosed herein.

FIG. 54 is a top view of a wafer 1500 and dies 1502 that may be included in any of the microelectronic structures 100 and microelectronic assemblies 150 disclosed herein. For example, a die 1502 may be included in a microelectronic structure 100/microelectronic assembly 150 as (or part of) a bridge component 110 and/or a microelectronic component 130. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 55, discussed below), one or more diodes, and/or supporting circuitry to route electrical signals to the transistors, as well as any other IC components. In some embodiments, a die 1502 may be a "passive" die in that it includes no active components (e.g., transistors), while in other embodiments, a die 1502 may be an "active" die in that it includes active components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 57) or other logic that is configured to store information in the memory devices or execute instructions stored in the memory array.

Figure 55:
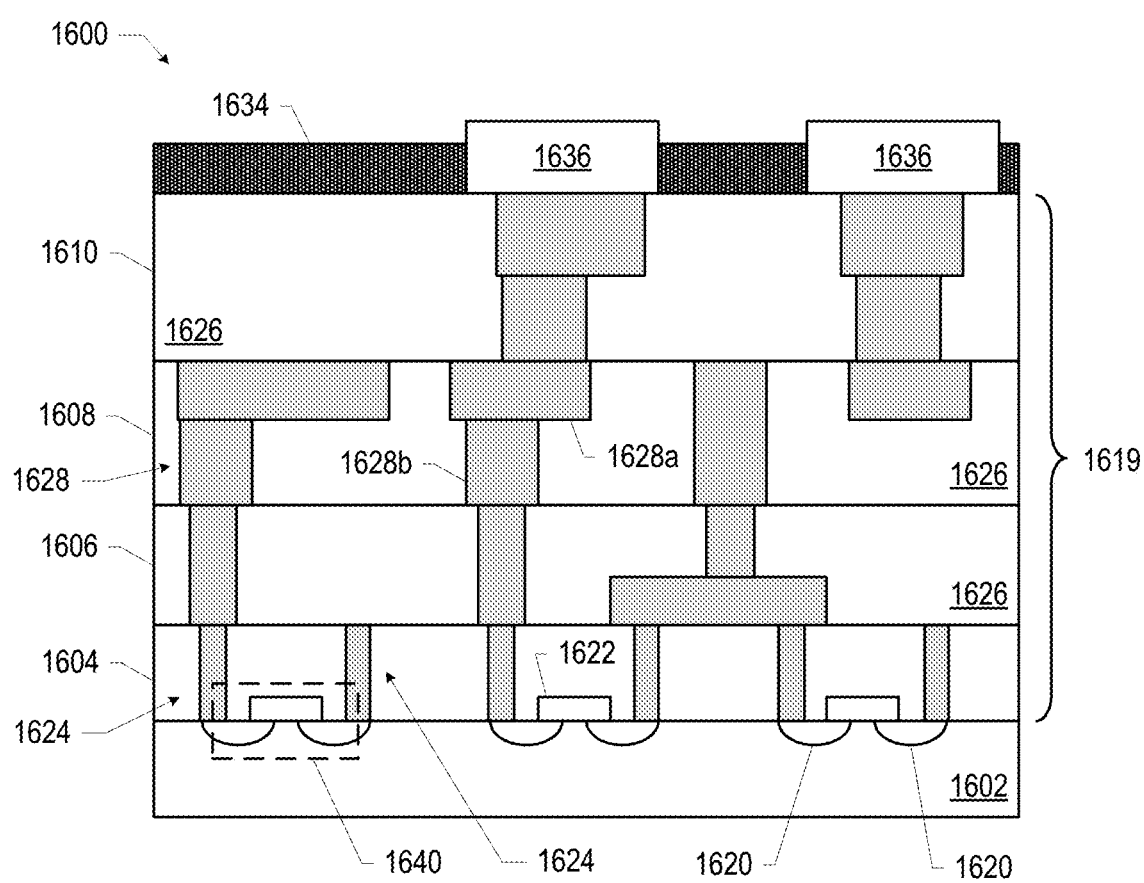
FIG. 55 is a side, cross-sectional view of an integrated circuit (IC) device that may include be included in a microelectronic structure or microelectronic assembly in accordance with any of the embodiments disclosed herein.

FIG. 55 is a side, cross-sectional view of an IC device 1600 that may be included in a microelectronic structure 100 and/or a microelectronic assembly 150. For example, an IC device 1600 may be included in a microelectronic structure 100/microelectronic assembly 150 as (or part of) a bridge component 110 and/or a microelectronic component 130. An IC device 1600 may be part of a die 1502 (e.g., as discussed above with reference to FIG. 54). One or more of the IC devices 1600 may be included in one or more dies 1502 (FIG. 54). The IC device 1600 may be formed on a substrate 1602 (e.g., the wafer 1500 of FIG. 54) and may be included in a die (e.g., the die 1502 of FIG. 54). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 54) or a wafer (e.g., the wafer 1500 of FIG. 54).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 55 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or I/O signals, may be routed to and/or from the devices (e.g., the transistors 1640) of the device layer 1604 through one or more interconnect layers disposed on the device layer 1604 (illustrated in FIG. 55 as interconnect layers 1606-1610). For example, electrically conductive features of the device layer 1604

(e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, an IC device 1600 may be a "passive" device in that it includes no active components (e.g., transistors), while in other embodiments, a die 1502 may be an "active" die in that it includes active components.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 55). Although a particular number of interconnect layers 1606-1610 is depicted in FIG. 55, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 55. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 55. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a surface insulation material 1634 (e.g., polyimide or similar material) and one or more conductive contacts 1636 formed on the interconnect layers 1606-1610. In FIG. 55, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 56:
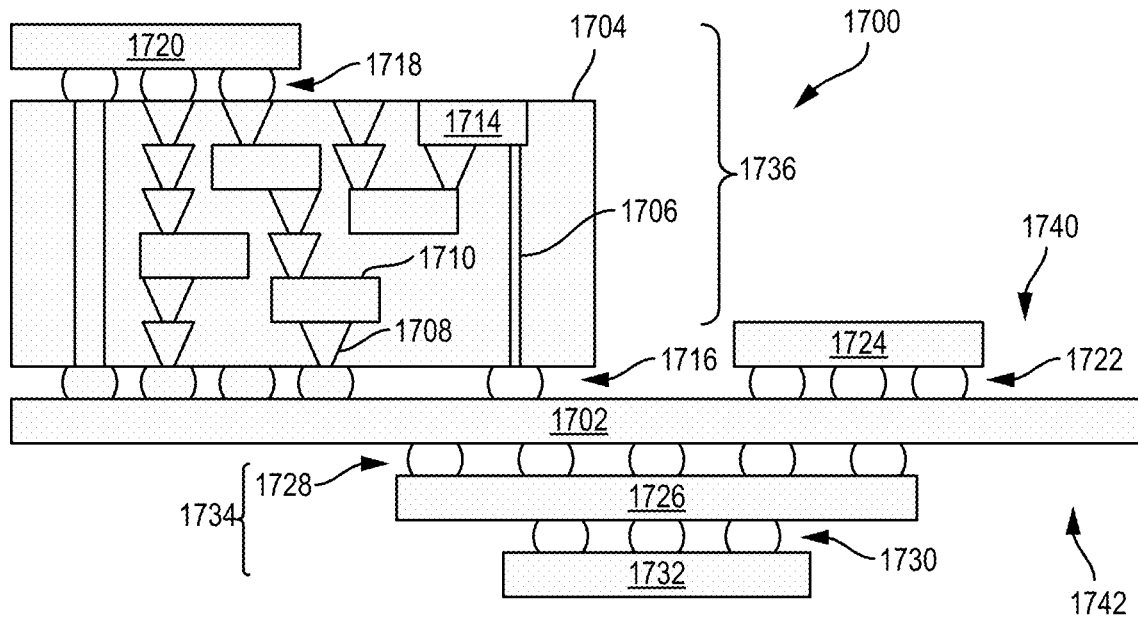
FIG. 56 is a side, cross-sectional view of an IC device assembly that may include a microelectronic structure or microelectronic assembly in accordance with any of the embodiments disclosed herein.

FIG. 56 is a side, cross-sectional view of an IC device assembly 1700 that may include one or more microelectronic structures 100 and/or microelectronic assemblies 150, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the microelectronic assemblies 150 discussed herein, or may otherwise include any of the microelectronic structures 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 56 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 56), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 56, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 54), an IC device (e.g., the IC device 1600 of FIG. 55), or any other suitable component. Generally, the package interposer 1704 may spread a connection to a wider pitch or reroute a connection to a different connection. For example, the package interposer 1704 may couple the IC package 1720 (e.g., a die) to a set of ball grid array (BGA) conductive contacts of the coupling components 1716 for coupling to the circuit board 1702. In the embodiment illustrated in FIG. 56, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more microelectronic structures 100 and/or microelectronic assemblies 150.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 56 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 57:
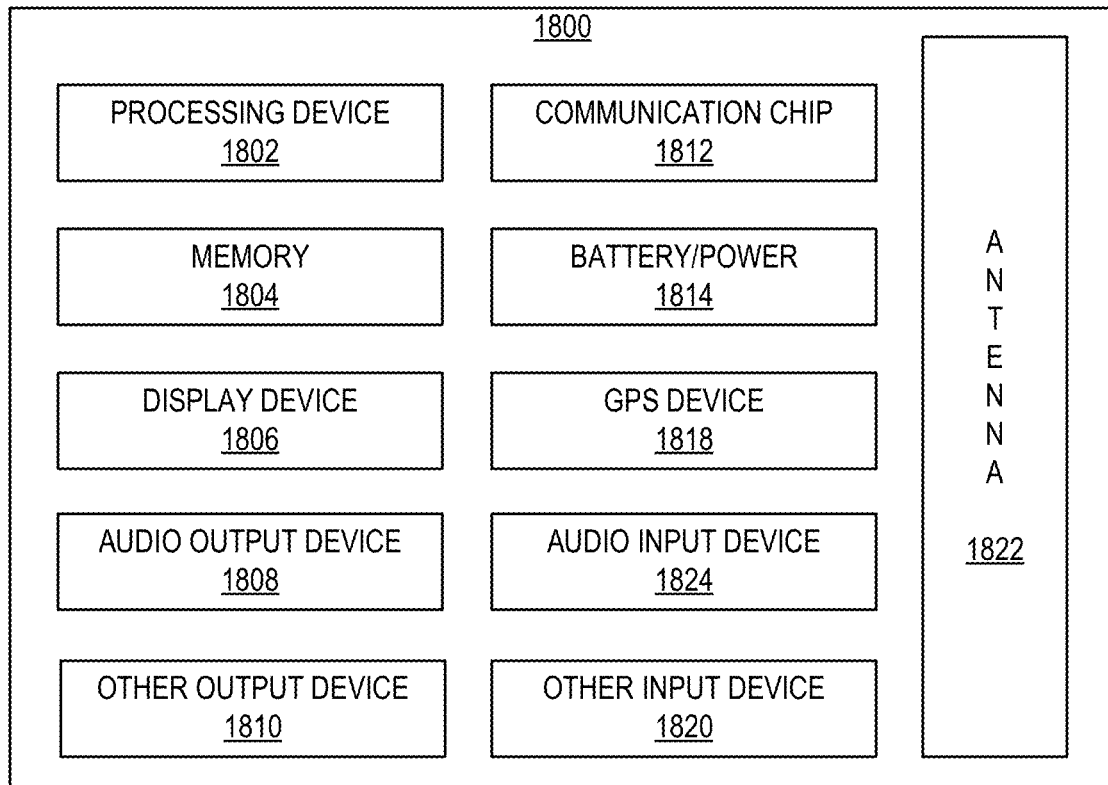
FIG. 57 is a block diagram of an example electrical device that may include a microelectronic structure or microelectronic assembly in accordance with any of the embodiments disclosed herein.

FIG. 57 is a block diagram of an example electrical device 1800 that may include one or more microelectronic structures 100 and/or microelectronic assemblies 150 in accordance with any of the embodiments disclosed herein. For example, any suitable ones of the components of the electrical device 1800 may include one or more of the microelectronic structures 100, microelectronic assemblies 150, IC device assemblies 1700, IC devices 1600, or dies 1502 disclosed herein. A number of components are illustrated in FIG. 57 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 57, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example A1 is a microelectronic assembly, including: a microelectronic component having a first conductive contact; a second conductive contact coupled to the first conductive contact by first solder, wherein the first solder is embedded in mold material, and the mold material extends around side faces of the microelectronic component; and a third conductive contact coupled to the second conductive contact by second solder, wherein the second solder and the third conductive contact are outside the mold material.

Example A2 includes the subject matter of Example A1, and further specifies that: the first conductive contact is one of a plurality of first conductive contacts; the second conductive contact is one of a plurality of second conductive contacts; the first solder is one of a plurality of first solders; individual ones of the second conductive contacts are coupled to individual ones of the first conductive contacts by individual ones of the first solders; the first solders are embedded in the mold material; the third conductive contact is one of a plurality of third conductive contacts; the second solder is one of a plurality of second solders; individual ones of the third conductive contacts are coupled to individual ones of the second conductive contacts by individual ones of the second solders; and the second solders and the third conductive contacts are outside the mold material.

Example A3 includes the subject matter of Example A2, and further specifies that the first conductive contacts have a pitch greater than 50 microns.

Example A4 includes the subject matter of any of Examples A2-3, and further specifies that: the microelectronic component has a plurality of fourth conductive contacts at a same face of the microelectronic component as the first conductive contacts; individual ones of a plurality of fifth conductive contacts are coupled to individual ones of the fourth conductive contacts by individual ones of a plurality of third solders, wherein the third solders are embedded in the mold material; individual ones of a plurality of sixth conductive contacts are coupled to individual ones of the fifth conductive contacts by individual ones of a plurality of fourth solders, wherein the fourth solders and the sixth conductive contacts are outside the mold material; and the fourth conductive contacts have a pitch that is less than a pitch of the first conductive contacts.

Example A5 includes the subject matter of Example A4, and further specifies that the fourth conductive contacts have a pitch that is less than 30 microns.

Example A6 includes the subject matter of any of Examples A4-5, and further specifies that the sixth conductive contacts are conductive contacts of a bridge component.

Example A7 includes the subject matter of Example A6, and further specifies that the bridge component includes transistors.

Example A8 includes the subject matter of Example A6, and further specifies that the bridge component does not include transistors.

Example A9 includes the subject matter of any of Examples A6-7, and further specifies that the microelectronic component is a first microelectronic component, and the microelectronic assembly further includes: a second microelectronic component having a plurality of seventh conductive contacts; individual ones of a plurality of eighth conductive contacts coupled to individual ones of the seventh conductive contacts by individual ones of a plurality of fifth solders, wherein the fifth solders are embedded in the mold material, and the mold material extends around side faces of the second microelectronic component; and individual ones of a plurality of ninth conductive contacts are coupled to individual ones of the eighth conductive contacts by individual ones of a plurality of sixth solders, wherein the sixth solders and the ninth conductive contacts are outside the mold material; wherein the sixth conductive contacts are located at a face of the bridge component; the ninth conductive contacts are conductive contacts of the bridge component, and are located at the face of the bridge component.

Example A10 includes the subject matter of Example A9, and further specifies that the first microelectronic component and the second microelectronic component have different thicknesses.

Example A11 includes the subject matter of any of Examples A9-10, and further specifies that the seventh conductive contacts have a pitch that is less than 30 microns.

Example A12 includes the subject matter of any of Examples A9-11, and further specifies that: the second microelectronic component has a plurality of tenth conductive contacts at a same face of the microelectronic component as the seventh conductive contacts; individual ones of a plurality of eleventh conductive contacts are coupled to individual ones of the tenth conductive contacts by individual ones of a plurality of seventh solders, wherein the seventh solders are embedded in the mold material; individual ones of a plurality of twelfth conductive contacts are coupled to individual ones of the eleventh conductive contacts by individual ones of a plurality of eighth solders, wherein the eighth solders and the twelfth conductive contacts are outside the mold material; and the tenth conductive contacts have a pitch that is more than a pitch of the seventh conductive contacts.

Example A13 includes the subject matter of Example A12, and further specifies that the twelfth conductive contacts and the third conductive contacts are at a face of a substrate.

Example A14 includes the subject matter of Example A13, and further specifies that the bridge component extends into a cavity in the substrate.

Example A15 includes the subject matter of Example A14, and further specifies that the cavity is a cavity in a surface insulation material of the substrate.

Example A16 includes the subject matter of any of Examples A12-15, and further specifies that the substrate includes an organic dielectric material.

Example A17 includes the subject matter of any of Examples A12-16, and further specifies that the sixth conductive contacts are located at a first face of the bridge component, the bridge component has a second face opposite to the first face, a plurality of thirteenth conductive contacts are located at the second face of the bridge component, and individual ones of the thirteenth conductive contacts are coupled to individual ones of a plurality of fifteenth conductive contacts of the substrate.

Example A18 includes the subject matter of any of Examples A12-16, and further specifies that the bridge component includes a mold material at a face of the bridge component opposite to a face of the bridge component at which the sixth conductive contacts are located.

Example A19 includes the subject matter of any of Examples A12-18, and further includes: an underfill material around the bridge component.

Example A20 includes the subject matter of any of Examples A6-19, and further specifies that the third conductive contacts are at a face of a substrate.

Example A21 includes the subject matter of Example A20, and further specifies that the bridge component extends into a cavity in the substrate.

Example A22 includes the subject matter of Example A21, and further specifies that the cavity is a cavity in a surface insulation material of the substrate.

Example A23 includes the subject matter of any of Examples A20-22, and further specifies that the substrate includes an organic dielectric material.

Example A24 includes the subject matter of any of Examples A20-23, and further specifies that the sixth conductive contacts are located at a first face of the bridge component, the bridge component has a second face opposite to the first face, a plurality of thirteenth conductive contacts are located at the second face of the bridge component, and individual ones of the thirteenth conductive contacts are coupled to individual ones of a plurality of fifteenth conductive contacts of the substrate.

Example A25 includes the subject matter of any of Examples A6-23, and further specifies that the bridge component includes a mold material at a face of the bridge component opposite to a face of the bridge component at which the sixth conductive contacts are located.

Example A26 includes the subject matter of any of Examples A6-25, and further includes: an underfill material around the bridge component.

Example A27 includes the subject matter of any of Examples A1-26, and further specifies that the third conductive contacts are at a face of a substrate.

Example A28 includes the subject matter of Example A27, and further specifies that the substrate includes an organic dielectric material.

Example A29 includes the subject matter of any of Examples A27-28, and further includes: an underfill material between the substrate and the mold material.

Example A30 is a microelectronic assembly, including: a microelectronic component having a first conductive contact; a second conductive contact coupled to the first conductive contact by first solder, wherein the first solder is embedded in mold material; and a third conductive contact coupled to the second conductive contact by second solder, wherein the second solder is outside the mold material.

Example A31 includes the subject matter of Example A30, and further specifies that: the first conductive contact is one of a plurality of first conductive contacts; the second conductive contact is one of a plurality of second conductive contacts; the first solder is one of a plurality of first solders; individual ones of the second conductive contacts are coupled to individual ones of the first conductive contacts by individual ones of the first solders; the first solders are embedded in the mold material; the third conductive contact is one of a plurality of third conductive contacts; the second solder is one of a plurality of second solders; individual ones of the third conductive contacts are coupled to individual ones of the second conductive contacts by individual ones of the second solders; and the second solders and the third conductive contacts are outside the mold material.

Example A32 includes the subject matter of Example A31, and further specifies that the first conductive contacts have a pitch greater than 50 microns.

Example A33 includes the subject matter of any of Examples A31-32, and further specifies that: the microelectronic component has a plurality of fourth conductive contacts at a same face of the microelectronic component as the first conductive contacts; individual ones of a plurality of fifth conductive contacts are coupled to individual ones of the fourth conductive contacts by individual ones of a plurality of third solders, wherein the third solders are embedded in the mold material; individual ones of a plurality of sixth conductive contacts are coupled to individual ones of the fifth conductive contacts by individual ones of a plurality of fourth solders, wherein the fourth solders and the sixth conductive contacts are outside the mold material; and the fourth conductive contacts have a pitch that is less than a pitch of the first conductive contacts.

Example A34 includes the subject matter of Example A33, and further specifies that the fourth conductive contacts have a pitch that is less than 30 microns.

Example A35 includes the subject matter of any of Examples A33-34, and further specifies that the sixth conductive contacts are conductive contacts of a bridge component.

Example A36 includes the subject matter of Example A35, and further specifies that the bridge component includes transistors.

Example A37 includes the subject matter of Example A35, and further specifies that the bridge component does not include transistors.

Example A38 includes the subject matter of any of Examples A35-36, and further specifies that the microelectronic component is a first microelectronic component, and the microelectronic assembly further includes: a second microelectronic component having a plurality of seventh conductive contacts; individual ones of a plurality of eighth conductive contacts coupled to individual ones of the seventh conductive contacts by individual ones of a plurality of fifth solders, wherein the fifth solders are embedded in the mold material, and the mold material extends around side faces of the second microelectronic component; and individual ones of a plurality of ninth conductive contacts are coupled to individual ones of the eighth conductive contacts by individual ones of a plurality of sixth solders, wherein the sixth solders and the ninth conductive contacts are outside the mold material; wherein the sixth conductive contacts are located at a face of the bridge component; the ninth conductive contacts are conductive contacts of the bridge component, and are located at the face of the bridge component.

Example A39 includes the subject matter of Example A38, and further specifies that the first microelectronic component and the second microelectronic component have different thicknesses.

Example A40 includes the subject matter of any of Examples A38-39, and further specifies that the seventh conductive contacts have a pitch that is less than 30 microns.

Example A41 includes the subject matter of any of Examples A38-40, and further specifies that: the second microelectronic component has a plurality of tenth conductive contacts at a same face of the microelectronic component as the seventh conductive contacts; individual ones of a plurality of eleventh conductive contacts are coupled to individual ones of the tenth conductive contacts by individual ones of a plurality of seventh solders, wherein the seventh solders are embedded in the mold material; individual ones of a plurality of twelfth conductive contacts are coupled to individual ones of the eleventh conductive contacts by individual ones of a plurality of eighth solders, wherein the eighth solders and the twelfth conductive contacts are outside the mold material; and the tenth conductive contacts have a pitch that is more than a pitch of the seventh conductive contacts.

Example A42 includes the subject matter of Example A41, and further specifies that the twelfth conductive contacts and the third conductive contacts are at a face of a substrate.

Example A43 includes the subject matter of Example A42, and further specifies that the bridge component extends into a cavity in the substrate.

Example A44 includes the subject matter of Example A43, and further specifies that the cavity is a cavity in a surface insulation material of the substrate.

Example A45 includes the subject matter of any of Examples A41-44, and further specifies that the substrate includes an organic dielectric material.

Example A46 includes the subject matter of any of Examples A41-45, and further specifies that the sixth conductive contacts are located at a first face of the bridge component, the bridge component has a second face opposite to the first face, a plurality of thirteenth conductive contacts are located at the second face of the bridge component, and individual ones of the thirteenth conductive contacts are coupled to individual ones of a plurality of fifteenth conductive contacts of the substrate.

Example A47 includes the subject matter of any of Examples A41-45, and further specifies that the bridge component includes a mold material at a face of the bridge component opposite to a face of the bridge component at which the sixth conductive contacts are located.

Example A48 includes the subject matter of any of Examples A41-47, and further includes: an underfill material around the bridge component.

Example A49 includes the subject matter of any of Examples A35-48, and further specifies that the third conductive contacts are at a face of a substrate.

Example A50 includes the subject matter of Example A49, and further specifies that the bridge component extends into a cavity in the substrate.

Example A51 includes the subject matter of Example A50, and further specifies that the cavity is a cavity in a surface insulation material of the substrate.

Example A52 includes the subject matter of any of Examples A49-51, and further specifies that the substrate includes an organic dielectric material.

Example A53 includes the subject matter of any of Examples A49-52, and further specifies that the sixth conductive contacts are located at a first face of the bridge component, the bridge component has a second face opposite to the first face, a plurality of thirteenth conductive contacts are located at the second face of the bridge component, and individual ones of the thirteenth conductive contacts are coupled to individual ones of a plurality of fifteenth conductive contacts of the substrate.

Example A54 includes the subject matter of any of Examples A35-52, and further specifies that the bridge component includes a mold material at a face of the bridge component opposite to a face of the bridge component at which the sixth conductive contacts are located.

Example A55 includes the subject matter of any of Examples A35-54, and further includes: an underfill material around the bridge component.

Example A56 includes the subject matter of any of Examples A30-55, and further specifies that the third conductive contacts are at a face of a substrate.

Example A57 includes the subject matter of Example A56, and further specifies that the substrate includes an organic dielectric material.

Example A58 includes the subject matter of any of Examples A56-57, and further includes: an underfill material between the substrate and the mold material.

Example A59 is a microelectronic assembly, including: a microelectronic component having a plurality of first conductive contacts; individual ones of a plurality of second conductive contacts coupled to the individual ones of the first conductive contacts by individual ones of a plurality of first solders, wherein the first solders are embedded in mold material; individual ones of a plurality of third conductive contacts coupled to individual ones of the second conductive contacts by individual ones of a plurality of second solders; a plurality of fourth conductive contacts at a same face of the microelectronic component as the first conductive contacts; individual ones of a plurality of fifth conductive contacts coupled to individual ones of the fourth conductive contacts by individual ones of a plurality of third solders, wherein the third solders are embedded in the mold material; and individual ones of a plurality of sixth conductive contacts coupled to individual ones of the fifth conductive contacts by individual ones of a plurality of fourth solders, wherein the sixth conductive contacts are conductive contacts of a bridge component.

Example A60 includes the subject matter of Example A59, and further specifies that the fourth conductive contacts have a pitch that is less than a pitch of the first conductive contacts.

Example A61 includes the subject matter of any of Examples A59-60, and further specifies that the bridge component includes transistors.

Example A62 includes the subject matter of any of Examples A59-60, and further specifies that the bridge component does not include transistors.

Example A63 includes the subject matter of any of Examples A59-62, and further specifies that the first conductive contacts have a pitch greater than 50 microns.

Example A64 includes the subject matter of any of Examples A59-63, and further specifies that: the microelectronic component has a plurality of fourth conductive contacts at a same face of the microelectronic component as the first conductive contacts; individual ones of a plurality of fifth conductive contacts are coupled to individual ones of the fourth conductive contacts by individual ones of a plurality of third solders, wherein the third solders are embedded in the mold material; individual ones of a plurality of sixth conductive contacts are coupled to individual ones of the fifth conductive contacts by individual ones of a plurality of fourth solders, wherein the fourth solders and the sixth conductive contacts are outside the mold material; and the fourth conductive contacts have a pitch that is less than a pitch of the first conductive contacts.

Example A65 includes the subject matter of Example A64, and further specifies that the fourth conductive contacts have a pitch that is less than 30 microns.

Example A66 includes the subject matter of any of Examples A64-65, and further specifies that the microelectronic component is a first microelectronic component, and the microelectronic assembly further includes: a second microelectronic component having a plurality of seventh conductive contacts; individual ones of a plurality of eighth conductive contacts coupled to individual ones of the seventh conductive contacts by individual ones of a plurality of fifth solders, wherein the fifth solders are embedded in the mold material, and the mold material extends around side faces of the second microelectronic component; and individual ones of a plurality of ninth conductive contacts are coupled to individual ones of the eighth conductive contacts by individual ones of a plurality of sixth solders, wherein the sixth solders and the ninth conductive contacts are outside the mold material; wherein the sixth conductive contacts are located at a face of the bridge component; the ninth conductive contacts are conductive contacts of the bridge component, and are located at the face of the bridge component.

Example A67 includes the subject matter of Example A66, and further specifies that the first microelectronic component and the second microelectronic component have different thicknesses.

Example A68 includes the subject matter of any of Examples A66-67, and further specifies that the seventh conductive contacts have a pitch that is less than 30 microns.

Example A69 includes the subject matter of any of Examples A66-68, and further specifies that: the second microelectronic component has a plurality of tenth conductive contacts at a same face of the microelectronic component as the seventh conductive contacts; individual ones of a plurality of eleventh conductive contacts are coupled to individual ones of the tenth conductive contacts by individual ones of a plurality of seventh solders, wherein the seventh solders are embedded in the mold material; individual ones of a plurality of twelfth conductive contacts are coupled to individual ones of the eleventh conductive contacts by individual ones of a plurality of eighth solders, wherein the eighth solders and the twelfth conductive contacts are outside the mold material; and the tenth conductive contacts have a pitch that is more than a pitch of the seventh conductive contacts.

Example A70 includes the subject matter of Example A69, and further specifies that the twelfth conductive contacts and the third conductive contacts are at a face of a substrate.

Example A71 includes the subject matter of Example A70, and further specifies that the bridge component extends into a cavity in the substrate.

Example A72 includes the subject matter of Example A71, and further specifies that the cavity is a cavity in a surface insulation material of the substrate.

Example A73 includes the subject matter of any of Examples A69-72, and further specifies that the substrate includes an organic dielectric material.

Example A74 includes the subject matter of any of Examples A69-73, and further specifies that the sixth conductive contacts are located at a first face of the bridge component, the bridge component has a second face opposite to the first face, a plurality of thirteenth conductive contacts are located at the second face of the bridge component, and individual ones of the thirteenth conductive contacts are coupled to individual ones of a plurality of fifteenth conductive contacts of the substrate.

Example A75 includes the subject matter of any of Examples A69-73, and further specifies that the bridge component includes a mold material at a face of the bridge component opposite to a face of the bridge component at which the sixth conductive contacts are located.

Example A76 includes the subject matter of any of Examples A69-75, and further includes: an underfill material around the bridge component.

Example A77 includes the subject matter of any of Examples A64-76, and further specifies that the third conductive contacts are at a face of a substrate.

Example A78 includes the subject matter of Example A77, and further specifies that the bridge component extends into a cavity in the substrate.

Example A79 includes the subject matter of Example A78, and further specifies that the cavity is a cavity in a surface insulation material of the substrate.

Example A80 includes the subject matter of any of Examples A77-79, and further specifies that the substrate includes an organic dielectric material.

Example A81 includes the subject matter of any of Examples A77-80, and further specifies that the sixth conductive contacts are located at a first face of the bridge component, the bridge component has a second face opposite to the first face, a plurality of thirteenth conductive contacts are located at the second face of the bridge component, and individual ones of the thirteenth conductive contacts are coupled to individual ones of a plurality of fifteenth conductive contacts of the substrate.

Example A82 includes the subject matter of any of Examples A64-81, and further specifies that the bridge component includes a mold material at a face of the bridge component opposite to a face of the bridge component at which the sixth conductive contacts are located.

Example A83 includes the subject matter of any of Examples A59-82, and further includes: an underfill material around the bridge component.

Example A84 includes the subject matter of any of Examples A59-83, and further specifies that the third conductive contacts are at a face of a substrate.

Example A85 includes the subject matter of Example A84, and further specifies that the substrate includes an organic dielectric material.

Example A86 includes the subject matter of any of Examples A84-85, and further includes: an underfill material between the substrate and the mold material.

Example A87 is an electronic device, including: a circuit board; and a microelectronic assembly conductively coupled to the circuit board, wherein the microelectronic assembly includes any of the microelectronic assemblies of any of Examples A1-86.

Example A88 includes the subject matter of Example A87, and further specifies that the electronic device is a handheld computing device, a laptop computing device, a wearable computing device, or a server computing device.

Example A89 includes the subject matter of any of Examples A87-88, and further specifies that the circuit board is a motherboard.

Example A90 includes the subject matter of any of Examples A87-89, and further includes: a display communicatively coupled to the circuit board.

Example A91 includes the subject matter of Example A90, and further specifies that the display includes a touchscreen display.

Example A92 includes the subject matter of any of Examples A87-91, and further includes: a housing around the circuit board and the microelectronic assembly.

Example B1 is a microelectronic assembly, including: a first microelectronic component; a second microelectronic component; a bridge component, wherein the first microelectronic component is coupled to a first face of the bridge component and the second microelectronic component is coupled to the first face of the bridge component, the bridge component has a second face opposite the first face, and the bridge component includes first conductive contacts at the second face; and a substrate having third conductive contacts, wherein the bridge component is at least partially between the first microelectronic component and the substrate, the bridge component is at least partially between the second microelectronic component and the substrate, the first conductive contacts are coupled to second conductive contacts by first solder, the second conductive contacts are coupled to the third conductive contacts by second solder, and the second conductive contacts are between the first conductive contacts and the third conductive contacts.

Example B2 includes the subject matter of Example B1, and further specifies that the second conductive contacts have a surface that is coplanar with a surface of an insulating material in which the second conductive contacts are embedded.

Example B3 includes the subject matter of Example B2, and further specifies that fourth conductive contacts of the first microelectronic component are coupled to fifth conductive contacts by third solder, the fifth conductive contacts are coupled to sixth conductive contacts by fourth solder, the sixth conductive contacts are conductive contacts of the substrate, the fifth conductive contacts are between the fourth conductive contacts and the sixth conductive contacts, and the sixth conductive contacts are outside a footprint of the bridge component.

Example B4 includes the subject matter of Example B3, and further specifies that the fifth conductive contacts have a surface that is coplanar with the surface of the insulating material.

Example B5 includes the subject matter of any of Examples B3-4, and further specifies that the insulating material is a first insulating material, and the microelectronic assembly further includes a second insulating material, different from the first insulating material, between the first insulating material and the first microelectronic component.

Example B6 includes the subject matter of Example B5, and further specifies that the first insulating material is a resist material, and the second insulating material is a mold material.

Example B7 includes the subject matter of any of Examples B5-6, and further specifies that the bridge component is at least partially in an opening in the first insulating material.

Example B8 includes the subject matter of any of Examples B3-7, and further specifies that a pitch of the fourth conductive contacts is larger than a pitch of the conductive contacts coupling the first microelectronic component to the bridge component.

Example B9 includes the subject matter of Example B8, and further specifies that the pitch of the fourth conductive contacts is greater than 50 microns.

Example B10 includes the subject matter of any of Examples B8-9, and further specifies that the pitch of the conductive contacts coupling the first microelectronic component to the bridge component is less than 30 microns.

Example B11 includes the subject matter of any of Examples B1-10, and further specifies that the bridge component includes transistors.

Example B12 includes the subject matter of any of Examples B1-10, and further specifies that the bridge component does not include transistors.

Example B13 includes the subject matter of any of Examples B1-12, and further specifies that the third conductive contacts are in contact with a surface insulating material different from the insulating material.

Example B14 includes the subject matter of any of Examples B1-13, and further includes: an underfill material between the substrate and the first microelectronic component, wherein the underfill material is different from the insulating material.

Example B15 includes the subject matter of any of Examples B1-14, and further specifies that the substrate includes an organic dielectric material.

Example B16 is a microelectronic assembly, including: a microelectronic component including first conductive contacts and second conductive contacts; a bridge component, wherein the bridge component includes third conductive contacts at a face of the bridge component, and the first conductive contacts are coupled to the third conductive contacts by first solder; and a substrate having fifth conductive contacts, wherein the bridge component is at least partially between the microelectronic component and the substrate, the second conductive contacts are coupled to fourth conductive contacts by second solder, the fourth conductive contacts are coupled to the fifth conductive contacts by third solder, and the fourth conductive contacts are between the second conductive contacts and the fifth conductive contacts.

Example B17 includes the subject matter of Example B16, and further specifies that the fourth conductive contacts have a surface that is coplanar with a surface of an insulating material in which the fourth conductive contacts are embedded.

Example B18 includes the subject matter of any of Examples B16-17, and further specifies that the face of the bridge component is a first face, the bridge component includes a second face opposite to the first face, sixth conductive contacts are at the second face of the bridge component, seventh conductive contacts are at the face of the substrate, and the sixth conductive contacts are coupled to the seventh conductive contacts by fourth solder.

Example B19 includes the subject matter of any of Examples B16-18, and further specifies that the seventh conductive contacts are coplanar with the fifth conductive contacts.

Example B20 includes the subject matter of any of Examples B16-19, and further specifies that the insulating material is a first insulating material, and the microelectronic assembly further includes a second insulating material, different from the first insulating material, between the first insulating material and the microelectronic component.

Example B21 includes the subject matter of Example B20, and further specifies that the first insulating material is a resist material, and the second insulating material is a mold material.

Example B22 includes the subject matter of any of Examples B20-21, and further specifies that the bridge component is at least partially in an opening in the first insulating material.

Example B23 includes the subject matter of any of Examples B16-22, and further specifies that a pitch of the second conductive contacts is larger than a pitch of the first conductive contacts.

Example B24 includes the subject matter of Example B23, and further specifies that the pitch of the second conductive contacts is greater than 50 microns.

Example B25 includes the subject matter of any of Examples B23-24, and further specifies that the pitch of the first conductive contacts is less than 30 microns.

Example B26 includes the subject matter of any of Examples B16-25, and further specifies that the bridge component includes transistors.

Example B27 includes the subject matter of any of Examples B16-25, and further specifies that the bridge component does not include transistors.

Example B28 includes the subject matter of any of Examples B16-27, and further specifies that the fifth conductive contacts are in contact with a surface insulating material different from the insulating material.

Example B29 includes the subject matter of any of Examples B16-28, and further includes: an underfill material between the substrate and the microelectronic component, wherein the underfill material is different from the insulating material.

Example B30 includes the subject matter of any of Examples B16-29, and further specifies that the substrate includes an organic dielectric material.

Example B31 is a microelectronic assembly, including: a microelectronic component, wherein the microelectronic component includes first conductive contacts; a bridge component, wherein the bridge component includes second conductive contacts; and a substrate, wherein the bridge component is coupled between the microelectronic component and the substrate, the first conductive contacts are coupled to the substrate by two layers of solder separated by intervening conductive contacts, and the second conductive contacts are coupled to the substrate by two layers of solder separated by intervening conductive contacts.

Example B32 includes the subject matter of Example B31, and further specifies that the top microelectronic component includes third conductive contacts coupled to fourth conductive contacts of the bridge component, and wherein the third conductive contacts have a pitch that is less than a pitch of the first conductive contacts.

Example B33 includes the subject matter of any of Examples B32, and further specifies that the third conductive contacts have a pitch that is less than 30 microns.

Example B34 includes the subject matter of any of Examples B32-33, and further specifies that the first conductive contacts have a pitch that is greater than 50 microns.

Example B35 includes the subject matter of any of Examples B31-34, and further specifies that the microelectronic assembly includes an insulating material between the microelectronic component and the substrate, and the insulating material is not between the bridge component and the substrate.

Example B36 includes the subject matter of Example B35, and further specifies that the insulating material is not between the bridge component and the microelectronic component.

Example B37 includes the subject matter of any of Examples B31-36, and further specifies that the intervening conductive contacts are coplanar.

Example B38 includes the subject matter of any of Examples B31-37, and further specifies that the conductive contacts of the substrate are coplanar.

Example B39 includes the subject matter of any of Examples B31-38, and further specifies that the bridge component includes transistors.

Example B40 includes the subject matter of any of Examples B31-38, and further specifies that the bridge component does not include transistors.

Example B41 includes the subject matter of any of Examples B31-40, and further specifies that the third conductive contacts are in contact with a surface insulating material different from the insulating material.

Example B42 includes the subject matter of any of Examples B31-41, and further includes: an underfill material between the substrate and the microelectronic component, wherein the underfill material is different from the insulating material.

Example B43 includes the subject matter of any of Examples B31-42, and further specifies that the substrate includes an organic dielectric material.

Example B44 is an electronic device, including: a circuit board; and a microelectronic assembly conductively coupled to the circuit board, wherein the microelectronic assembly includes any of the microelectronic assemblies of any of Examples B1-43.

Example B45 includes the subject matter of Example B44, and further specifies that the electronic device is a handheld computing device, a laptop computing device, a wearable computing device, or a server computing device.

Example B46 includes the subject matter of any of Examples B44-45, and further specifies that the circuit board is a motherboard.

Example B47 includes the subject matter of any of Examples B44-46, and further includes: a display communicatively coupled to the circuit board.

Example B48 includes the subject matter of Example B47, and further specifies that the display includes a touchscreen display.

Example B49 includes the subject matter of any of Examples B44-48, and further includes: a housing around the circuit board and the microelectronic assembly.

Example C1 is a microelectronic assembly, including: a substrate; and a microelectronic component coupled to the substrate by a solder interconnect, wherein the solder interconnect includes a first portion and a second portion, the first portion is between the second portion and the substrate, and the first portion has a ground top surface.

Example C2 includes the subject matter of Example C1, and further specifies that the first portion has a height between 20 microns and 50 microns.

Example C3 includes the subject matter of any of Examples C1-2, and further includes: a bridge component, wherein the microelectronic component is coupled to the bridge component by solder, the bridge component is coupled to the substrate by solder, and the bridge component is at least partially between the substrate and the microelectronic component.

Example C4 includes the subject matter of Example C3, and further specifies that the microelectronic component is a first microelectronic component, the solder interconnect is a first solder interconnect, and the microelectronic assembly further includes: a second microelectronic component coupled to the substrate by a second solder interconnect, wherein the second solder interconnect includes a first portion and a second portion, the first portion of the second solder interconnect is between the second portion of the second solder interconnect and the substrate, the first portion of the second solder interconnect has a ground top surface, the second microelectronic component is coupled to the bridge component by solder, and the bridge component is at least partially between the substrate and the second microelectronic component.

Example C5 includes the subject matter of Example C4, and further specifies that the first portion of the second solder interconnect has a height between 20 microns and 50 microns.

Example C6 includes the subject matter of any of Examples C3-5, and further specifies that the bridge component includes a transistor.

Example C7 includes the subject matter of any of Examples C3-5, and further specifies that the bridge component does not include a transistor.

Example C8 includes the subject matter of any of Examples C3-7, and further specifies that the bridge component is at least partially in a cavity in the substrate.

Example C9 includes the subject matter of any of Examples C3-8, and further specifies that a top surface of the bridge component is coplanar with the ground top surface of the first portion of the solder interconnect.

Example C10 includes the subject matter of any of Examples C3-8, and further specifies that a top surface of the bridge component is non-coplanar with the ground top surface of the first portion of the solder interconnect.

Example C11 includes the subject matter of any of Examples C1-10, and further specifies that the substrate includes an organic dielectric material.

Example C12 is a microelectronic assembly, including: a substrate; and a microelectronic component coupled to the substrate by solder interconnects, wherein individual solder interconnects include a first portion and a second portion, and interfaces between the first portion and the second portion are coplanar across the solder interconnects.

Example C13 includes the subject matter of Example C12, and further specifies that the first portion has a height between 20 microns and 50 microns.

Example C14 includes the subject matter of any of Examples C12-13, and further includes: a bridge component, wherein the microelectronic component is coupled to the bridge component by solder, the bridge component is coupled to the substrate by solder, and the bridge component is at least partially between the substrate and the microelectronic component.

Example C15 includes the subject matter of Example C14, and further specifies that the microelectronic component is a first microelectronic component, the solder interconnect is a first solder interconnect, and the microelectronic assembly further includes: a second microelectronic component coupled to the substrate by a second solder interconnect, wherein the second solder interconnect includes a first portion and a second portion, the first portion of the second solder interconnect is between the second portion of the second solder interconnect and the substrate, the first portion of the second solder interconnect has a ground top surface, the second microelectronic component is coupled to the bridge component by solder, and the bridge component is at least partially between the substrate and the second microelectronic component.

Example C16 includes the subject matter of Example C15, and further specifies that the first portion of the second solder interconnect has a height between 20 microns and 50 microns.

Example C17 includes the subject matter of any of Examples C14-16, and further specifies that the bridge component includes a transistor.

Example C18 includes the subject matter of any of Examples C14-16, and further specifies that the bridge component does not include a transistor.

Example C19 includes the subject matter of any of Examples C14-18, and further specifies that the bridge component is at least partially in a cavity in the substrate.

Example C20 includes the subject matter of any of Examples C14-19, and further specifies that a top surface of the bridge component is coplanar with the interfaces between the first portions and the second portions.

Example C21 includes the subject matter of any of Examples C14-19, and further specifies that a top surface of the bridge component is non-coplanar with the interfaces between the first portions and the second portions.

Example C22 includes the subject matter of any of Examples C12-21, and further specifies that the substrate includes an organic dielectric material.

Example C23 is a microelectronic assembly, including: a substrate; and a microelectronic component coupled to the substrate by an interconnect, wherein the interconnect includes a first portion and a second portion, the first portion includes solder, the first portion is between the second portion and the substrate, and the first portion has a ground top surface.

Example C24 includes the subject matter of Example C23, and further specifies that the first portion has a height between 20 microns and 50 microns.

Example C25 includes the subject matter of any of Examples C23-24, and further includes: a bridge component, wherein the microelectronic component is coupled to the bridge component by solder, the bridge component is coupled to the substrate by solder, and the bridge component is at least partially between the substrate and the microelectronic component.

Example C26 includes the subject matter of Example C25, and further specifies that the microelectronic component is a first microelectronic component, the interconnect is a first interconnect, and the microelectronic assembly further includes: a second microelectronic component coupled to the substrate by a second interconnect, wherein the second interconnect includes a first portion and a second portion, the first portion of the second interconnect includes solder, the first portion of the second interconnect is between the second portion of the second interconnect and the substrate, the first portion of the second interconnect has a ground top surface, the second microelectronic component is coupled to the bridge component by solder, and the bridge component is at least partially between the substrate and the second microelectronic component.

Example C27 includes the subject matter of Example C26, and further specifies that the first portion of the second interconnect has a height between 20 microns and 50 microns.

Example C28 includes the subject matter of any of Examples C25-27, and further specifies that the bridge component includes a transistor.

Example C29 includes the subject matter of any of Examples C25-27, and further specifies that the bridge component does not include a transistor.

Example C30 includes the subject matter of any of Examples C25-29, and further specifies that the bridge component is at least partially in a cavity in the substrate.

Example C31 includes the subject matter of any of Examples C25-30, and further specifies that a top surface of the bridge component is coplanar with the ground top surface of the first portion of the interconnect.

Example C32 includes the subject matter of any of Examples C25-30, and further specifies that a top surface of the bridge component is non-coplanar with the ground top surface of the first portion of the interconnect.

Example C33 includes the subject matter of any of Examples C23-32, and further specifies that the substrate includes an organic dielectric material.

Example C34 is an electronic device, including: a circuit board; and a microelectronic assembly conductively coupled to the circuit board, wherein the microelectronic assembly includes any of the microelectronic assemblies of any of Examples C1-33.

Example C35 includes the subject matter of Example C34, and further specifies that the electronic device is a handheld computing device, a laptop computing device, a wearable computing device, or a server computing device.

Example C36 includes the subject matter of any of Examples C34-35, and further specifies that the circuit board is a motherboard.

Example C37 includes the subject matter of any of Examples C34-36, and further includes: a display communicatively coupled to the circuit board.

Example C38 includes the subject matter of Example C37, and further specifies that the display includes a touchscreen display.

Example C39 includes the subject matter of any of Examples C34-38, and further includes: a housing around the circuit board and the microelectronic assembly.

Example D1 is a microelectronic assembly, including: a substrate having a first conductive contact; a bridge component having a second conductive contact on a first face of the bridge component and a third conductive contact on a second, opposing face of the bridge component, wherein the first conductive contact is coupled to the second conductive contact by first solder, and the first solder contacts side faces of the first conductive contact and the second conductive contact; and a microelectronic component having a fourth conductive contact, wherein the third conductive contact is coupled to the fourth conductive contact by second solder, and the third conductive contact contacts the fourth conductive contact.

Example D2 includes the subject matter of Example D1, and further specifies that the second solder does not contact solder coupling another conductive contact at the second face of the bridge component to another conductive contact of the microelectronic component.

Example D3 includes the subject matter of any of Examples D1-2, and further specifies that a diameter of the fourth conductive contact is different than a diameter of the third conductive contact.

Example D4 includes the subject matter of Example D3, and further specifies that the diameter of one of the third conductive contact and the fourth conductive contact is less than 60% of the diameter of an other of the third conductive contact and the fourth conductive contact.

Example D5 includes the subject matter of any of Examples D3-4, and further specifies that the diameter of one of the third conductive contact and the fourth conductive contact is less than 50% of the diameter of an other of the third conductive contact and the fourth conductive contact.

Example D6 includes the subject matter of any of Examples D1-5, and further specifies that the diameter of the third conductive contact, or the diameter of the fourth conductive contact, is less than 30 microns.

Example D7 includes the subject matter of any of Examples D1-6, and further specifies that the second solder contacts side faces of the fourth conductive contact.

Example D8 includes the subject matter of any of Examples D1-7, and further specifies that the fourth conductive contact is one of a plurality of fourth conductive contacts having a pitch that is less than 50 microns.

Example D9 includes the subject matter of any of Examples D1-8, and further specifies that the fourth conductive contact is one of a plurality of fourth conductive contacts having a pitch that is less than 30 microns.

Example D10 includes the subject matter of any of Examples D1-9, and further specifies that a center of the first conductive contact is not aligned with a center of the second conductive contact.

Example D11 includes the subject matter of any of Examples D1-10, and further specifies that the first conductive contact is one of a plurality of first conductive contacts having a pitch that is greater than 50 microns.

Example D12 includes the subject matter of any of Examples D1-11, and further specifies that the bridge component includes transistors.

Example D13 includes the subject matter of any of Examples D1-11, and further specifies that the bridge component does not include transistors.

Example D14 includes the subject matter of any of Examples D1-13, and further specifies that the substrate includes an organic dielectric material.

Example D15 includes the subject matter of any of Examples D1-14, and further specifies that the microelectronic component is a first microelectronic component, the microelectronic assembly further includes a second microelectronic component, and the bridge component is at least partially between the second microelectronic component and the substrate.

Example D16 is a microelectronic assembly, including: a substrate having a first conductive contact; a bridge component having a second conductive contact on a first face of the bridge component and a third conductive contact on a second, opposing face of the bridge component, wherein the first conductive contact is coupled to the second conductive contact by first solder, and the first solder contacts side faces of the first conductive contact and the second conductive contact; and a microelectronic component having a fourth conductive contact, wherein the third conductive contact is coupled to the fourth conductive contact by second solder.

Example D17 includes the subject matter of Example D16, and further specifies that a diameter of the fourth conductive contact is less than a diameter of the third conductive contact.

Example D18 includes the subject matter of Example D17, and further specifies that the diameter of the fourth conductive contact is less than 60% of the diameter of the third conductive contact.

Example D19 includes the subject matter of any of Examples D17-18, and further specifies that the diameter of the fourth conductive contact is less than 50% of the diameter of the third conductive contact.

Example D20 includes the subject matter of any of Examples D17-19, and further specifies that the diameter of the fourth conductive contact is less than 30 microns.

Example D21 includes the subject matter of any of Examples D16-20, and further specifies that the second solder contacts side faces of the fourth conductive contact.

Example D22 includes the subject matter of any of Examples D16-21, and further specifies that the fourth conductive contact is one of a plurality of fourth conductive contacts having a pitch that is less than 50 microns.

Example D23 includes the subject matter of any of Examples D16-22, and further specifies that the fourth conductive contact is one of a plurality of fourth conductive contacts having a pitch that is less than 30 microns.

Example D24 includes the subject matter of any of Examples D16-23, and further specifies that a center of the first conductive contact is not aligned with a center of the second conductive contact.

Example D25 includes the subject matter of any of Examples D16-24, and further specifies that the first conductive contact is one of a plurality of first conductive contacts having a pitch that is greater than 50 microns.

Example D26 includes the subject matter of any of Examples D16-25, and further specifies that the bridge component includes transistors.

Example D27 includes the subject matter of any of Examples D16-25, and further specifies that the bridge component does not include transistors.

Example D28 includes the subject matter of any of Examples D16-27, and further specifies that the substrate includes an organic dielectric material.

Example D29 includes the subject matter of any of Examples D16-28, and further specifies that the microelectronic component is a first microelectronic component, the microelectronic assembly further includes a second microelectronic component, and the bridge component is at least partially between the second microelectronic component and the substrate.

Example D30 is a microelectronic assembly, including: a substrate having a first conductive contact; a bridge component having a second conductive contact on a first face of the bridge component and a third conductive contact on a second, opposing face of the bridge component, wherein the first conductive contact is coupled to the second conductive contact by first solder; and a microelectronic component having a fourth conductive contact, wherein the third conductive contact is coupled to the fourth conductive contact by second solder, and a diameter of the fourth conductive contact is different than a diameter of the third conductive contact.

Example D31 includes the subject matter of Example D30, and further specifies that the diameter of one of the third conductive contact and the fourth conductive contact is less than 60% of the diameter of an other of the third conductive contact and the fourth conductive contact.

Example D32 includes the subject matter of any of Examples D30-31, and further specifies that the diameter of one of the third conductive contact and the fourth conductive contact is less than 50% of the diameter of an other of the third conductive contact and the fourth conductive contact.

Example D33 includes the subject matter of any of Examples D30-32, and further specifies that the diameter of the third conductive contact, or the diameter of the fourth conductive contact, is less than 30 microns.

Example D34 includes the subject matter of any of Examples D30-33, and further specifies that the second solder contacts side faces of the fourth conductive contact.

Example D35 includes the subject matter of any of Examples D30-34, and further specifies that the fourth conductive contact is one of a plurality of fourth conductive contacts having a pitch that is less than 50 microns.

Example D36 includes the subject matter of any of Examples D30-35, and further specifies that the fourth conductive contact is one of a plurality of fourth conductive contacts having a pitch that is less than 30 microns.

Example D37 includes the subject matter of any of Examples D30-36, and further specifies that the first solder contacts side faces of the first conductive contact and the second conductive contact.

Example D38 includes the subject matter of any of Examples D30-37, and further specifies that a center of the first conductive contact is not aligned with a center of the second conductive contact.

Example D39 includes the subject matter of any of Examples D30-38, and further specifies that the first conductive contact is one of a plurality of first conductive contacts having a pitch that is greater than 50 microns.

Example D40 includes the subject matter of any of Examples D30-39, and further specifies that the bridge component includes transistors.

Example D41 includes the subject matter of any of Examples D30-39, and further specifies that the bridge component does not include transistors.

Example D42 includes the subject matter of any of Examples D30-41, and further specifies that the substrate includes an organic dielectric material.

Example D43 includes the subject matter of any of Examples D30-42, and further specifies that the microelectronic component is a first microelectronic component, the microelectronic assembly further includes a second microelectronic component, and the bridge component is at least partially between the second microelectronic component and the substrate.

Example D44 is a microelectronic assembly, including: a substrate having a first conductive contact; a bridge component having a second conductive contact on a first face of the bridge component and a third conductive contact on a second, opposing face of the bridge component, wherein the first conductive contact is coupled to the second conductive contact by first solder; and a microelectronic component having a fourth conductive contact, wherein the third conductive contact is coupled to the fourth conductive contact by second solder, the third conductive contact contacts the fourth conductive contact, and the second solder does not contact solder coupling another conductive contact at the second face of the bridge component to another conductive contact of the microelectronic component.

Example D45 includes the subject matter of Example D44, and further specifies that the second solder contacts side faces of the fourth conductive contact.

Example D46 includes the subject matter of any of Examples D44-45, and further specifies that the fourth conductive contact is one of a plurality of fourth conductive contacts having a pitch that is less than 50 microns.

Example D47 includes the subject matter of any of Examples D44-46, and further specifies that the fourth conductive contact is one of a plurality of fourth conductive contacts having a pitch that is less than 30 microns.

Example D48 includes the subject matter of any of Examples D44-47, and further specifies that the first solder contacts side faces of the first conductive contact and the second conductive contact.

Example D49 includes the subject matter of any of Examples D44-48, and further specifies that a center of the first conductive contact is not aligned with a center of the second conductive contact.

Example D50 includes the subject matter of any of Examples D44-49, and further specifies that the first conductive contact is one of a plurality of first conductive contacts having a pitch that is greater than 50 microns.

Example D51 includes the subject matter of any of Examples D44-50, and further specifies that the bridge component includes transistors.

Example D52 includes the subject matter of any of Examples D44-50, and further specifies that the bridge component does not include transistors.

Example D53 includes the subject matter of any of Examples D44-52, and further specifies that the substrate includes an organic dielectric material.

Example D54 includes the subject matter of any of Examples D44-53, and further specifies that the microelectronic component is a first microelectronic component, the microelectronic assembly further includes a second microelectronic component, and the bridge component is at least partially between the second microelectronic component and the substrate.

Example D55 is an electronic device, including: a circuit board; and a microelectronic assembly conductively coupled to the circuit board, wherein the microelectronic assembly includes any of the microelectronic assemblies of any of Examples D1-54.

Example D56 includes the subject matter of Example D55, and further specifies that the electronic device is a handheld computing device, a laptop computing device, a wearable computing device, or a server computing device.

Example D57 includes the subject matter of any of Examples D55-56, and further specifies that the circuit board is a motherboard.

Example D58 includes the subject matter of any of Examples D55-57, and further includes: a display communicatively coupled to the circuit board.

Example D59 includes the subject matter of Example D58, and further specifies that the display includes a touchscreen display.

Example D60 includes the subject matter of any of Examples D55-59, and further includes: a housing around the circuit board and the microelectronic assembly.

Example E1 is a microelectronic assembly, including: a microelectronic component; a substrate; and a patch structure, wherein the patch structure is coupled between the microelectronic component and the substrate, the patch structure includes an embedded bridge component, the patch structure includes a stack of conductive pillars, and a diameter of the conductive pillars increases in a direction from the substrate to the microelectronic component.

Example E2 includes the subject matter of Example E1, and further specifies that the patch structure is coupled to the microelectronic component by first interconnects having a first pitch and by second interconnects having a second pitch, and the first pitch is less than the second pitch.

Example E3 includes the subject matter of Example E2, and further specifies that the first interconnects are in a volume between the bridge component and the microelectronic component.

Example E4 includes the subject matter of any of Examples E1-3, and further specifies that the patch structure has a first face and an opposing second face, the second face is between the first face and the microelectronic component, and the patch structure includes solder between the bridge component and the second face.

Example E5 includes the subject matter of any of Examples E1-4, and further specifies that the microelectronic component is a first microelectronic component, the microelectronic assembly includes a second microelectronic component, and the patch structure is coupled between the second microelectronic component and the substrate.

Example E6 includes the subject matter of Example E5, and further specifies that the patch structure is coupled to the second microelectronic component by first interconnects having a first pitch and by second interconnects having a second pitch, and the first pitch is less than the second pitch.

Example E7 includes the subject matter of Example E6, and further specifies that the first interconnects are in a volume between the bridge component and the second microelectronic component.

Example E8 includes the subject matter of any of Examples E1-7, and further specifies that the bridge component includes transistors.

Example E9 includes the subject matter of any of Examples E1-7, and further specifies that the bridge component does not include transistors.

Example E10 includes the subject matter of any of Examples E1-9, and further specifies that the substrate includes an organic dielectric material.

Example E11 is a microelectronic assembly, including: a microelectronic component; a substrate; and a patch structure, wherein the patch structure is coupled between the microelectronic component and the substrate, the patch structure includes an embedded bridge component, the patch structure has a first face and an opposing second face, the second face is between the first face and the microelectronic component, and the patch structure includes solder between the bridge component and the second face.

Example E12 includes the subject matter of Example E11, and further specifies that the patch structure is coupled to the microelectronic component by first interconnects having a first pitch and by second interconnects having a second pitch, and the first pitch is less than the second pitch.

Example E13 includes the subject matter of Example E12, and further specifies that the first interconnects are in a volume between the bridge component and the microelectronic component.

Example E14 includes the subject matter of any of Examples E11-13, and further specifies that the patch structure includes a stack of conductive pillars, and a diameter of the conductive pillars increases in a direction from the substrate to the microelectronic component.

Example E15 includes the subject matter of any of Examples E11-14, and further specifies that the microelectronic component is a first microelectronic component, the microelectronic assembly includes a second microelectronic component, and the patch structure is coupled between the second microelectronic component and the substrate.

Example E16 includes the subject matter of Example E15, and further specifies that the patch structure is coupled to the second microelectronic component by first interconnects having a first pitch and by second interconnects having a second pitch, and the first pitch is less than the second pitch.

Example E17 includes the subject matter of Example E16, and further specifies that the first interconnects are in a volume between the bridge component and the second microelectronic component.

Example E18 includes the subject matter of any of Examples E11-17, and further specifies that the bridge component includes transistors.

Example E19 includes the subject matter of any of Examples E11-17, and further specifies that the bridge component does not include transistors.

Example E20 includes the subject matter of any of Examples E11-19, and further specifies that the substrate includes an organic dielectric material.

Example E21 is a microelectronic assembly, including: a microelectronic component; a substrate; and a patch structure, wherein the patch structure is coupled between the microelectronic component and the substrate, the patch structure has a first face and an opposing second face, the second face is between the first face and the microelectronic component, the patch structure includes an embedded bridge component, the patch structure includes conductive pillars, and a diameter of a conductive pillar proximate to the first face is less than a diameter of a conductive pillar proximate to the second face.

Example E22 includes the subject matter of Example E21, and further specifies that the patch structure is coupled to the microelectronic component by first interconnects having a first pitch and by second interconnects having a second pitch, and the first pitch is less than the second pitch.

Example E23 includes the subject matter of Example E22, and further specifies that the first interconnects are in a volume between the bridge component and the microelectronic component.

Example E24 includes the subject matter of any of Examples E21-23, and further specifies that the patch structure includes solder between the bridge component and the second face.

Example E25 includes the subject matter of any of Examples E21-24, and further specifies that the microelectronic component is a first microelectronic component, the microelectronic assembly includes a second microelectronic component, and the patch structure is coupled between the second microelectronic component and the substrate.

Example E26 includes the subject matter of Example E25, and further specifies that the patch structure is coupled to the second microelectronic component by first interconnects having a first pitch and by second interconnects having a second pitch, and the first pitch is less than the second pitch.

Example E27 includes the subject matter of Example E26, and further specifies that the first interconnects are in a volume between the bridge component and the second microelectronic component.

Example E28 includes the subject matter of any of Examples E21-27, and further specifies that the bridge component includes transistors.

Example E29 includes the subject matter of any of Examples E21-27, and further specifies that the bridge component does not include transistors.

Example E30 includes the subject matter of any of Examples E21-29, and further specifies that the substrate includes an organic dielectric material.

Example E31 is an electronic device, including: a circuit board; and a microelectronic assembly conductively coupled to the circuit board, wherein the microelectronic assembly includes any of the microelectronic assemblies of any of Examples E1-30.

Example E32 includes the subject matter of Example E31, and further specifies that the electronic device is a handheld computing device, a laptop computing device, a wearable computing device, or a server computing device.

Example E33 includes the subject matter of any of Examples E31-32, and further specifies that the circuit board is a motherboard.

Example E34 includes the subject matter of any of Examples E31-33, and further includes: a display communicatively coupled to the circuit board.

Example E35 includes the subject matter of Example E34, and further specifies that the display includes a touchscreen display.

Example E36 includes the subject matter of any of Examples E31-35, and further includes: a housing around the circuit board and the microelectronic assembly.

Example F1 is a method of manufacturing a microelectronic structure, including any of the methods disclosed herein.

Example F2 is a method of manufacturing a microelectronic assembly, including any of the methods disclosed herein.

The invention claimed is:

1. A microelectronic assembly, comprising:
a substrate; and
a microelectronic component coupled to the substrate by a solder interconnect, wherein the solder interconnect includes a first portion and a second portion, the first portion is between the second portion and the substrate, the first portion has a height between 20 microns and 50 microns, and the first portion has a ground top surface.

2. The microelectronic assembly of claim 1, wherein the substrate includes an organic dielectric material.

3. The microelectronic assembly of claim 1, further comprising:
a bridge component, wherein the microelectronic component is coupled to the bridge component by solder, the bridge component is coupled to the substrate by solder, and the bridge component is at least partially between the substrate and the microelectronic component.

4. A microelectronic assembly, comprising:
a substrate;
a first microelectronic component coupled to the substrate by a first solder interconnect, wherein the first solder interconnect includes a first portion and a second portion, the first portion is between the second portion and the substrate, and the first portion has a ground top surface;
a bridge component, wherein the first microelectronic component is coupled to the bridge component by solder, the bridge component is coupled to the substrate by solder, and the bridge component is at least partially between the substrate and the first microelectronic component; and
a second microelectronic component coupled to the substrate by a second solder interconnect, wherein the second solder interconnect includes a first portion and a second portion, the first portion of the second solder interconnect is between the second portion of the second solder interconnect and the substrate, the first portion of the second solder interconnect has a ground top surface, the second microelectronic component is coupled to the bridge component by solder, and the bridge component is at least partially between the substrate and the second microelectronic component.

5. The microelectronic assembly of claim 4, wherein the first portion of the second solder interconnect has a height between 20 microns and 50 microns.

6. The microelectronic assembly of claim 4, wherein a top surface of the bridge component is coplanar with the ground top surface of the first portion of the first solder interconnect.

7. The microelectronic assembly of claim 4, wherein the substrate includes an organic dielectric material.

8. A microelectronic assembly, comprising:
a substrate;
a first microelectronic component coupled to the substrate by first solder interconnects, wherein individual first solder interconnects include a first portion and a second portion, and interfaces between the first portion and the second portion are coplanar across the first solder interconnects;
a bridge component, wherein the first microelectronic component is coupled to the bridge component by solder, the bridge component is coupled to the substrate by solder, and the bridge component is at least partially between the substrate and the first microelectronic component; and
a second microelectronic component coupled to the substrate by a second solder interconnect, wherein the second solder interconnect includes a first portion and a second portion, the first portion of the second solder interconnect is between the second portion of the second solder interconnect and the substrate, the first portion of the second solder interconnect has a ground top surface, the second microelectronic component is coupled to the bridge component by solder, and the bridge component is at least partially between the substrate and the second microelectronic component.

9. The microelectronic assembly of claim 8, first portion of the individual first solder interconnects has a height between 20 microns and 50 microns.

10. The microelectronic assembly of claim 8, wherein has a height between 20 microns and 50 microns.

11. The microelectronic assembly of claim 8, wherein the bridge component is at least partially in a cavity in the substrate.

12. The microelectronic assembly of claim 8, wherein a top surface of the bridge component is coplanar with the interfaces between the first portions and the second portions of the first solder interconnects.

13. The microelectronic assembly of claim 8, wherein a top surface of the bridge component is non-coplanar with the interfaces between the first portions and the second portions of the first solder interconnects.

14. A microelectronic assembly, comprising:
a substrate;
a first microelectronic component coupled to the substrate by a first interconnect, wherein the first interconnect includes a first portion and a second portion, the first portion includes solder, the first portion is between the second portion and the substrate, and the first portion has a ground top surface;
a bridge component, wherein the first microelectronic component is coupled to the bridge component by solder, the bridge component is coupled to the substrate by solder, and the bridge component is at least partially between the substrate and the first microelectronic component; and
a second microelectronic component coupled to the substrate by a second interconnect, wherein the second interconnect includes a first portion and a second portion, the first portion of the second interconnect includes solder, the first portion of the second interconnect is between the second portion of the second interconnect and the substrate, the first portion of the second interconnect has a ground top surface, the second microelectronic component is coupled to the bridge component by solder, and the bridge component is at least partially between the substrate and the second microelectronic component.

15. The microelectronic assembly of claim 14, wherein the bridge component includes a transistor.

16. The microelectronic assembly of claim 14, wherein the bridge component does not include a transistor.

17. The microelectronic assembly of claim 14, wherein the bridge component is at least partially in a cavity in the substrate.

18. The microelectronic assembly of claim 14, wherein a top surface of the bridge component is coplanar with the ground top surface of the first portion of the first interconnect.

19. The microelectronic assembly of claim 14, wherein a top surface of the bridge component is non-coplanar with the ground top surface of the first portion of the first interconnect.

20. The microelectronic assembly of claim 14, wherein the substrate includes an organic dielectric material.

* * * * *

UNITED STATES PATENT AND TRADEMARK OFFICE
CERTIFICATE OF CORRECTION

PATENT NO. : 12,119,326 B2  
APPLICATION NO. : 17/126505  
DATED : October 15, 2024  
INVENTOR(S) : Omkar G. Karhade et al.

Page 1 of 1

It is certified that error appears in the above-identified patent and that said Letters Patent is hereby corrected as shown below:

In the Claims

In Column 50, Claim 9, Line 34, delete "first" and insert -- wherein the first --, therefor.

In Column 50, Claim 10, Line 37, delete "has" and insert -- the first portion of the second solder interconnect has --, therefor.

Signed and Sealed this  
Nineteenth Day of November, 2024

Katherine Kelly Vidal  
*Director of the United States Patent and Trademark Office*